US011527553B2

(12) United States Patent
Lin et al.

(10) Patent No.: US 11,527,553 B2
(45) Date of Patent: Dec. 13, 2022

(54) THREE-DIMENSIONAL MEMORY DEVICE AND METHOD

(71) Applicant: Taiwan Semiconductor Manufacturing Co., Ltd., Hsinchu (TW)

(72) Inventors: Meng-Han Lin, Hsinchu (TW); Han-Jong Chia, Hsinchu (TW); Sheng-Chen Wang, Hsinchu (TW); Feng-Cheng Yang, Zhudong Township (TW); Yu-Ming Lin, Hsinchu (TW); Chung-Te Lin, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 67 days.

(21) Appl. No.: 17/140,888

(22) Filed: Jan. 4, 2021

(65) Prior Publication Data
US 2022/0037362 A1  Feb. 3, 2022

Related U.S. Application Data

(60) Provisional application No. 63/058,619, filed on Jul. 30, 2020.

(51) Int. Cl.
| | |
|---|---|
| *H01L 27/11597* | (2017.01) |
| *H01L 27/1159* | (2017.01) |
| *H01L 29/417* | (2006.01) |
| *H01L 27/11585* | (2017.01) |
| *H01L 27/11587* | (2017.01) |

(52) U.S. Cl.
CPC .... *H01L 27/11597* (2013.01); *H01L 27/1159* (2013.01); *H01L 27/11585* (2013.01); *H01L 27/11587* (2013.01); *H01L 29/41741* (2013.01); *H01L 29/41775* (2013.01)

(58) Field of Classification Search
CPC ........ H01L 27/11585; H01L 27/11587; H01L 27/1159; H01L 27/11597; H01L 29/41741; H01L 29/41775
See application file for complete search history.

(56) References Cited

U.S. PATENT DOCUMENTS

| | | | |
|---|---|---|---|
| 7,601,595 B2 * | 10/2009 | Forbes | ............... H01L 29/7827 257/E21.66 |
| 7,933,151 B2 | 4/2011 | Maeda et al. | |
| 9,589,982 B1 | 3/2017 | Cheng et al. | |
| (Continued) | | | |

FOREIGN PATENT DOCUMENTS

| | | |
|---|---|---|
| CN | 110739015 A | 1/2020 |
| TW | 201110328 A | 3/2011 |
| (Continued) | | |

*Primary Examiner* — Matthew E Warren
(74) *Attorney, Agent, or Firm* — Slater Matsil, LLP

(57) ABSTRACT

In an embodiment, a device includes: a word line extending in a first direction; a data storage layer on a sidewall of the word line; a channel layer on a sidewall of the data storage layer; a back gate isolator on a sidewall of the channel layer; and a bit line having a first main region and a first extension region, the first main region contacting the channel layer, the first extension region separated from the channel layer by the back gate isolator, the bit line extending in a second direction, the second direction perpendicular to the first direction.

20 Claims, 45 Drawing Sheets

(56) References Cited

U.S. PATENT DOCUMENTS

| | | | |
|---|---|---|---|
| 10,043,808 B1 | 8/2018 | Tezuka et al. | |
| 10,553,599 B1 | 2/2020 | Chen et al. | |
| 2017/0062603 A1* | 3/2017 | Suzuki | H01L 29/78696 |
| 2020/0083248 A1* | 3/2020 | Uchida | H01L 29/40117 |
| 2020/0168629 A1 | 5/2020 | Kang | |
| 2020/0168630 A1 | 5/2020 | Borukhov | |
| 2020/0185412 A1 | 6/2020 | Lee et al. | |
| 2021/0175253 A1* | 6/2021 | Han | H01L 29/78642 |
| 2021/0408293 A1* | 12/2021 | Chiang | H01L 21/02565 |
| 2022/0037253 A1* | 2/2022 | Yang | H01L 27/11578 |

FOREIGN PATENT DOCUMENTS

| | | | | |
|---|---|---|---|---|
| TW | 201403797 A | 1/2014 | | |
| TW | 201711138 A | 3/2017 | | |
| TW | 201810622 A | 3/2018 | | |
| TW | 201836072 A | 10/2018 | | |
| WO | WO-2014169506 A1 * | 10/2014 | | H01L 27/10826 |

* cited by examiner

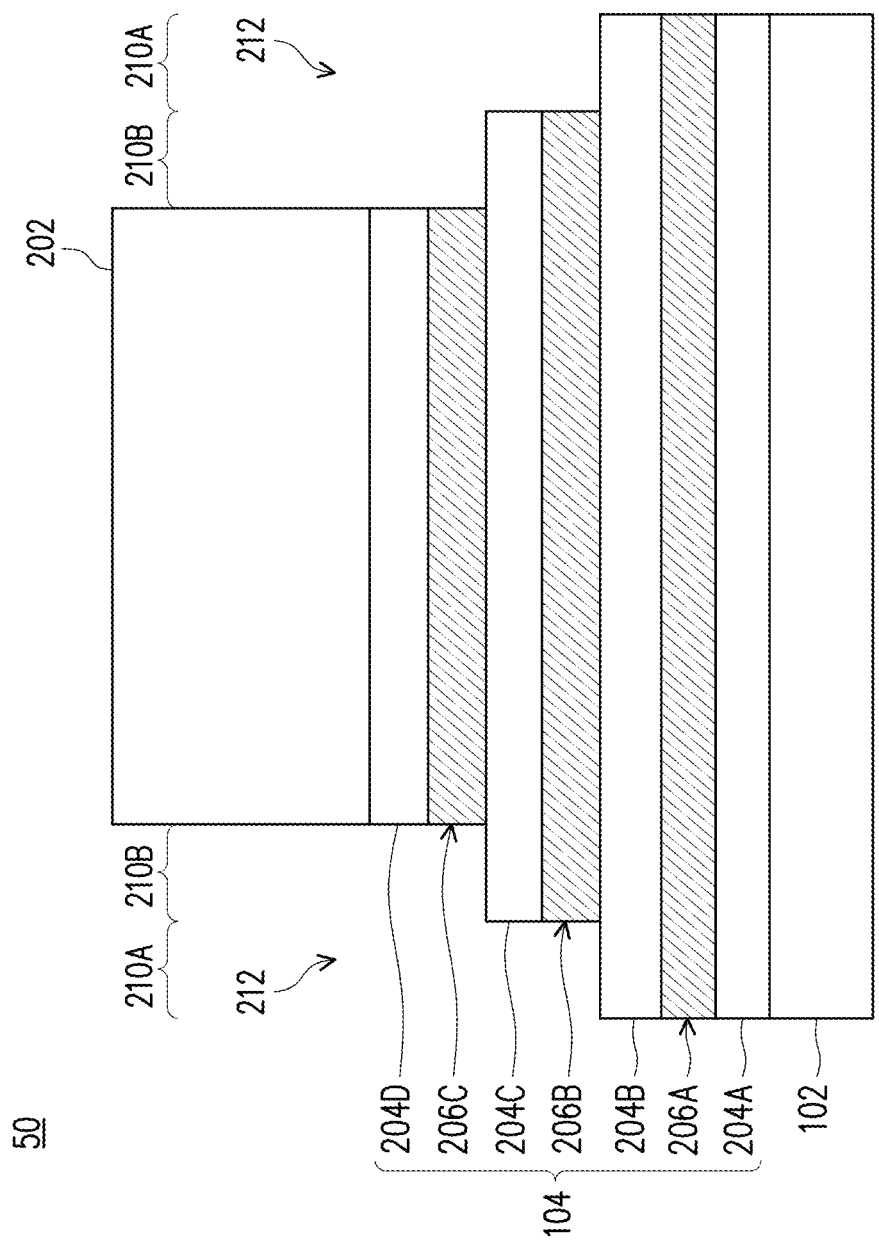

THREE-DIMENSIONAL MEMORY DEVICE AND METHOD

PRIORITY CLAIM AND CROSS-REFERENCE

This application claims the benefit of U.S. Provisional Application No. 63/058,619, filed on Jul. 30, 2020, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FeRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20A through 20J are views of intermediate stages in the manufacturing of a staircase structure of a memory array, in accordance with some embodiments.

DETAILED DESCRIPTION

Figure 1A:
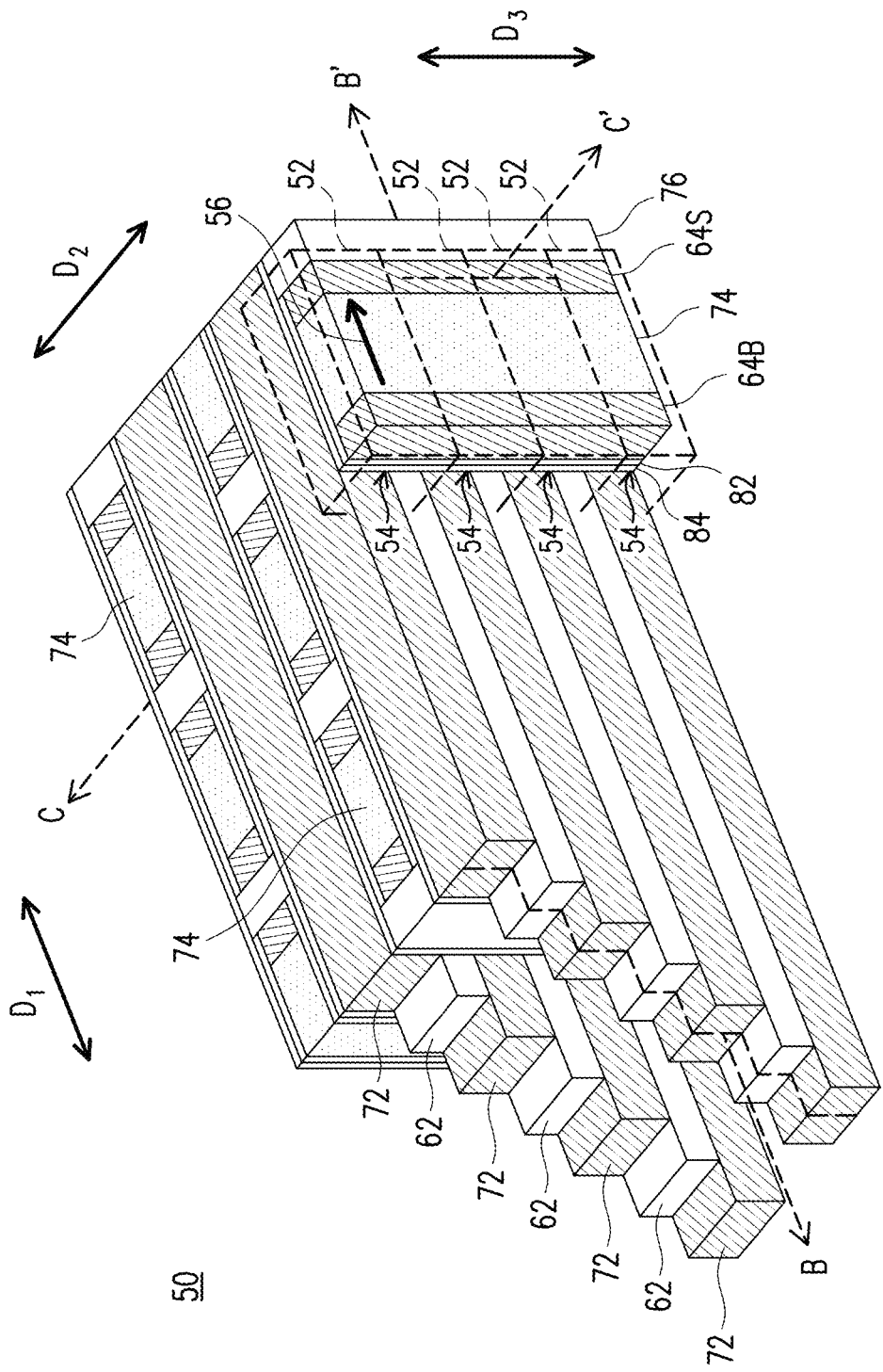
FIGS. 1A, 1B, and 1C are various views of a memory array.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a three-dimensional memory array is formed of transistors (such as programmable thin film transistors (TFTs)) having source lines and bit lines with extension regions. The extension regions function as back gates. The data storage layers and channel layers of the transistors are disposed between the back gates and the word lines for the transistors. During a write operation (e.g., an erase or programming operation) for a transistor, the back gates can help control (e.g., reduce) the surface potential of the channel layers. Reducing the surface potential of the channel layers can help improve the performance of the memory array.

Figure 1B:
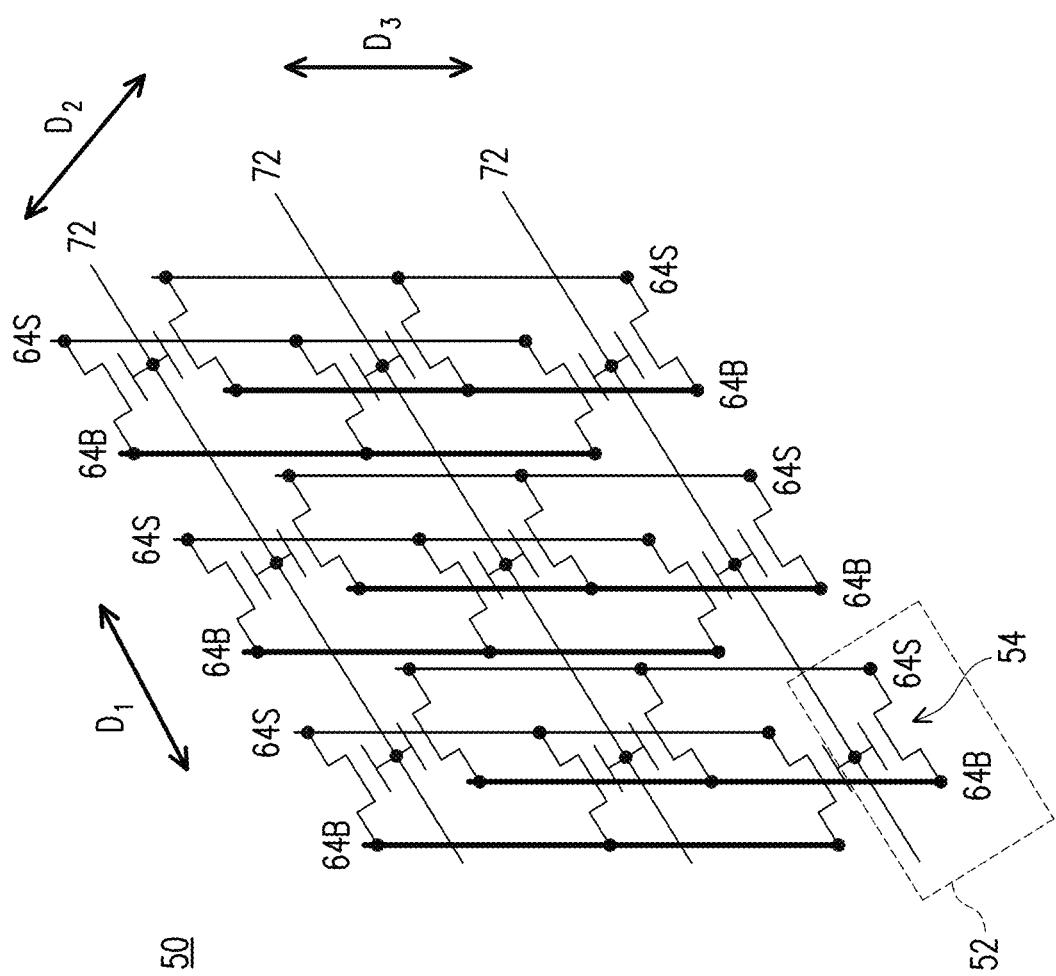
Figure 1C:
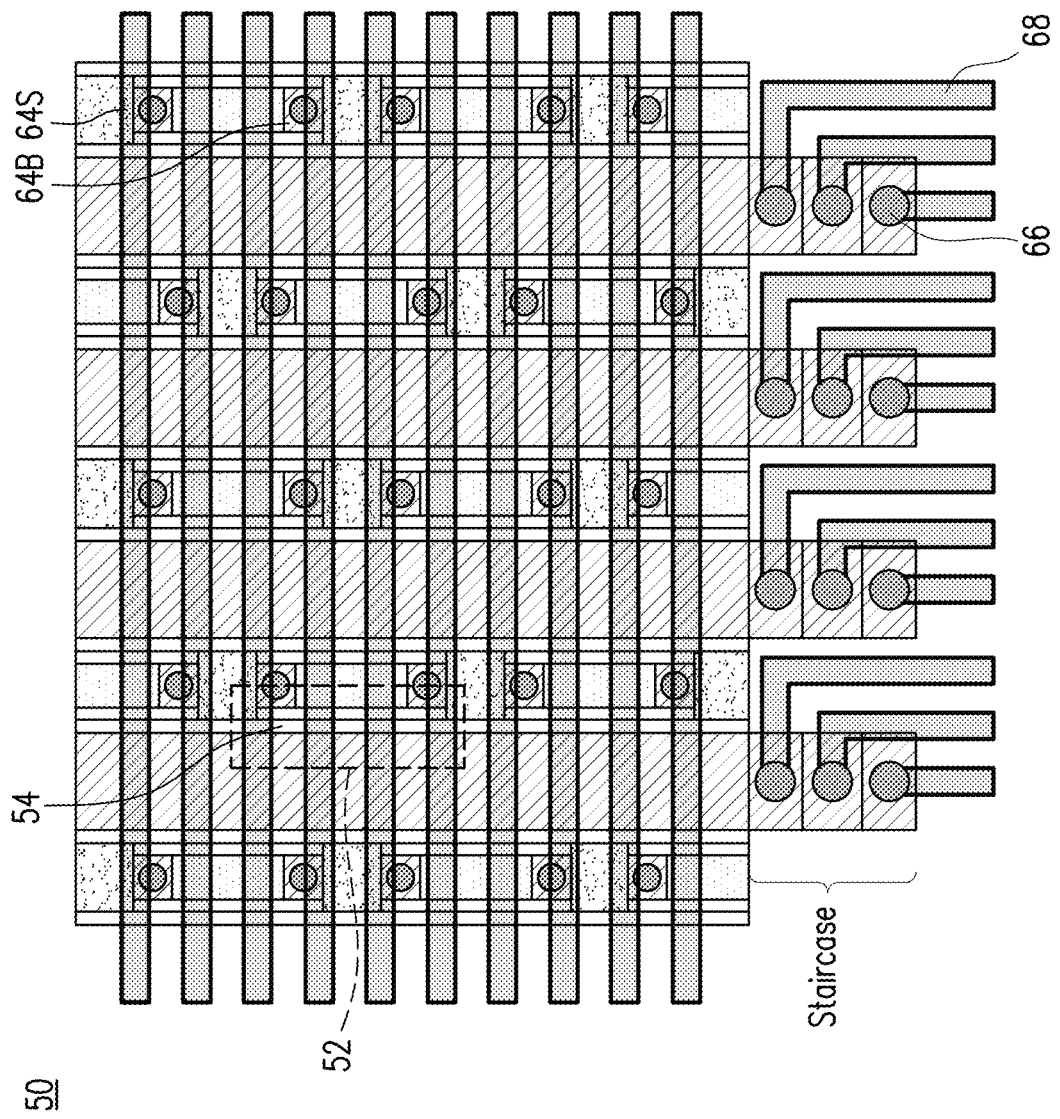

FIGS. 1A, 1B, and 1C illustrate examples of a memory array 50, according to some embodiments. FIG. 1A illustrates an example of a portion of the memory array 50 in a three-dimensional view; FIG. 1B illustrates a circuit diagram of the memory array 50; and FIG. 1C illustrates a top down view of a portion of the memory array 50. The memory array 50 includes a plurality of memory cells 52, which may be arranged in a grid of rows and columns. The memory cells 52 may further stacked vertically to provide a three dimensional memory array, thereby increasing device density. The memory array 50 may be disposed in the back end of line (BEOL) of a semiconductor die. For example, the memory array 50 may be disposed in the interconnect layers of the semiconductor die, such as, above one or more active devices (e.g., transistors) formed on a semiconductor substrate.

In some embodiments, the memory array 50 is a memory array such as a NOR memory array, or the like. Each memory cell 52 may include a transistor 54 (such as a TFT) with an insulating, memory film 84 as a gate dielectric. In some embodiments, a gate of each transistor 54 is electrically coupled to a respective word line (e.g., conductive line 72), a first source/drain region of each transistor 54 is electrically coupled to a respective bit line (e.g., conductive line 64B), and a second source/drain region of each transistor 54 is electrically coupled to a respective source line (e.g., conductive line 64S), which electrically couples the second source/drain region to ground. The memory cells 52 in a same horizontal row of the memory array 50 may share a common word line while the memory cells 52 in a same vertical column of the memory array 50 may share a common source line and a common bit line.

The memory array 50 includes a plurality of vertically stacked conductive lines 72 (e.g., word lines) with dielectric layers 62 disposed between adjacent ones of the conductive lines 72. The conductive lines 72 extend in a direction $D_1$ parallel to a major surface of an underlying substrate (not explicitly illustrated in FIGS. 1A and 1B). The conductive lines 72 may be part of a staircase structure such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 50, and conductive contacts 66 (see FIG. 1C) may be made to an exposed portion of each of the conductive lines 72. The conductive contacts 66 may be, e.g., vias that connect the exposed portions of the conductive lines 72 to interconnects 68 (see FIG. 1C) of overlying interconnect layers, in embodiments where the memory array 50 is disposed in the interconnect layers of a semiconductor die.

The memory array 50 further includes a plurality of conductive lines 64B (e.g., bit lines) and conductive lines 64S (e.g., source lines). The conductive lines 64B, 64S may each extend in a direction $D_3$ perpendicular to the conductive lines 72. Isolation regions 74 are disposed between and isolate adjacent ones of the conductive lines 64B and the conductive lines 64S. Pairs of the conductive lines 64B, 64S along with an intersecting conductive line 72 define boundaries of each memory cell 52, and an isolation region 76 is disposed between and isolates adjacent pairs of the conductive lines 64B, 64S. In some embodiments, the conductive lines 64S are electrically coupled to ground. Although FIG. 1A illustrates a particular placement of the conductive lines 64B relative the conductive lines 64S, it should be appreciated that the placement of the conductive lines 64B, 64S may be flipped in other embodiments.

The memory array 50 may also include semiconductor layers 82. The semiconductor layers 82 may provide channel regions for the transistors 54 of the memory cells 52. For example, when an appropriate voltage (e.g., higher than a respective threshold voltage ($V_{th}$) of a corresponding transistor 54) is applied through a corresponding conductive line 72, a region of a semiconductor layer 82 that intersects the conductive line 72 may allow current to flow from the conductive lines 64B to the conductive lines 64S (e.g., in the direction indicated by arrow 56).

A memory film 84 is disposed between the conductive lines 72 and the semiconductor layers 82, and the memory film 84 may provide gate dielectrics for the transistors 54. In some embodiments, the memory film 84 comprises a ferroelectric material, such as a hafnium oxide, hafnium zirconium oxide, silicon-doped hafnium oxide, or the like. Accordingly, the memory array 50 may also be referred to as a ferroelectric random access memory (FERAM) array. Alternatively, the memory film 84 may be a multilayer structure comprising a layer of silicon nitride between two silicon oxide layers (e.g., an oxide-nitride-oxide (ONO) structure), a different ferroelectric material, a different type of memory layer (e.g., capable of storing a bit), or the like.

In embodiments where the memory film 84 comprises a ferroelectric material, the memory film 84 may be polarized in one of two different directions, and the polarization direction may be changed by applying an appropriate voltage differential across the memory film 84 and generating an appropriate electric field. The polarization may be relatively localized (e.g., generally contained within each boundaries of the memory cells 52), and a continuous region of the memory film 84 may extend across a plurality of memory cells 52. Depending on a polarization direction of a particular region of the memory film 84, a threshold voltage of a corresponding transistor 54 varies, and a digital value (e.g., 0 or 1) can be stored. For example, when a region of the memory film 84 has a first electrical polarization direction, the corresponding transistor 54 may have a relatively low threshold voltage, and when the region of the memory film 84 has a second electrical polarization direction, the corresponding transistor 54 may have a relatively high threshold voltage. The difference between the two threshold voltages may be referred to as the threshold voltage shift. A larger threshold voltage shift makes it easier (e.g., less error prone) to read the digital value stored in the corresponding memory cell 52.

To perform a write operation on a memory cell 52 in such embodiments, a write voltage is applied across a portion of the memory film 84 corresponding to the memory cell 52. The write voltage can be applied, for example, by applying appropriate voltages to a corresponding conductive line 72 (e.g., the word line) and the corresponding conductive lines 64B, 64S (e.g., the bit line/source line). By applying the write voltage across the portion of the memory film 84, a polarization direction of the region of the memory film 84 can be changed. As a result, the corresponding threshold voltage of the corresponding transistor 54 can also be switched from a low threshold voltage to a high threshold voltage or vice versa, and a digital value can be stored in the memory cell 52. Because the conductive lines 72 intersect the conductive lines 64B, 64S, individual memory cells 52 may be selected for the write operation.

To perform a read operation on the memory cell 52 in such embodiments, a read voltage (a voltage between the low and high threshold voltages) is applied to the corresponding conductive line 72 (e.g., the world line). Depending on the polarization direction of the corresponding region of the memory film 84, the transistor 54 of the memory cell 52 may or may not be turned on. As a result, the conductive line 64B may or may not be discharged through the conductive line 64S (e.g., a source line that is coupled to ground), and the digital value stored in the memory cell 52 can be determined. Because the conductive lines 72 intersect the conductive lines 64B, 64S, individual memory cells 52 may be selected for the read operation.

FIG. 1A further illustrates reference cross-sections of the memory array 50 that are used in later figures. Cross-section B-B' is along a longitudinal axis of conductive lines 72 and in a direction $D_1$, for example, parallel to the direction of current flow of the transistors 54. Cross-section C-C' is perpendicular to cross-section B-B' and in a direction $D_2$, for example, perpendicular to a longitudinal axis of the conductive lines 72. Subsequent figures refer to these reference cross-sections for clarity.

FIGS. 2 through 19C are views of intermediate stages in the manufacturing of a memory array 50, in accordance with some embodiments. Each memory cell 52 of the memory array 50 includes a transistor 54 (see FIGS. 19B and 19C). FIGS. 2, 3, 4, 5, 6, 7, 8, 9, 10, 11, 12, 13, 14, 15, 16, 17, 18, and 19A are three-dimensional views. FIG. 19B is a cross-sectional view shown along reference cross-section B-B' in FIG. 1A. FIG. 19C is a cross-sectional view shown along reference cross-section C-C' in FIG. 1A. A portion of the memory array 50 is illustrated. Some features, such as the staircase arrangement of the word lines (see FIG. 1A), are not shown in some figures for clarity of illustration.

Figure 2:
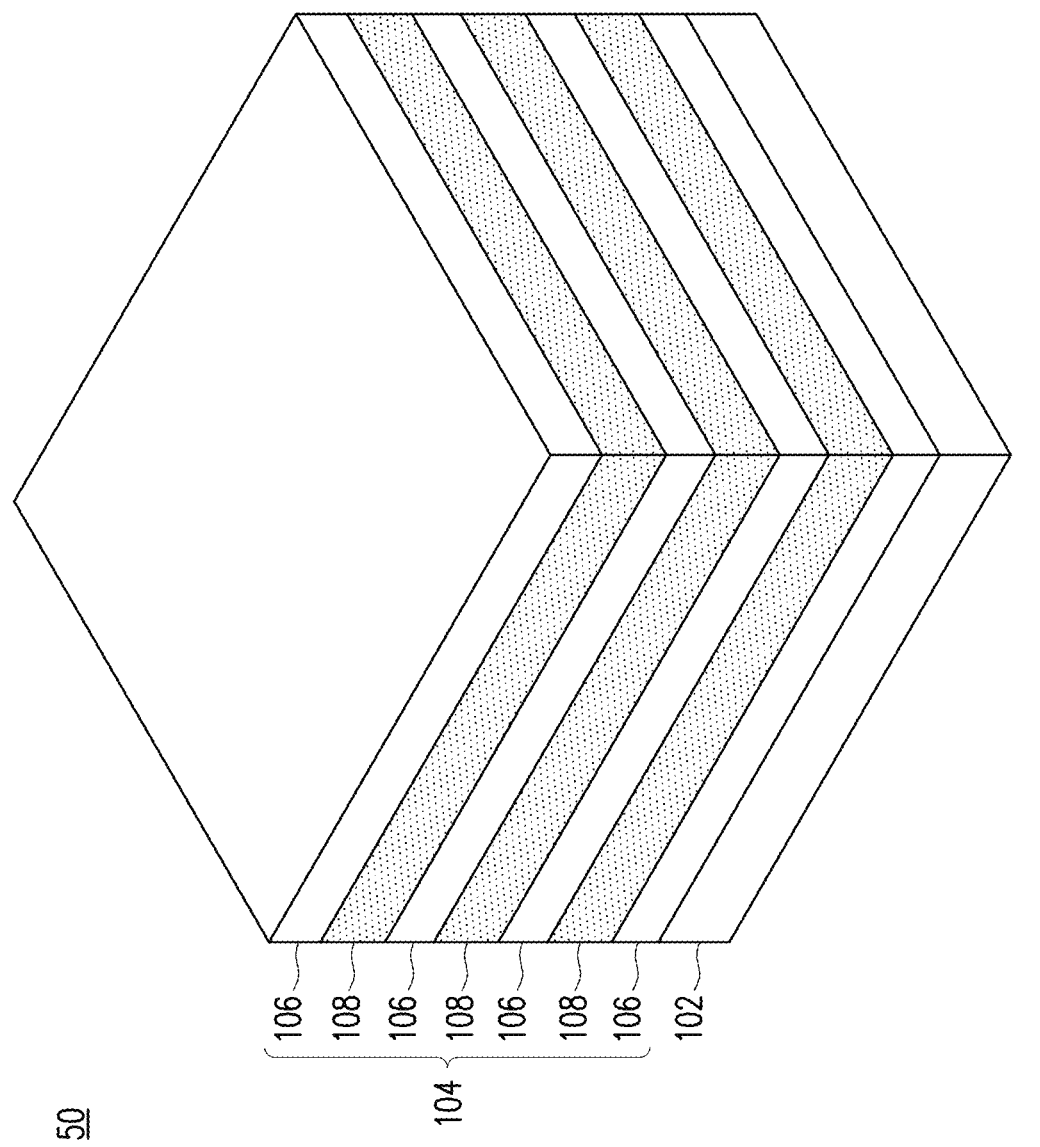
FIGS. 2 through 19C are various views of intermediate stages in the manufacturing of a memory array, in accordance with some embodiments.

In FIG. 2, a substrate 102 is provided. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multilayered or gradient substrate may also be used. In some embodiments, the semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. The substrate 102 may include a dielectric material. For example, the substrate 102 may be a dielectric layer, or may include a dielectric layer on a semiconductor substrate. Acceptable dielectric materials for the substrate 102 include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. In some embodiments, the substrate 102 is formed of silicon carbide.

A multilayer stack 104 is formed over the substrate 102. The multilayer stack 104 includes alternating dielectric layers 106 and sacrificial layers 108. The dielectric layers 106 are formed of a first dielectric material, and the sacrificial layers 108 are formed of a second dielectric material. The dielectric materials may each be selected from the candidate dielectric materials of the substrate 102. The multilayer stack 104 will be patterned in subsequent processing. As such, the dielectric materials of the dielectric layers 106 and the sacrificial layers 108 both have a high etching selectivity from the etching of the material of the substrate 102. The patterned dielectric layers 106 will be used to isolate subsequently formed transistors. The patterned sacrificial layers 108 may also be referred to as dummy layers, and will be selectively replaced with word lines for the transistors in subsequent processing. As such, the second dielectric material of the sacrificial layers 108 also has a high etching selectivity from the etching of the first dielectric material of the dielectric layers 106. In embodiments where the substrate 102 is formed of silicon carbide, the dielectric layers 106 can be formed of silicon oxide, and the sacrificial layers 108 can be formed of silicon nitride. Other combinations of dielectric materials having acceptable etching selectivity from one another may also be used.

Each layer of the multilayer stack 104 may be formed by an acceptable deposition process such as chemical vapor deposition (CVD), atomic layer deposition (ALD), or the like. A thickness of each of the layers may be in the range of about 40 nm to about 50 nm. In some embodiments, the dielectric layers 106 are formed to a different thickness than the sacrificial layers 108. For example, the sacrificial layers 108 can be formed to a greater thickness than the dielectric layers 106. In the illustrated embodiment, the multilayer stack 104 includes five of the dielectric layers 106 and four of the sacrificial layers 108. It should be appreciated that the multilayer stack 104 may include other quantities of the dielectric layers 106 and the sacrificial layers 108. The multilayer stack 104 can have an overall height $H_1$ in the range of about 1000 nm to about 10000 nm.

As will be discussed in greater detail below, FIGS. 3 through 10 illustrate a process in which a multiple-patterning process is used to form some of the features of the transistors. The multiple-patterning process may be a double patterning process, a quadruple patterning process, or the like. FIGS. 3 through 10 illustrate a double patterning process. In a double patterning process, trenches 110A (see FIG. 3) are patterned in portions of the multilayer stack 104 with a first etching process, and features for a first subset of the transistors are formed in the trenches 110A. Trenches 110B (see FIG. 7) are then patterned in other portions of the multilayer stack 104 with a second etching process, and features for a second subset of the transistors are formed in the trenches 110B. Forming the features of the transistors with a multiple-patterning process allows each patterning process to be performed with a low pattern density, which can help reduce defects while still allowing the memory array 50 to have sufficient memory cell density. Further, forming the features of the transistors with a multiple-patterning process also allows each patterned portion of the multilayer stack 104 to avoid having an excessively large aspect ratio, thereby improving the structural stability of the resulting memory array. As will be discussed in greater detail below (see FIGS. 25 through 27), a single patterning process may also be used to form some of the features of the transistors.

Figure 3:
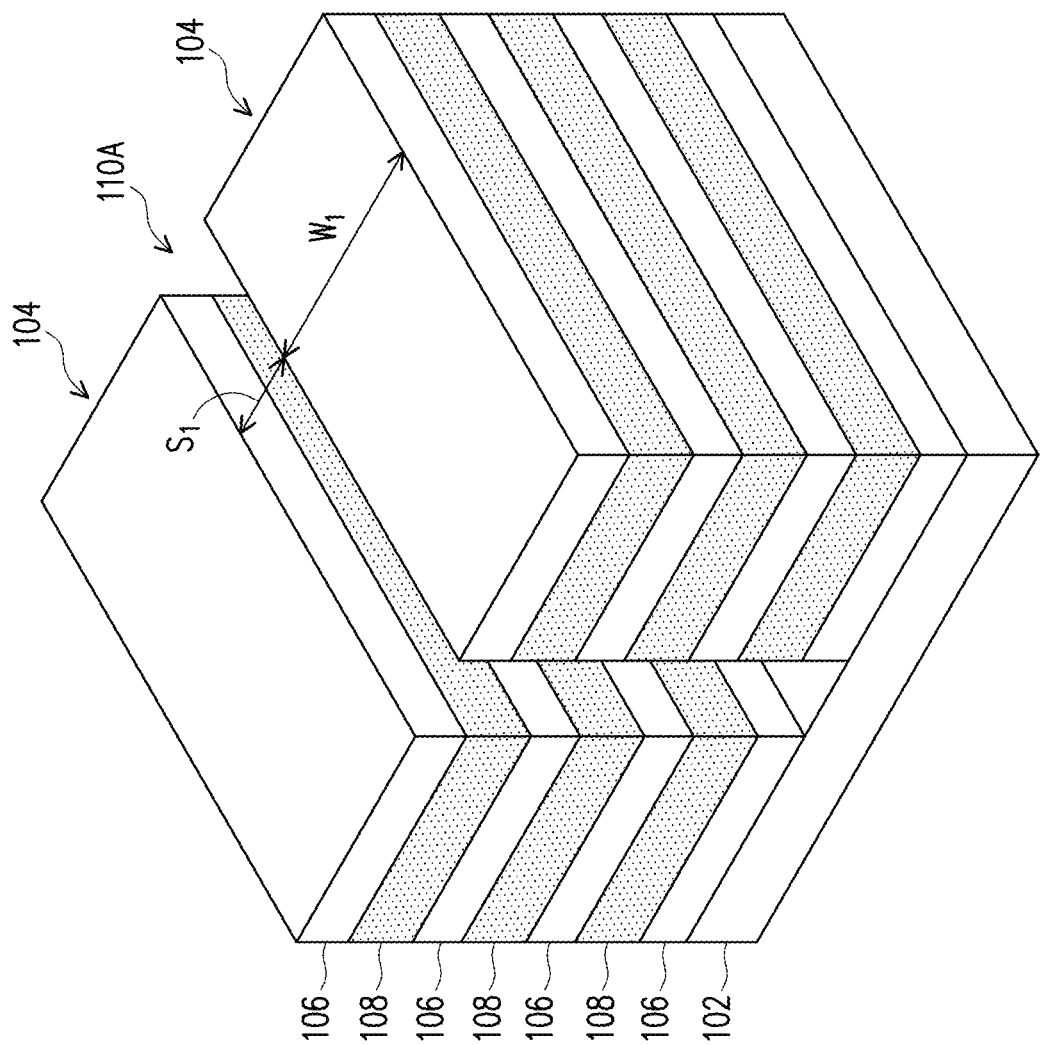

In FIG. 3, trenches 110A are patterned in the multilayer stack 104. In the illustrated embodiment, the trenches 110A extend through the multilayer stack 104 and expose the substrate 102. In another embodiment, the trenches 110A extend through some but not all layers of the multilayer stack 104. The trenches 110A may be patterned using acceptable photolithography and etching techniques, such as with an etching process that is selective to the multilayer stack 104 (e.g., selectively removes the dielectric materials of the dielectric layers 106 and the sacrificial layers 108 at a faster rate than the material of the substrate 102). The etching may be any acceptable etch process, such as a reactive ion etch (RIE), neutral beam etch (NBE), the like, or a combination thereof. The etching may be anisotropic. In embodiments where the substrate 102 is formed of silicon carbide, the dielectric layers 106 are formed of silicon oxide, and the sacrificial layers 108 are formed of silicon nitride, the trenches 110A can be formed by a dry etch using a fluorine-based gas (e.g., $C_4F_6$) mixed with hydrogen ($H_2$) or oxygen (02) gas. After the patterning, respective portions of the multilayer stack 104 are disposed between respective ones of the trenches 110A. Each portion of the multilayer stack 104 has a width $W_1$ in the second direction $D_2$ (see FIGS. 1A and 1B), which can be in the range of about 50 nm to about 500 nm. Further, each portion of the multilayer stack 104 is separated by a separation distance $S_1$ in the second direction $D_2$, which can be in the range of about 50 nm to about 200 nm.

Figure 4:
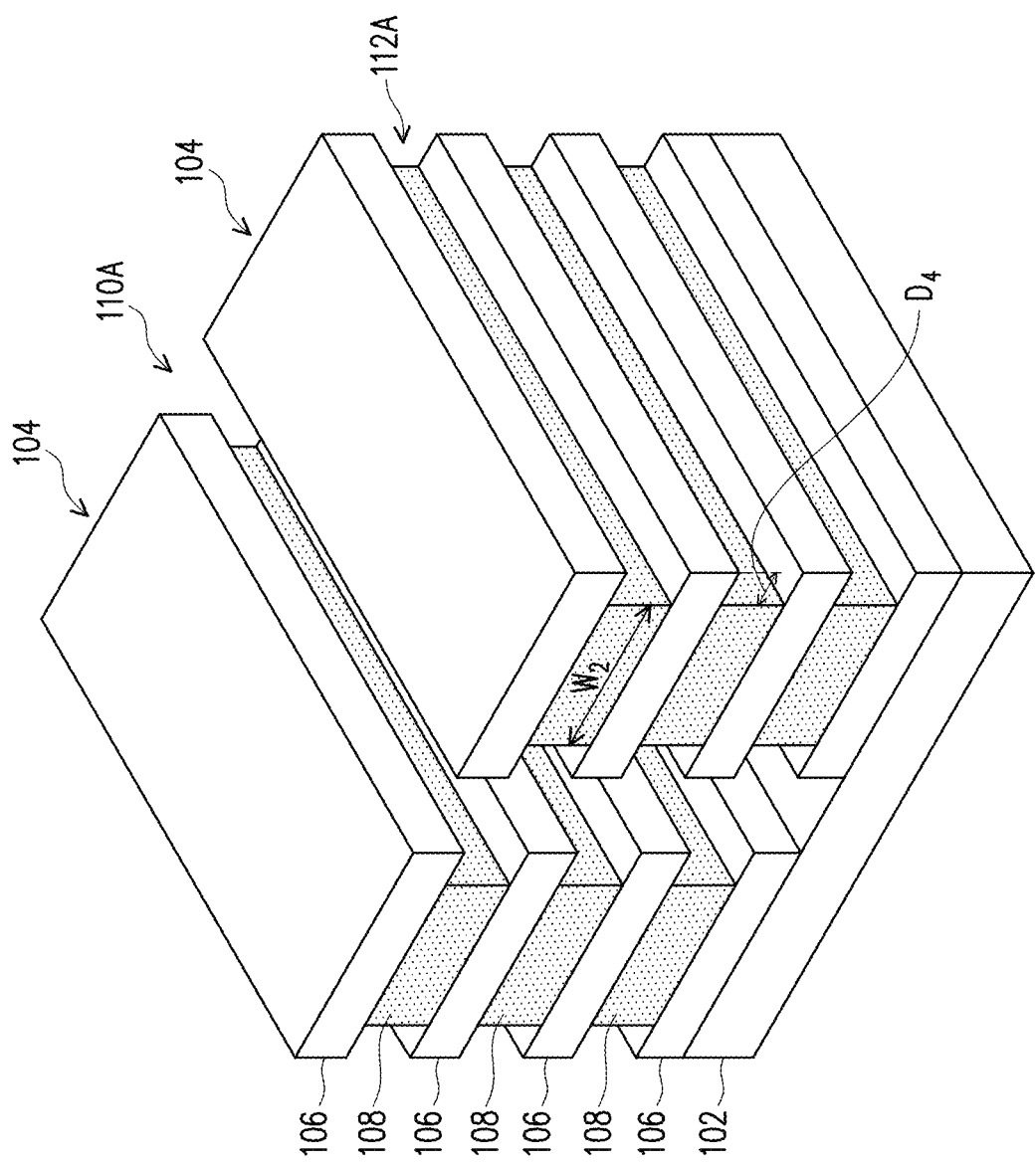

In FIG. 4, the trenches 110A are expanded to form sidewall recesses 112A. Specifically, portions of the sidewalls of the sacrificial layers 108 exposed by the trenches 110A are recessed from the portions of the sidewalls of the dielectric layers 106 exposed by the trenches 110A to form the sidewall recesses 112A. Although sidewalls of the sacrificial layers 108 are illustrated as being straight, the sidewalls may be concave or convex. The sidewall recesses 112A may be formed by an acceptable etching process, such as one that is selective to the material of the sacrificial layers 108 (e.g., selectively removes the material of the sacrificial layers 108 at a faster rate than the material(s) of the dielectric layers 106 and the substrate 102). The etching may be isotropic. In embodiments where the substrate 102 is formed of silicon carbide, the dielectric layers 106 are formed of silicon oxide, and the sacrificial layers 108 are formed of silicon nitride, the trenches 110A can be expanded by a wet etch using phosphoric acid ($H_3PO_4$). In another embodiment, a dry etch selective to the material of the sacrificial layers 108 may be used.

After formation, the sidewall recesses 112A have a depth $D_4$ in the second direction $D_2$ (see FIGS. 1A and 1B), extending past the sidewalls of the dielectric layers 106. Timed etch processes may be used to stop the etching of the sidewall recesses 112A after the sidewall recesses 112A reach a desired depth $D_4$. For example, the sidewall recesses 112A can have a depth $D_4$ in the range of about 10 nm to about 60 nm. Forming the sidewall recesses 112A can reduce the widths of the sacrificial layers 108 by about 5% to about 25%. Continuing the previous example, after the etching, the sacrificial layers 108 can have a width $W_2$ in the second direction $D_2$, which can be in the range of about 50 nm to about 450 nm.

Figure 5:
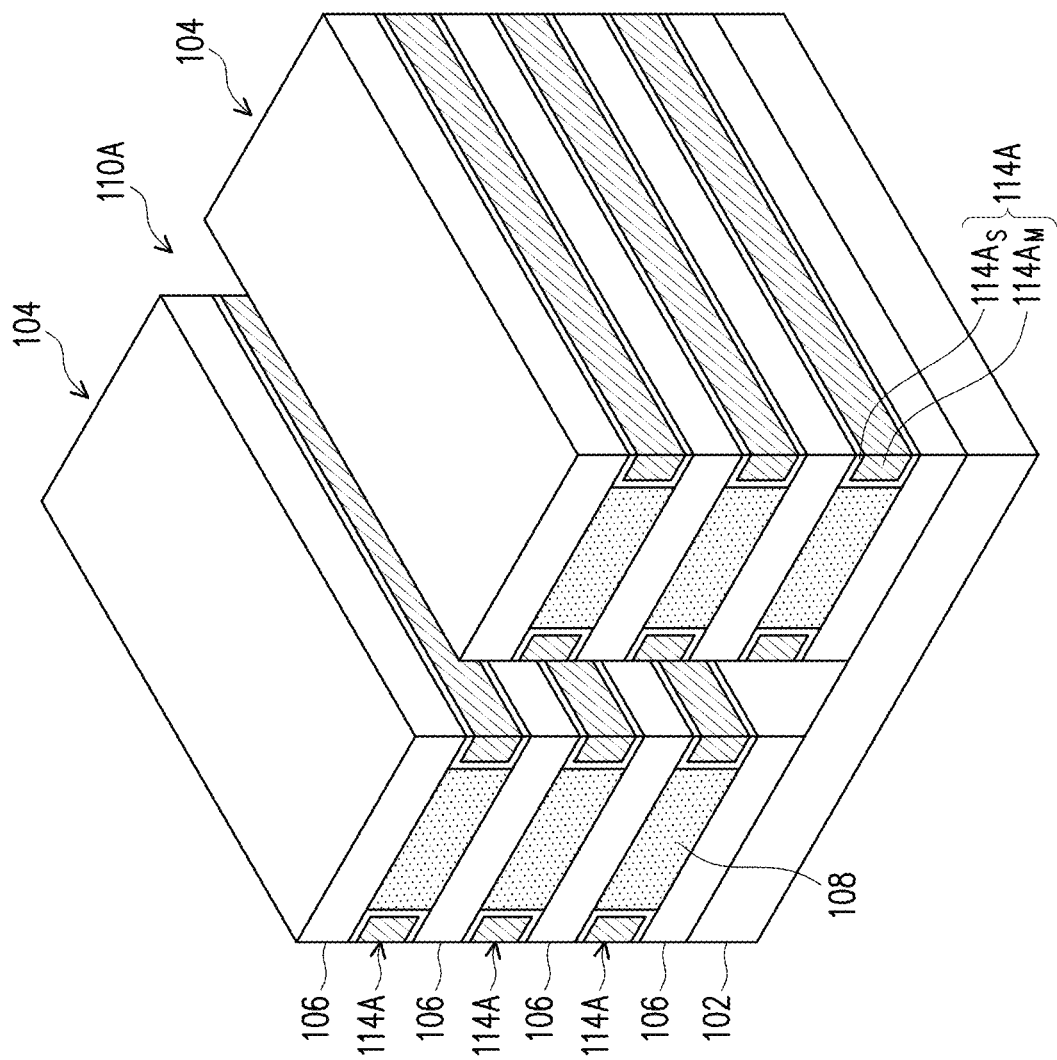

In FIG. 5, conductive features 114A (e.g., metal lines) are formed in the sidewall recesses 112A, thus completing a process for replacing first portions of the sacrificial layers 108. The conductive features 114A may each include one or more layers, such as seed layers, glue layers, barrier layers, diffusion layers, fill layers, and the like. In some embodiments, the conductive features 114A each include a seed layer $114A_S$ (or barrier layer) and a main layer $114A_M$. Each seed layer $114A_S$ extends along three sides (e.g., the top surface, a sidewall, and the bottom surface) of a corresponding main layer $114A_M$ located within a corresponding sidewall recesses 112A. The seed layers $114A_S$ are formed of a first conductive material that can be utilized to help grow or to help adhere a subsequently deposited material, such as a metal nitride, such as titanium nitride, tantalum nitride, molybdenum nitride, zirconium nitride, hafnium nitride, or the like. The main layers $114A_M$ may are formed of a second conductive material, such as a metal, such as tungsten, ruthenium, molybdenum, cobalt, aluminum, nickel, copper, silver, gold, alloys thereof, or the like. The material of the seed layers $114A_S$ is one that has good adhesion to the material of the dielectric layers 106, and the material of the main layers $114A_M$ is one that has good adhesion to the material of the seed layers $114A_S$. In embodiments where the dielectric layers 106 are formed of an oxide such as silicon oxide, the seed layers $114A_S$ can be formed of titanium nitride or tantalum nitride, and the main layers $114A_M$ can be formed of tungsten. The materials of the seed layers $114A_S$ and main layers $114A_M$ may be formed by acceptable deposition processes such as chemical vapor deposition (CVD), atomic layer deposition (ALD), or the like. An acceptable etch process, such as a dry etch (e.g., a reactive ion etch (RIE), neutral beam etch (NBE), the like), a wet etch, the like, or a combination thereof, may be performed to remove excess material from the sidewalls of the dielectric layers 106 and the top surface of the substrate 102. The etching may be anisotropic. Each of the conductive features 114A can have a similar overall thickness as the sacrificial layers 108 (discussed above for FIG. 2), and can have a similar overall width as the depth $D_4$ of the sidewall recesses 112A (discussed above for FIG. 4). Each seed layer $114A_S$ can have a thickness in the range of about 1 nm to about 10 nm, and each main layer $114A_M$ can have a thickness in the range of about 15 nm to about 35 nm, with the thickness of the seed layer $114A_S$ being less than the thickness of the main layer $114A_M$.

Figure 6:
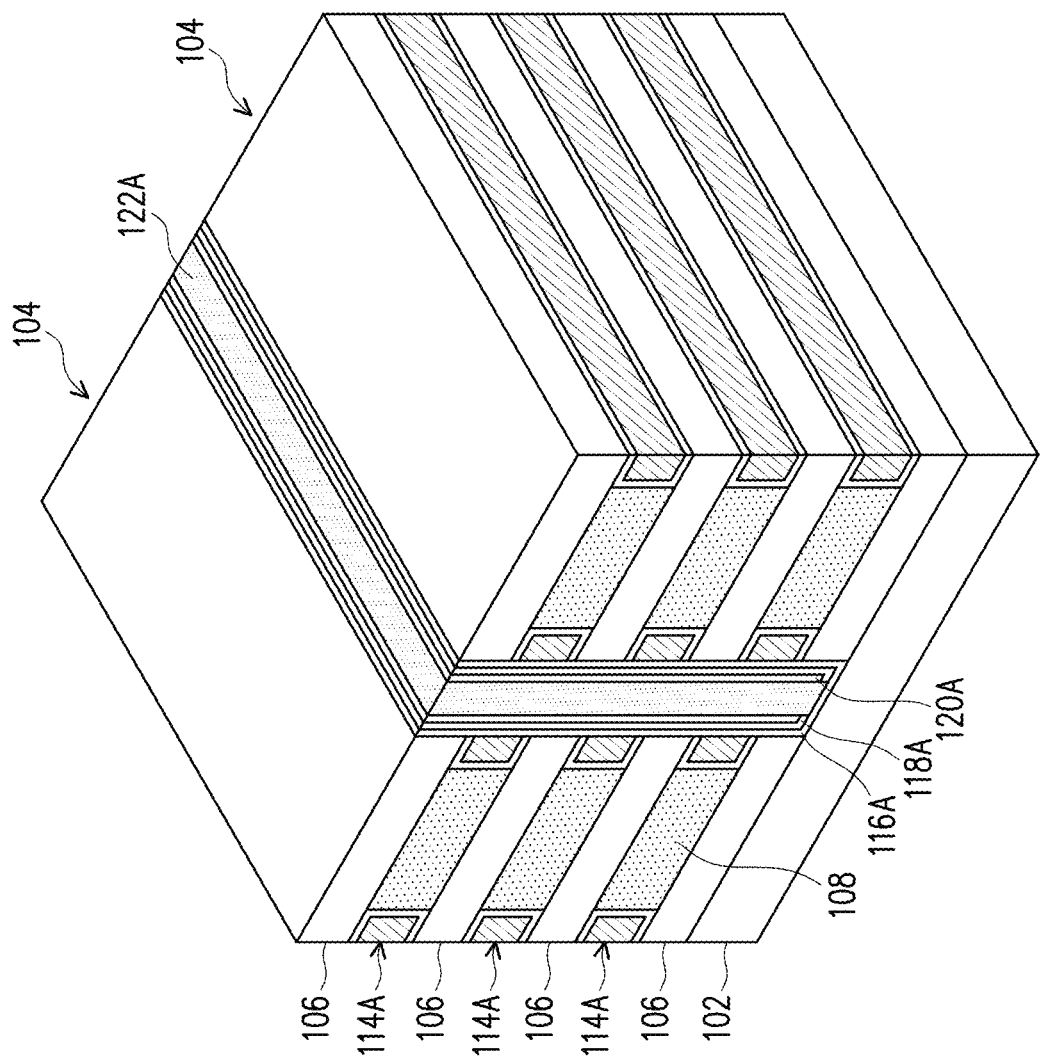

In FIG. 6, memory films 116A, semiconductor layers 118A, back gate isolators 120A, and isolation regions 122A are formed in the trenches 110A. The semiconductor layers 118A and the back gate isolators 120A are formed over the memory films 116A. The isolation regions 122A extend through the semiconductor layers 118A, thus separating the semiconductor layers 118A of horizontally adjacent transistors along the direction $D_2$ (see FIGS. 1A and 1B). In the illustrated embodiment, the isolation regions 122A are formed over the memory films 116A. In another embodiment, the isolation regions 122A also extend through the memory films 116A and the substrate 102, thus separating the memory films 116A of horizontally adjacent transistors along the direction $D_2$.

Portions of the memory films 116A provide data storage layers for the transistors and portions of the semiconductor layers 118A provide channel regions for the transistors. As will be discussed in greater detail below, the back gate isolators 120A will be patterned and used to help form T-shaped source/drain regions of the transistors. The T-shaped source/drain regions have main regions and extension regions. The back gate isolators 120A will be patterned so that the main source/drain regions may contact the semiconductor layers 118A, but the source/drain extension regions are separated from the portions of the semiconductor layers 118A that provide the channel regions, thus preventing shorting of the channel regions. The source/drain extension regions can act as back gates to help control (e.g., reduce) the surface potential of the semiconductor layers 118 (particularly the portions of the semiconductor layers 118 distal the word lines 114) during write operations. The window for write operations may thus be widened.

The memory films 116A are formed of an acceptable material for storing digital values. In some embodiments, the memory films 116A are formed of a high-k ferroelectric material, such as hafnium zirconium oxide (HfZrO); zirconium oxide (ZrO); hafnium oxide (HfO) doped with lanthanum (La), silicon (Si), aluminum (Al), or the like; undoped hafnium oxide (HfO); or the like. In some embodiments, the memory films 116A include one or more low-k dielectric materials, such as silicon nitride, silicon oxide, silicon oxynitride, or the like. The material of the memory films 116A may be formed by an acceptable deposition process such as ALD, CVD, physical vapor deposition (PVD), or the like. In some embodiments, the memory films 116A are HfZrO deposited by ALD.

The semiconductor layers 118A formed of an acceptable material for providing channel regions for the transistors, such as indium gallium zinc oxide (IGZO), indium tin oxide (ITO), indium gallium zinc tin oxide (IGZTO), zinc oxide (ZnO), polysilicon, amorphous silicon, or the like. The material of the semiconductor layers 118A may be formed by an acceptable deposition process such as ALD, CVD, PVD, or the like. In some embodiments, the semiconductor layers 118A are formed of IGZTO deposited by ALD.

The back gate isolators 120A are formed of an acceptable material for electrically insulating subsequently formed source/drain extension regions from the portions of the semiconductor layers 118A that provide channel regions. In some embodiments, the back gate isolators 120A are formed of a dielectric material. Acceptable dielectric materials for the back gate isolators 120A include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. The material of the back gate isolators 120A may be formed by an acceptable deposition process such as ALD, CVD, flowable CVD (FCVD), or the like. In some embodiments, the back gate isolators 120A are formed of an oxide such as aluminum oxide deposited by ALD.

The isolation regions 122A are formed of an acceptable material for protecting and electrically isolating the underlying memory films 116A. Acceptable dielectric materials for the isolation regions 122A include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. The material of the isolation regions 122 may be formed by an acceptable deposition process such as ALD, CVD, flowable CVD (FCVD), or the like. The isolation regions 122A and the back gate isolators 120A are formed of different dielectric materials so that the material of the isolation regions 122A has a high etching selectivity from the etching of the material of the back gate isolators 120A. In some embodiments, the isolation regions 122A are formed of an oxide such as silicon oxide deposited by FCVD.

The memory films 116A, the semiconductor layers 118A, the back gate isolators 120A, and the isolation regions 122A may be formed by a combination of deposition, etching, and planarization. For example, a tunneling layer can be conformally deposited on the multilayer stack 104 and in the trenches 110A (e.g., on the sidewalls of the conductive features 114A and the sidewalls of the dielectric layers 106). A semiconductor layer can then be conformally deposited on the tunneling layer. A dielectric layer can then be conformally deposited on the semiconductor layer. The dielectric layer can then be patterned by a suitable etching process, such as an anisotropic etch using the tunneling layer as an etch stop layer. The semiconductor layer can then be patterned by a suitable etching process, such as an anisotropic etch using the patterned dielectric layer as an etching mask. An isolation material can then be conformally deposited in the remaining portions of trenches 110A (e.g., on the patterned semiconductor layer, the patterned dielectric layer, and the exposed portions of the tunneling layer). A removal process is then applied to the various layers to remove excess materials over the topmost dielectric layers 106/ sacrificial layers 108. The removal process may be a planarization process such as a chemical mechanical polish (CMP), an etch-back, combinations thereof, or the like. The portions of the tunneling layer, the semiconductor layer, the dielectric layer, and the isolation material remaining in the trenches 110A forms the memory films 116A, the semiconductor layers 118A, the back gate isolators 120A, and the isolation regions 122A, respectively. The planarization process exposes the topmost dielectric layers 106/sacrificial layers 108 such that top surfaces of the memory films 116A, the semiconductor layers 118A, the back gate isolators 120A, the isolation regions 122A, and the topmost dielectric layers 106/sacrificial layers 108 are coplanar (within process variations) after the planarization process.

Optionally, the isolation regions 122A can be formed to also extend through the memory films 116A and the substrate 102. As will be discussed in greater detail below, in some embodiments, the memory array 50 is embedded in another semiconductor device. Specifically, the memory array 50 can be formed in the interconnect structure of a semiconductor device. In such embodiments, openings can be formed through the memory films 116A and the substrate 102 before depositing the isolation material of the isolation regions 122A. Portions of the isolation regions 122A will be subsequently replaced with source/drain regions of the transistors so that the source/drain regions are connected to metallization layers of the interconnect structure underlying the memory array 50. A suitable etching process can be performed on the memory films 116A and the substrate 102 using the semiconductor layers 118A and the back gate isolators 120A as an etching mask. The etching process is selective to the memory films 116A and the substrate 102 (e.g., selectively removes the material(s) of the memory films 116A and the substrate 102 at a faster rate than the material(s) the semiconductor layers 118A and the back gate isolators 120A). The etch may be anisotropic. In some embodiments, the etching process includes multiple etches. For example, a first etch can be performed to extend the openings through the memory films 116A, and a second etch can be performed to extend the openings through the substrate 102. After the openings are formed, the isolation regions 122A can be formed by a similar manner as described above.

Figure 7:
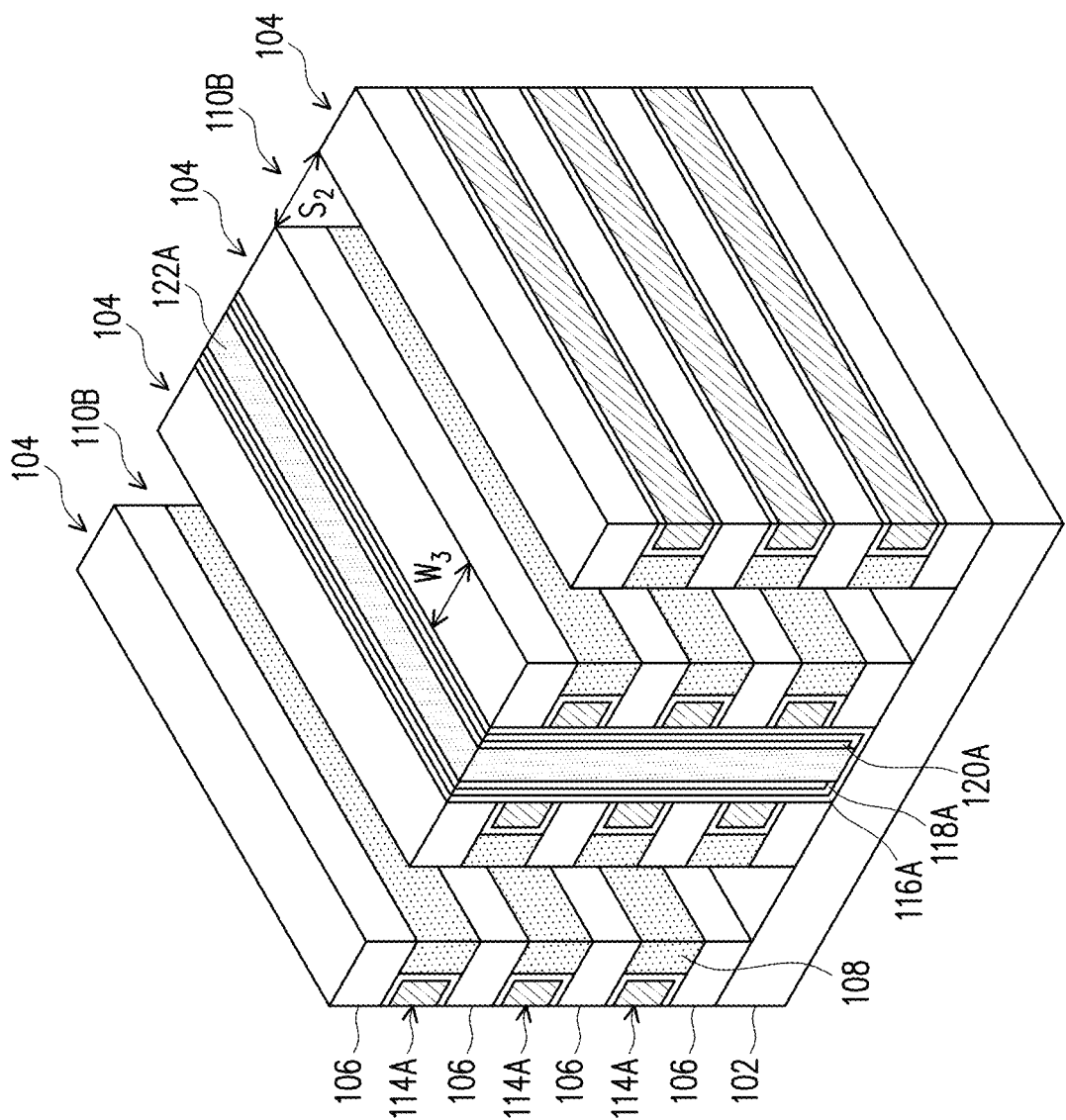

In FIG. 7, trenches 110B are patterned in the multilayer stack 104. In the illustrated embodiment, the trenches 110B extend through the multilayer stack 104 and expose the substrate 102. In another embodiment, the trenches 110B extend through some but not all layers of the multilayer stack 104. The trenches 110B may be patterned using acceptable photolithography and etching techniques, such as with an etching process that is selective to the multilayer stack 104 (e.g., selectively removes the dielectric materials of the dielectric layers 106 and the sacrificial layers 108 at a faster rate than the material of the substrate 102). The etching may be any acceptable etch process, and in some embodiments, may be similar to the etch used to form the trenches 110A (discussed above for FIG. 3).

After the patterning, respective portions of the multilayer stack 104 are disposed between respective pairs of the trenches 110A, 110B. Each portion of the multilayer stack 104 has a width $W_3$ in the second direction $D_2$ (see FIGS. 1A and 1B), which can be in the range of about 50 nm to about 500 nm. Further, each portion of the multilayer stack 104 is separated by a separation distance $S_2$ in the second direction $D_2$, which can be in the range of about 50 nm to about 200 nm. Misalignment may occur when patterning the trenches 110B. When misalignment occurs, the patterned portions of the multilayer stack 104 do not all have a same width $W_3$. When no misalignment occurs, the patterned portions of the multilayer stack 104 have a same width $W_3$.

Figure 8:
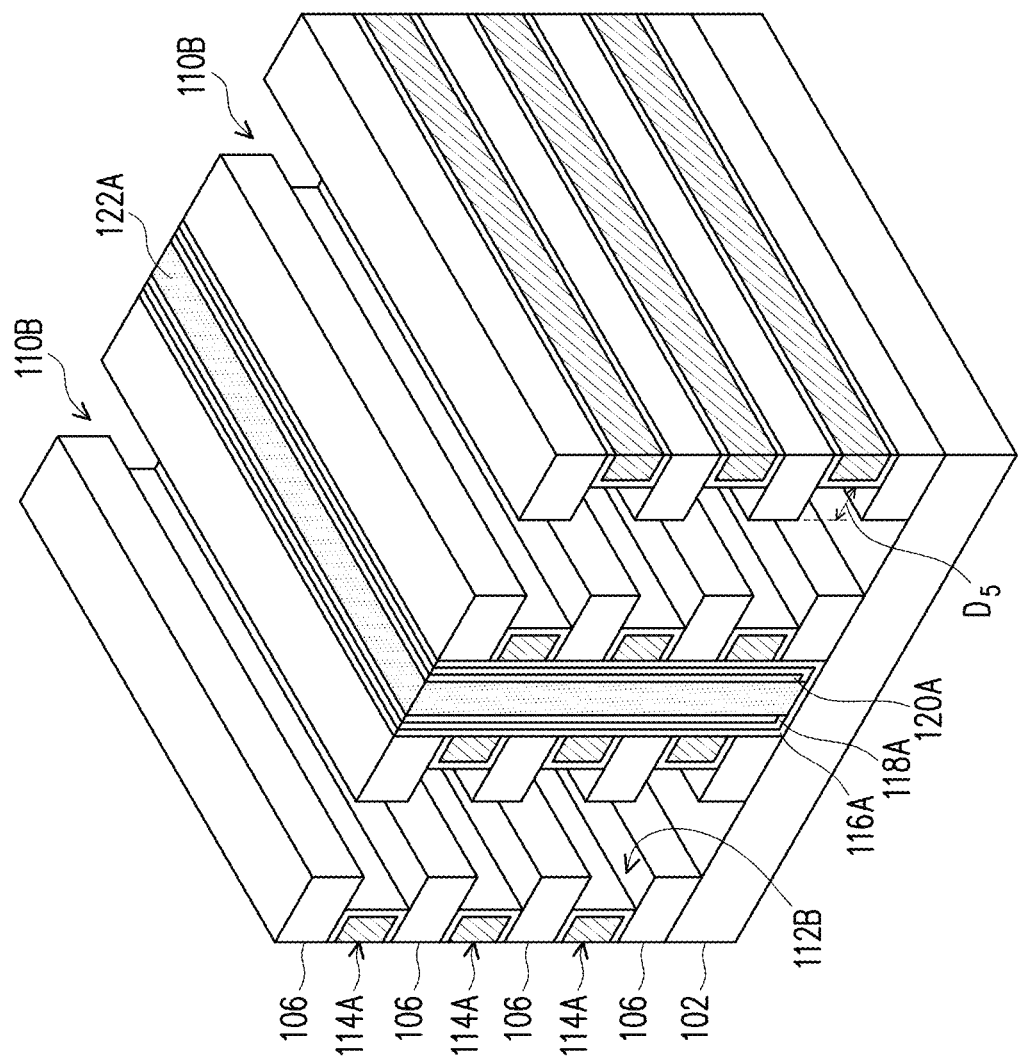

In FIG. 8, the trenches 110B are expanded to form sidewall recesses 112B. Specifically, the remaining portions of the sacrificial layers 108 are removed to form the sidewall recesses 112B. The sidewall recesses 112B thus expose the sidewalls of the conductive features 114A (e.g., the sidewalls of the seed layers $114A_S$). The sidewall recesses 112B may be formed by an acceptable etching process, such as one that is selective to the material of the sacrificial layers 108 (e.g., selectively removes the material of the sacrificial layers 108 at a faster rate than the material(s) of the dielectric layers 106 and the substrate 102). The etching may be any acceptable etch process, and in some embodiments, may be similar to the etch used to form the sidewall recesses 112A (discussed above for FIG. 4).

After formation, the sidewall recesses 112B have a depth $D_5$ in the second direction $D_2$ (see FIGS. 1A and 1B), extending past the sidewalls of the dielectric layers 106. Timed etch processes may be used to stop the etching of the sidewall recesses 112B after the sidewall recesses 112B reach a desired depth $D_5$. As noted above, misalignment may occur when patterning the trenches 110B. When misalignment occurs, the depth $D_5$ is different from (e.g., greater than or less than) the depth $D_4$ (discussed above for FIG. 4). When no misalignment occurs, the depth $D_5$ is similar to the depth $D_4$.

Figure 9:
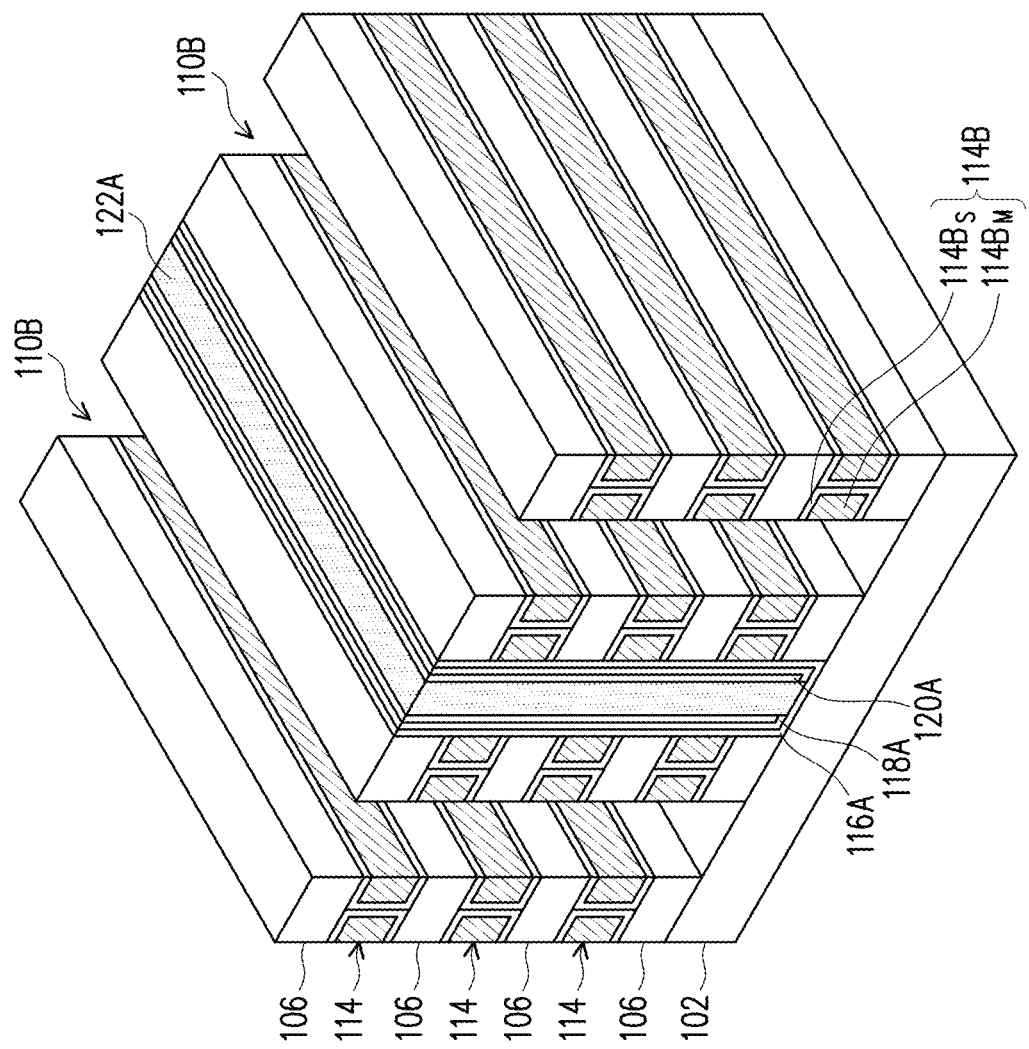

In FIG. 9, conductive features 114B are formed in the sidewall recesses 112B, thus completing a process for replacing second portions of the sacrificial layers 108. The conductive features 114B may be formed of materials that are selected from the same group of candidate materials of the conductive features 114A, which may be formed using methods that are selected from the same group of candidate methods for forming the materials of the conductive features 114A. The conductive features 114A and the conductive features 114B may be formed from the same material, or may include different materials. In some embodiments, the conductive features 114B each include a seed layer $114B_S$ (or barrier layer) and a main layer $114B_M$. The seed layers $114B_S$ and the main layers $114B_M$ can have similar thicknesses as the seed layers $114A_S$ and the main layers $114A_M$, respectively. In some embodiments, the seed layers $114A_S$ and the seed layers $114B_S$ are formed of similar materials, in which case the seed layers $114A_S$ and the seed layers $114B_S$ may merge during formation such that no discernable interfaces exist between them. In another embodiment, the seed layers $114A_S$ and the seed layers $114B_S$ are formed of different materials, in which case the seed layers $114A_S$ and the seed layers $114B_S$ may not merge during formation such that discernable interfaces exist between them. As noted above, misalignment may occur when patterning the trenches 110B. When misalignment occurs, the main layers $114A_M$ have different widths from the main layers $114B_M$ along the second direction $D_2$ (see FIGS. 1A and 1B). When no misalignment occurs, the main layers $114A_M$ have the same width as the main layers $114B_M$ along the second direction $D_2$. Portions of each seed layer $114A_S$, $114B_S$ are laterally disposed between a main layer $114A_M$ and a main layer $114B_M$.

The conductive features 114A and the conductive features 114B are collectively referred to as word lines 114 of the memory array 50. Adjacent pairs of the conductive features 114A and the conductive features 114B are in physical contact with one another and are electrically coupled to one another. Thus, each pair of conductive features 114A, 114B functions as a single word line 114.

Figure 10:
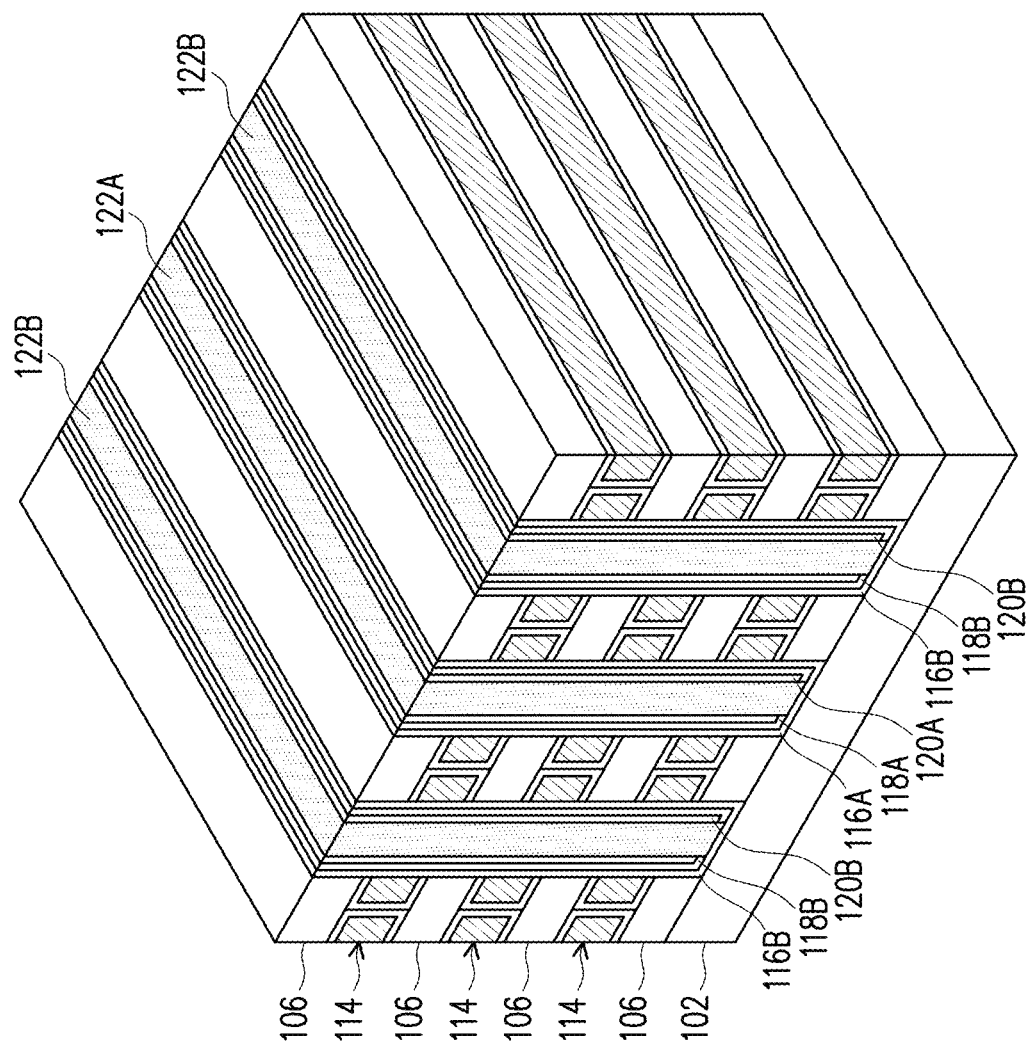

In FIG. 10, the memory films 116B, semiconductor layers 118B, back gate isolators 120B, and isolation regions 122B are formed in the trenches 110B. The semiconductor layers 118B and the back gate isolators 120B are formed over the memory films 116B. The isolation regions 122B extend through the semiconductor layers 118B, thus separating the semiconductor layers 118B of horizontally adjacent transistors along the direction $D_2$ (see FIGS. 1A and 1B). In the illustrated embodiment, the isolation regions 122B are formed over the memory films 116B. In another embodiment, the isolation regions 122B also extend through the memory films 116B and the substrate 102, thus separating the memory films 116B of horizontally adjacent transistors along the direction $D_2$.

The memory films 116B may be formed of a material that is selected from the same group of candidate materials of the memory films 116A, which may be formed using a method that is selected from the same group of candidate methods for forming the material of the memory films 116A. The memory films 116A and the memory films 116B may be formed from the same material, or may include different materials. The memory films 116A and the memory films 116B are collectively referred to as memory films 116. A thickness of the memory films 116 can be in the range of about 2 nm to about 20 nm.

The semiconductor layers 118B may be formed of a material that is selected from the same group of candidate materials of the semiconductor layers 118A, which may be formed using a method that is selected from the same group of candidate methods for forming the material of the semiconductor layers 118A. The semiconductor layers 118A and the semiconductor layers 118B may be formed from the same material, or may include different materials. The semiconductor layers 118A and the semiconductor layers 118B are collectively referred to as semiconductor layers 118. A thickness of the semiconductor layers 118 can be in the range of about 9 nm to about 11 nm.

The back gate isolators 120B may be formed of a material that is selected from the same group of candidate materials of the back gate isolators 120A, which may be formed using a method that is selected from the same group of candidate methods for forming the material of the back gate isolators 120A. The back gate isolators 120A and the back gate isolators 120B may be formed from the same material, or may include different materials. The back gate isolators 120A and the back gate isolators 120B are collectively referred to as back gate isolators 120. A thickness of the back gate isolators 120 can be in the range of about 1 nm to about 20 nm.

The isolation regions 122B may be formed of a material that is selected from the same group of candidate materials of the isolation regions 122A, which may be formed using a method that is selected from the same group of candidate methods for forming the material of the isolation regions 122A. The isolation regions 122A and the isolation regions 122B may be formed from the same material, or may include different materials. The isolation regions 122B and the back gate isolators 120B are formed of different dielectric materials so that the material of the isolation regions 122B has a high etching selectivity from the etching of the material of the back gate isolators 120B. The isolation regions 122A and the isolation regions 122B are collectively referred to as isolation regions 122. A thickness of the isolation regions 122 can be in the range of about 42 nm to about 192 nm.

The memory films 116B, the semiconductor layers 118B, the back gate isolators 120B, and the isolation regions 122B may be formed by a combination of deposition, etching, and planarization. For example, the memory films 116B, the semiconductor layers 118B, the back gate isolators 120B, and the isolation regions 122B may be formed by similar steps (discussed above for FIG. 6) as those used to form the memory films 116A, the semiconductor layers 118A, the back gate isolators 120A, and the isolation regions 122A.

As will be discussed in greater detail below, FIGS. 11 through 18 illustrate a process in which portions of the isolation regions 122 are replaced with the remaining features of the transistors. Specifically, portions of the isolation regions 122 are replaced with isolation regions 142 (see FIG. 16), and with bit lines 146B and source lines 146S (see FIG. 18). The remaining portions of the isolation regions 122 separate the features of horizontally adjacent transistors along the direction $D_1$ (see FIGS. 1A and 1B). The bit lines 146B and the source lines 146S also act as source/drain regions of the transistors. During the process for replacing the portions of the isolation regions 122, the back gate isolators 120 are patterned. The patterned back gate isolators 120 allow portions of the bit lines 146B/source lines 146S to also act as back gates during write operations.

Figure 11:
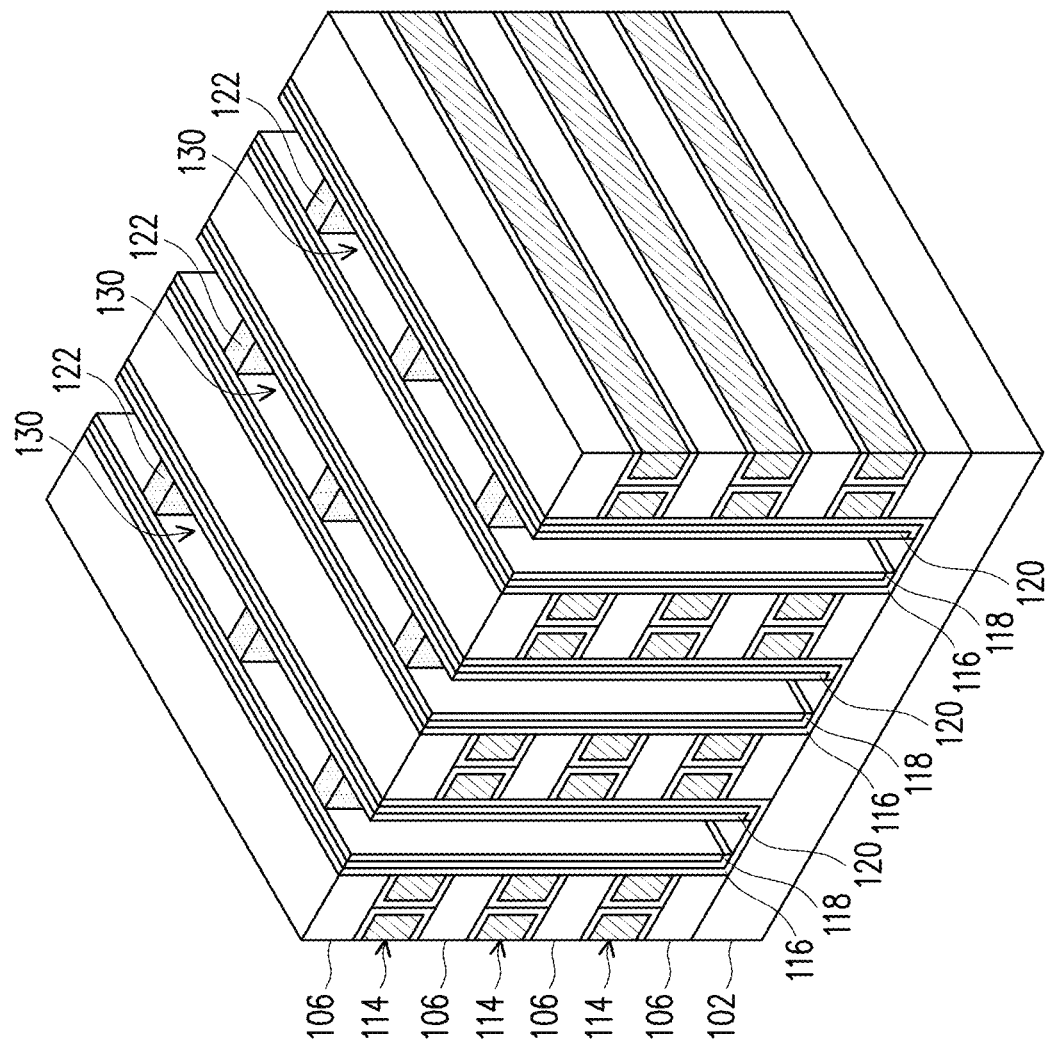

In FIG. 11, portions of the isolation regions 122 are removed to form openings 130. The openings 130 may be formed with an etching process that is selective to the isolation regions 122 (e.g., selectively removes the material of the isolation regions 122 at a faster rate than the materials of the memory films 116 and the back gate isolators 120). The etching may be any acceptable etch process, such as a reactive ion etch (RIE), neutral beam etch (NBE), the like, or a combination thereof. The etching may be anisotropic. In embodiments where the isolation regions 122 are formed of silicon oxide, the openings 130 can be formed through the isolation regions 122 by a dry etch using ammonia ($NH_3$) and hydrogen fluoride (HF) gas, performed with an etching mask having a pattern of the openings 130.

Figure 12:
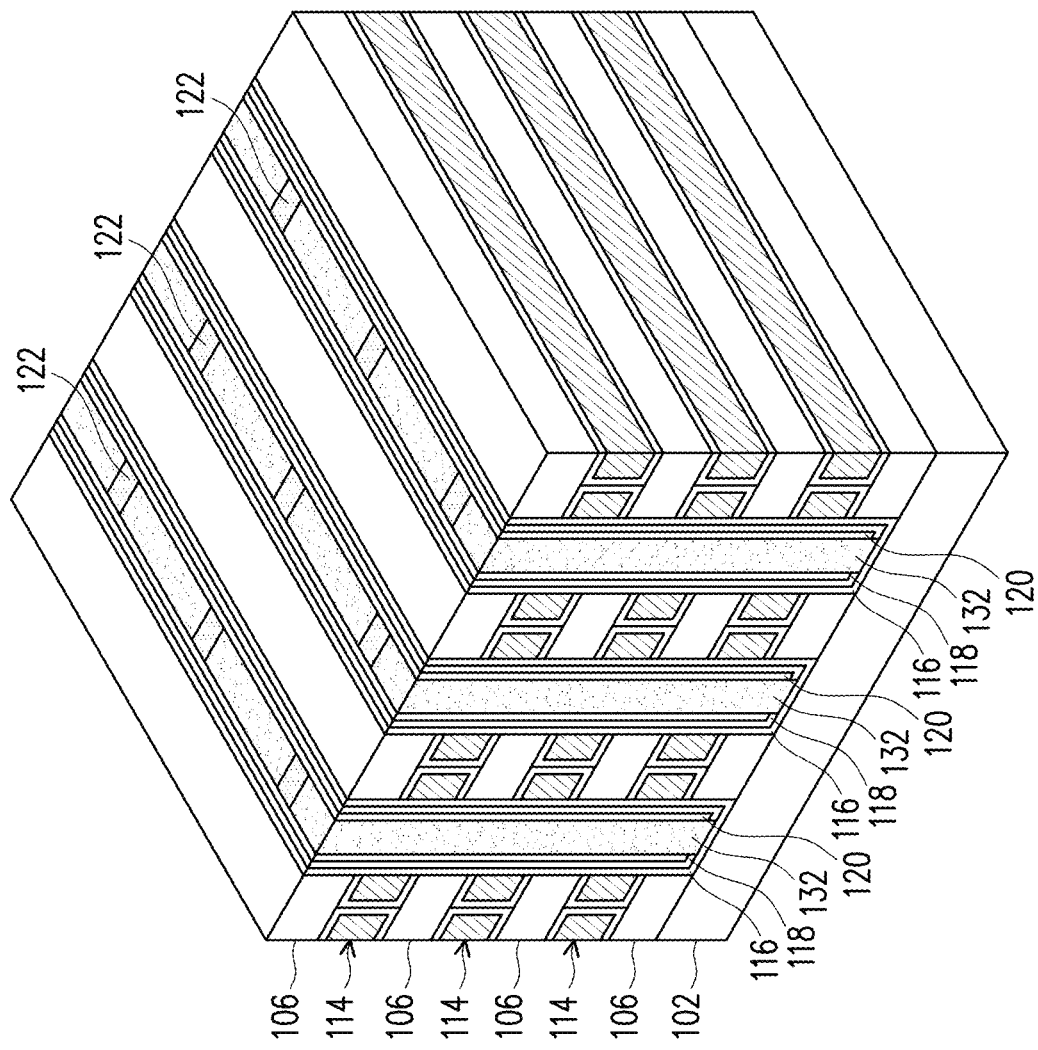

In FIG. 12, sacrificial regions 132 are formed in the openings 130. The sacrificial regions 132 are formed of a sacrificial material, such as a dielectric material, which will be replaced with bit lines and source lines in subsequent processing. As such, the dielectric material of the sacrificial regions 132 has a high etching selectivity from the etching of the materials of the memory films 116, the semiconductor layers 118, and the back gate isolators 120. Acceptable dielectric materials for the sacrificial regions 132 include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. The material of the sacrificial regions 132 may be formed by an acceptable deposition process such as ALD, CVD, flowable CVD (FCVD), or the like. In some embodiments, the sacrificial regions 132 are formed of a nitride such as silicon nitride deposited by CVD. A removal process may be applied to the material of the sacrificial regions 132 to remove excess of the material over the topmost dielectric layers 106/sacrificial layers 108. The removal process may be a planarization process such as a chemical mechanical polish (CMP), an etch-back, combinations thereof, or the like. The planarization process exposes the topmost dielectric layers 106/sacrificial layers 108 such that top surfaces of the sacrificial regions 132 and the topmost dielectric layers 106/sacrificial layers 108 are coplanar (within process variations) after the planarization process.

Figure 13:
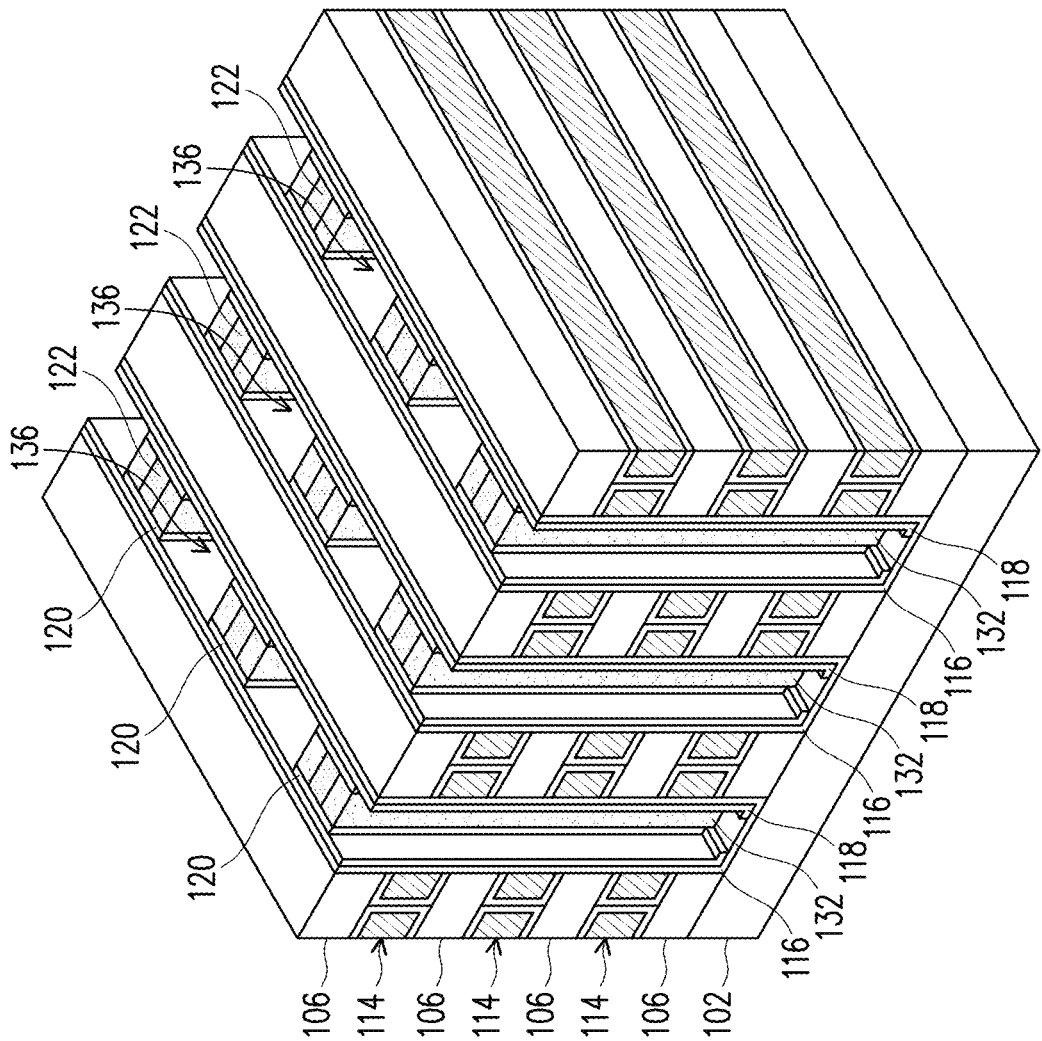

In FIG. 13, the back gate isolators 120 and the sacrificial regions 132 are patterned to form openings 136. The openings 136 may be formed with an etching process that is selective to the back gate isolators 120 and the sacrificial regions 132 (e.g., selectively removes the materials of the back gate isolators 120 and the sacrificial regions 132 at a faster rate than the materials of the semiconductor layers 118 and/or the memory films 116). The etching may be any acceptable etch process, such as a reactive ion etch (RIE), neutral beam etch (NBE), the like, or a combination thereof. The etching may be anisotropic. In embodiments where the back gate isolators 120 are formed of aluminum oxide and the sacrificial regions 132 are formed of silicon nitride, the openings 136 can be formed through the back gate isolators 120 and the sacrificial regions 132 by a dry etch using a fluorine-based gas (e.g., $C_4F_6$) mixed with hydrogen ($H_2$) or oxygen (02) gas, performed with an etching mask having a pattern of the openings 136.

Figure 14:
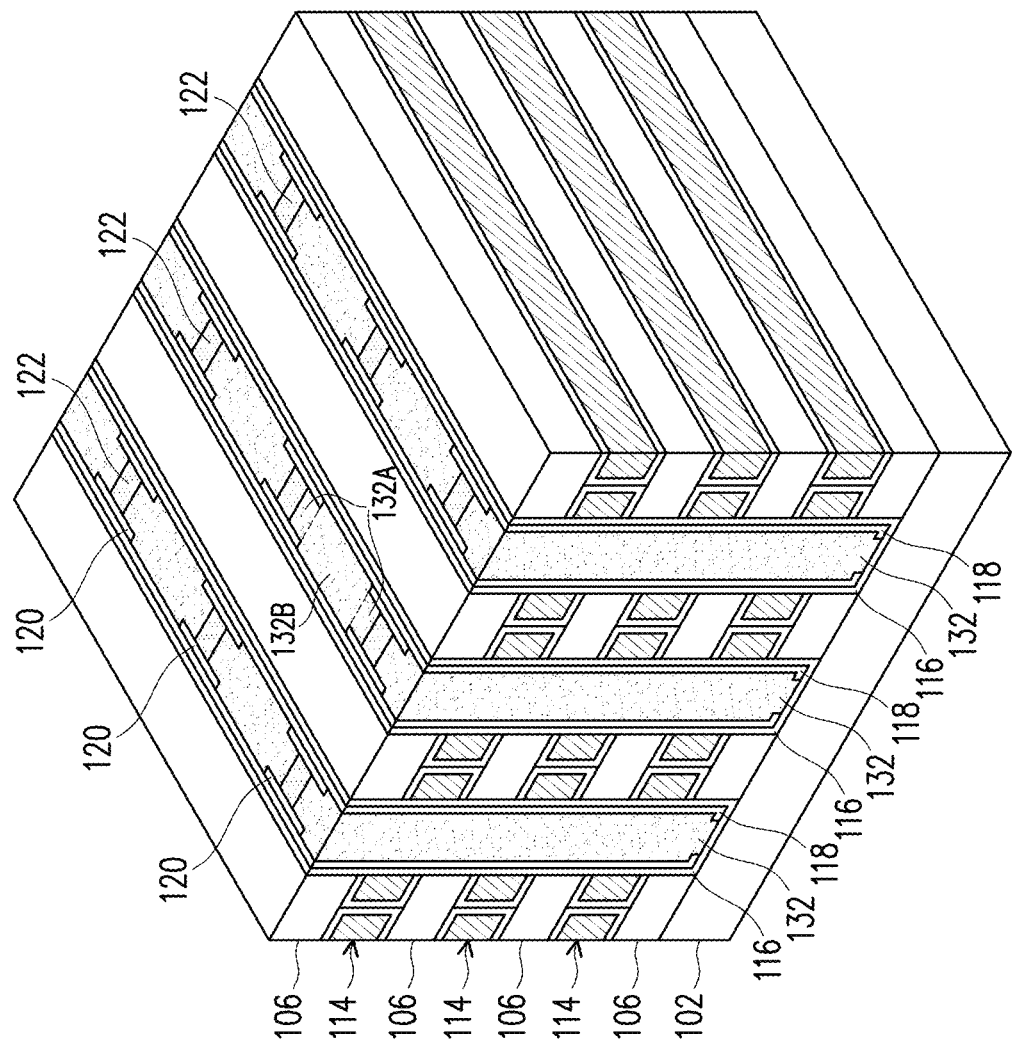

In FIG. 14, additional material of the sacrificial regions 132 is redeposited in the openings 136 to reform the sacrificial regions 132. Each sacrificial region 132 thus has first portions 132A and a second portion 132B. As noted above, the sacrificial regions 132 will be replaced with bit lines and source lines in subsequent processing, and the bit lines/ source lines will have main regions and extension regions. The first portions 132A of the sacrificial region 132 correspond to the portions of the sacrificial material that were not removed when forming the openings 136, and will be replaced with the extension regions of the bit lines/source lines. The second portions 132B of the sacrificial region 132 correspond to the portions of the sacrificial material that were redeposited in the openings 136, and will be replaced with the main regions of the bit lines/source lines. The portions 132A, 132B of the sacrificial regions 132 may merge during redeposition such that no discernable interfaces exist between them.

Figure 15:
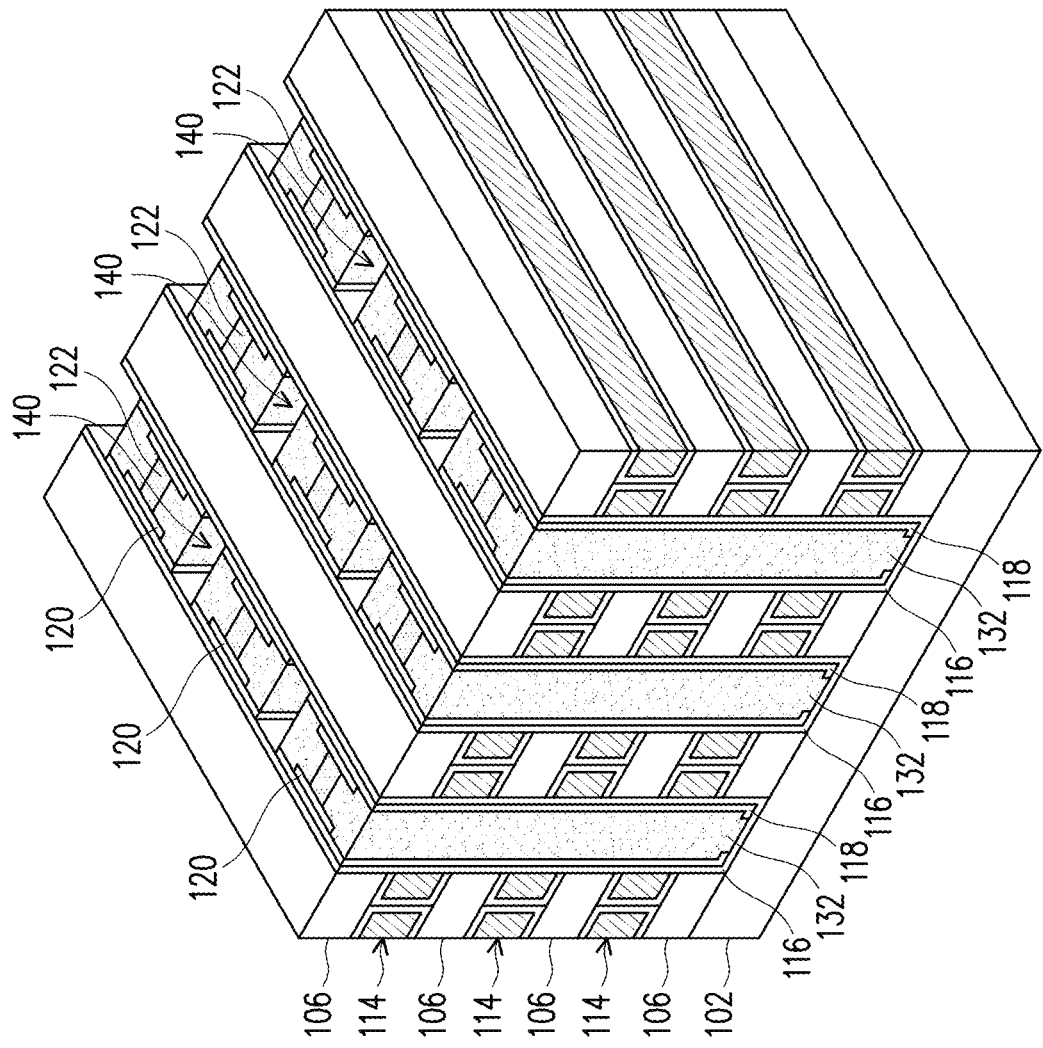

In FIG. 15, openings 140 for isolation regions are formed through the sacrificial regions 132. The openings 140 divide the sacrificial regions 132 into portions that will be replaced with bit lines and source lines in subsequent processing. The openings 140 may be formed with an etching process that is selective to the sacrificial regions 132 (e.g., selectively removes the material of the sacrificial regions 132 at a faster rate than the material of the memory films 116). The etching may be any acceptable etch process, such as a reactive ion etch (RIE), neutral beam etch (NBE), the like, or a combination thereof. The etching may be anisotropic. In embodiments where the sacrificial regions 132 are formed of silicon nitride, the openings 140 can be formed through the sacrificial regions 132 by a dry etch using a fluorine-based gas (e.g., $C_4F_6$) mixed with hydrogen ($H_2$) or oxygen ($O_2$) gas, performed with an etching mask having a pattern of the openings 140.

The semiconductor layers 118 are patterned during processing so that the semiconductor layers 118 of horizontally adjacent transistors are separated along the direction $D_1$ (see FIGS. 1A and 1B). As will be discussed in greater detail below, the semiconductor layers 118 can be patterned at one of several steps during processing, depending on the desired widths of the divided semiconductor layers 118. In this embodiment, the semiconductor layers 118 are concurrently patterned with the patterning of the sacrificial regions 132/ openings 140 (see FIG. 15). In another embodiment, the semiconductor layers 118 are concurrently patterned with the patterning of the back gate isolators 120/openings 136 (see FIG. 13). In yet another embodiment, the semiconductor layers 118 are patterned in a separate step after the patterning of the back gate isolators 120/openings 136 (see FIG. 13) but before the redeposition of the material of the sacrificial regions 132 in the openings 136 (see FIG. 14) or the patterning of the sacrificial regions 132/openings 140 (see FIG. 15). When they are separately patterned, the semiconductor layers 118 may be patterned with an etching process that is selective to the semiconductor layers 118 (e.g., selectively removes the material of the semiconductor layers 118 at a faster rate than the material of the memory films 116). The etching may be any acceptable etch process, such as a reactive ion etch (RIE), neutral beam etch (NBE), the like, or a combination thereof. The etching may be anisotropic. In embodiments where the semiconductor layers 118 are formed of IGZTO, the semiconductor layers 118 may be patterned by a dry etch using $Cl_2$, $BCl_3$, $CF_4$, $SF_6$, or the like.

Figure 16:
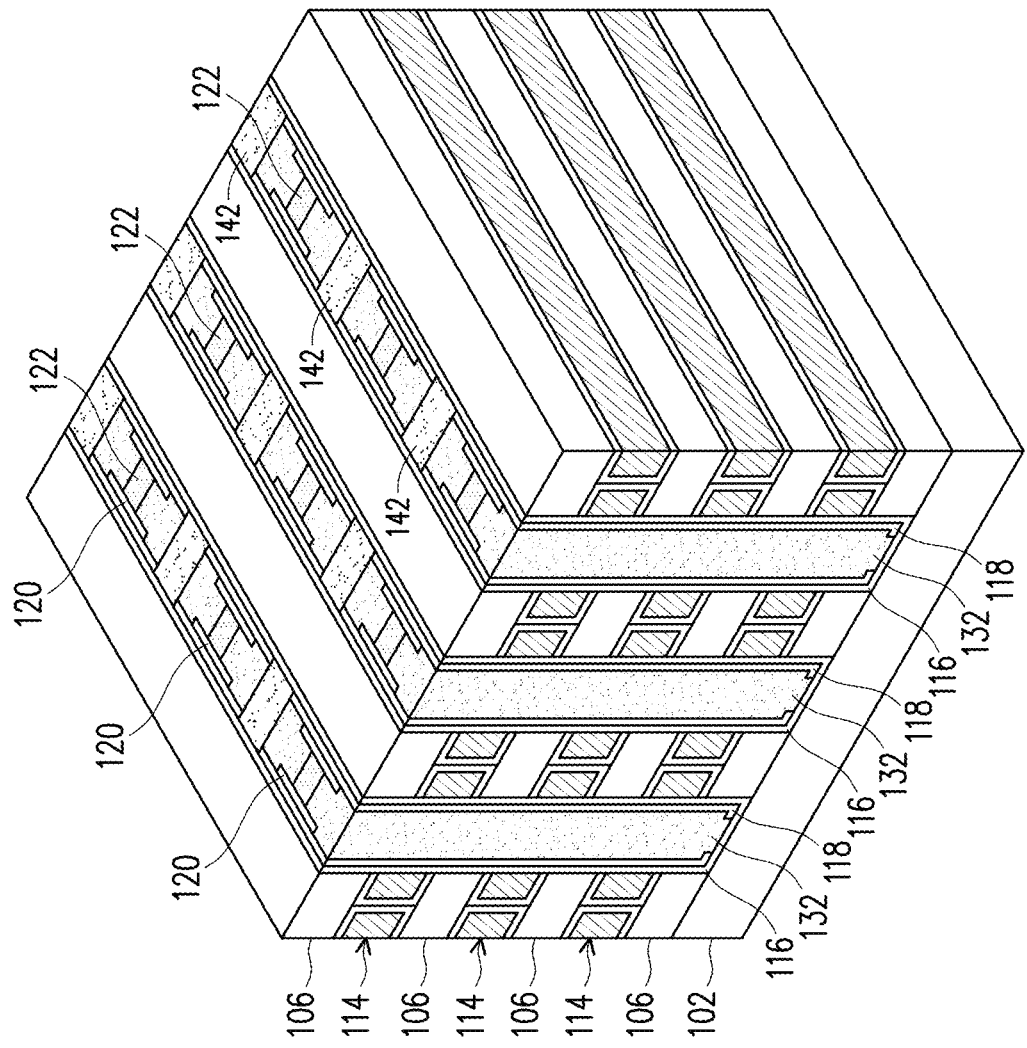

In FIG. 16, isolation regions 142 are formed in the openings 140. The isolation regions 142 thus extend through the sacrificial regions 132. The isolation regions 142 may be formed of a material that is selected from the same group of candidate materials of the isolation regions 122, which may be formed using a method that is selected from the same group of candidate methods for forming the material of the isolation regions 122. The isolation regions 122 and the isolation regions 142 may be formed from the same material, or may include different materials. In some embodiments, the isolation regions 142 are formed of silicon oxide deposited by CVD. As an example to form the isolation regions 142, an isolation material is formed in the openings 140. A removal process is then applied to the various layers to remove excess isolation material over the topmost dielectric layer 106/word line 114. The removal process may be a planarization process such as a chemical mechanical polish (CMP), an etch-back, combinations thereof, or the like. The remaining isolation material forms the isolation regions 142 in the openings 140.

Figure 17:
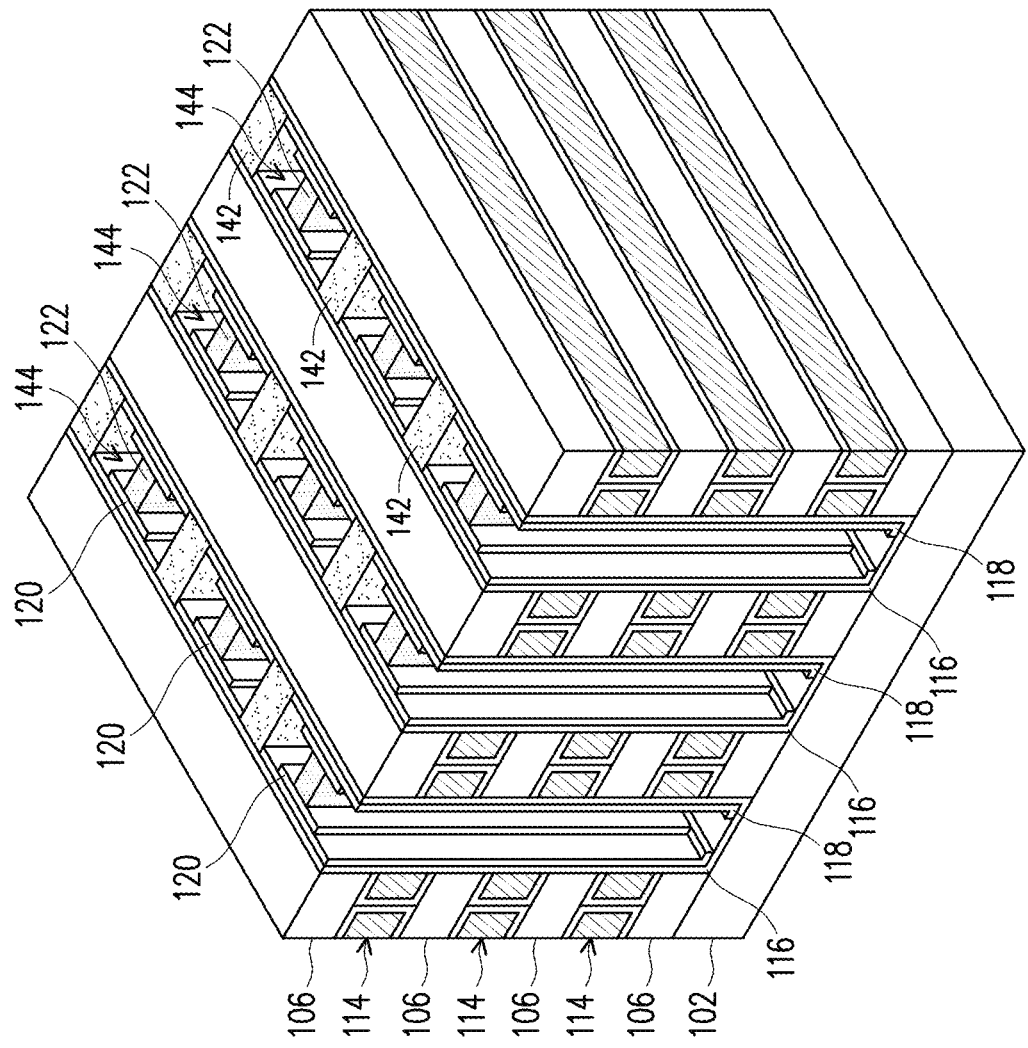

In FIG. 17, the sacrificial regions 132 are removed to form openings 144. The openings 144 may be formed with an etching process that is selective to the sacrificial regions 132 (e.g., selectively removes the material of the sacrificial regions 132 at a faster rate than the materials of the isolation regions 142, the back gate isolators 120, the isolation regions 122, the semiconductor layers 118, and the memory films 116). The etching may be isotropic. In embodiments where the sacrificial regions 132 are formed of silicon nitride, the openings 144 can be formed by a wet etch using phosphoric acid ($H_3PO_4$). In another embodiment, a dry etch selective to the material of the sacrificial regions 132 may be used.

Figure 18:
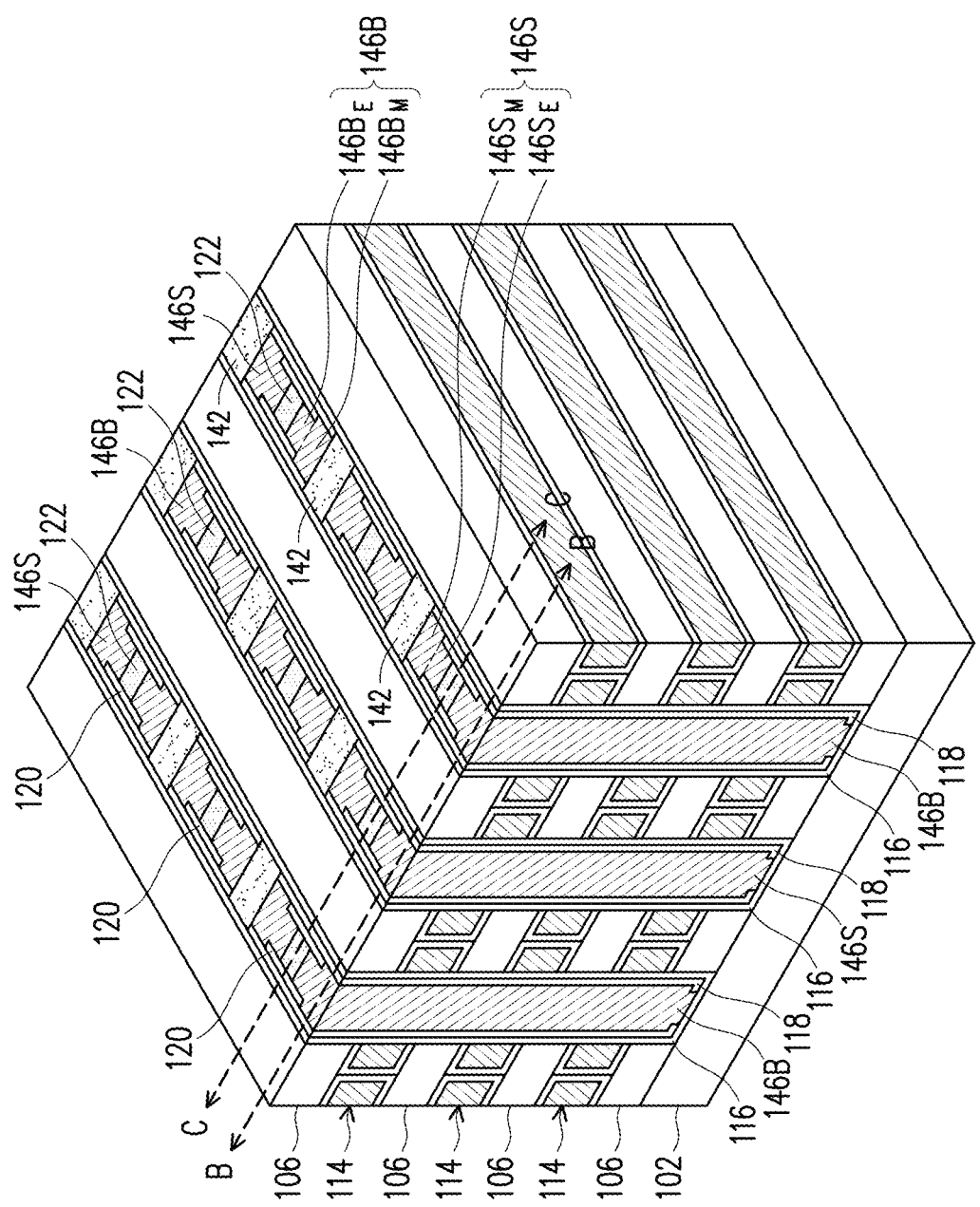

In FIG. 18, conductive lines (including bit lines 146B and source lines 146S) are formed in the openings 144. The bit lines 146B and the source lines 146S are conductive pillars, and may also be referred to as bit line pillars and source line pillars. Each transistor will include a bit line 146B and a source line 146S, with an isolation region 122 disposed between the bit line 146B and the source line 146S. In this embodiment, the bit lines 146B/source lines 146S extend though the semiconductor layers 118. In another embodiment, the bit lines 146B/source lines 146S also extend through the memory films 116 and the substrate 102.

As an example to form the bit lines 146B/source lines 146S, a liner, such as a diffusion barrier layer, an adhesion layer, or the like, and a main layer are formed in the openings 144. The liner may be formed of a conductive material such as titanium, titanium nitride, tantalum, tantalum nitride, or the like, which may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The main layer may be formed of a conductive material such as tungsten, cobalt, ruthenium, aluminum, nickel, copper, a copper alloy, silver, gold, or the like, which may be deposited by ALD, CVD, PVD, or the like. In some embodiments, the bit lines 146B/source lines 146S include a liner formed of titanium nitride and a main layer formed of tungsten. A removal process is then applied to the various layers to remove excess material(s) of the bit lines 146B/ source lines 146S over the topmost dielectric layers 106/ word lines 114. The removal process may be a planarization process such as a chemical mechanical polish (CMP), an etch-back, combinations thereof, or the like. The remaining material(s) in the openings 144 form the bit lines 146B/ source lines 146S. The planarization process exposes the topmost dielectric layers 106/word lines 114 such that top surfaces of the bit lines 146B/source lines 146S, the isolation regions 142, the isolation regions 122, the back gate isolators 120, the semiconductor layers 118, the memory films 116, and the topmost dielectric layers 106/word lines 114 are coplanar (within process variations) after the planarization process.

The bit lines 146B/source lines 146S each have T-shaped cross-sections in the top-down view. Specifically, the bit lines 146B have main regions $146B_M$ that extend along the sidewalls of the semiconductor layers 118, and have extension regions $146B_E$ that extend along the sidewalls of the back gate isolators 120. Similarly, the source lines 146S have main regions $146S_M$ that extend along the sidewalls of the semiconductor layers 118, and have extension regions $146S_E$ that extend along the sidewalls of the back gate isolators 120. The extension regions $146B_E$, $146S_E$ and the isolation regions 122 each have the same width in the second direction $D_2$ (see FIGS. 1A and 1B). The patterned back gate isolators 120 allow the main regions $146B_M$, $146S_M$ to contact the semiconductor layers 118, but keeps the extension regions $146B_E$, $146S_E$ separated from the portions of the semiconductor layers 118 that provide channel regions. As such, the extension regions $146B_E$, $146S_E$ can act as back gates without shorting the channel regions.

Figure 19A:
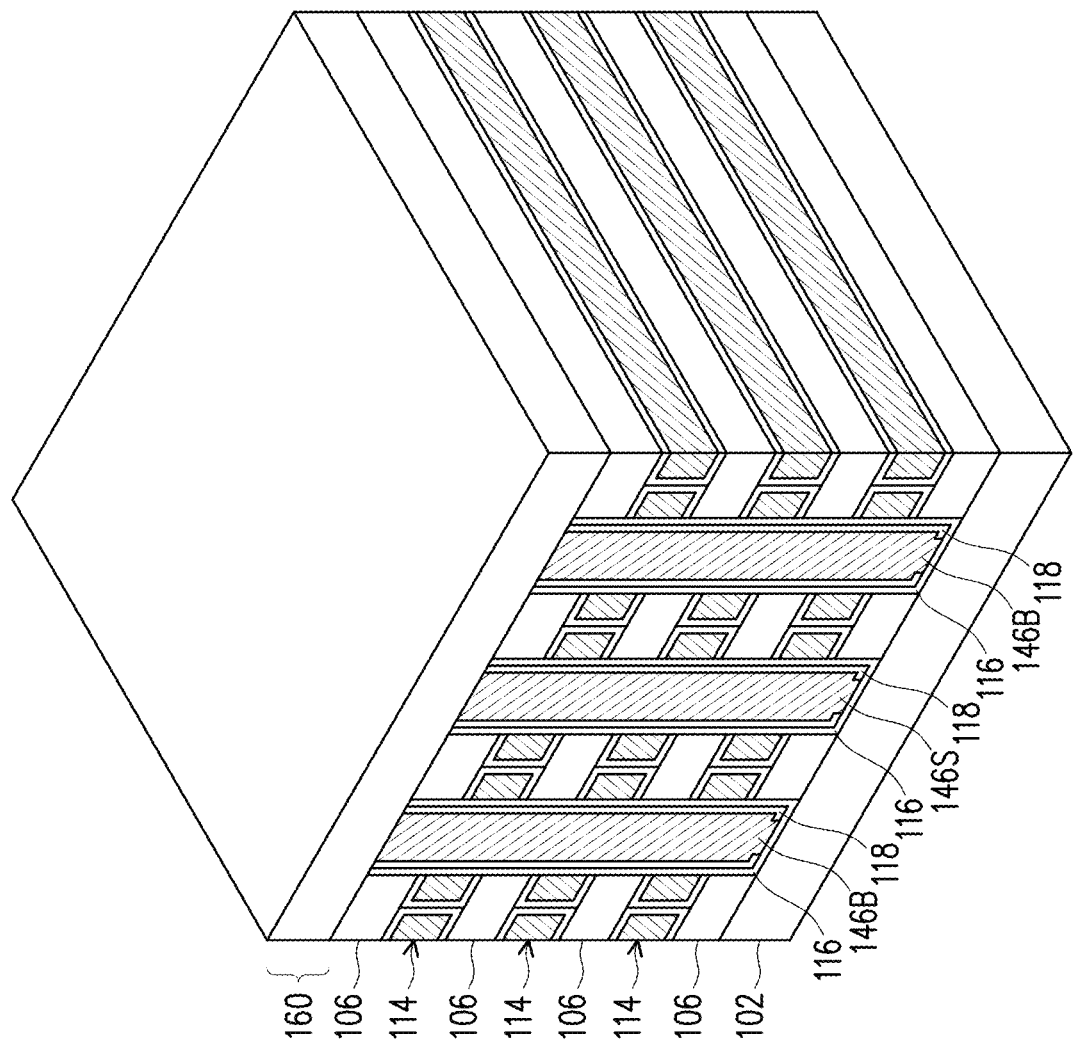
Figure 19B:
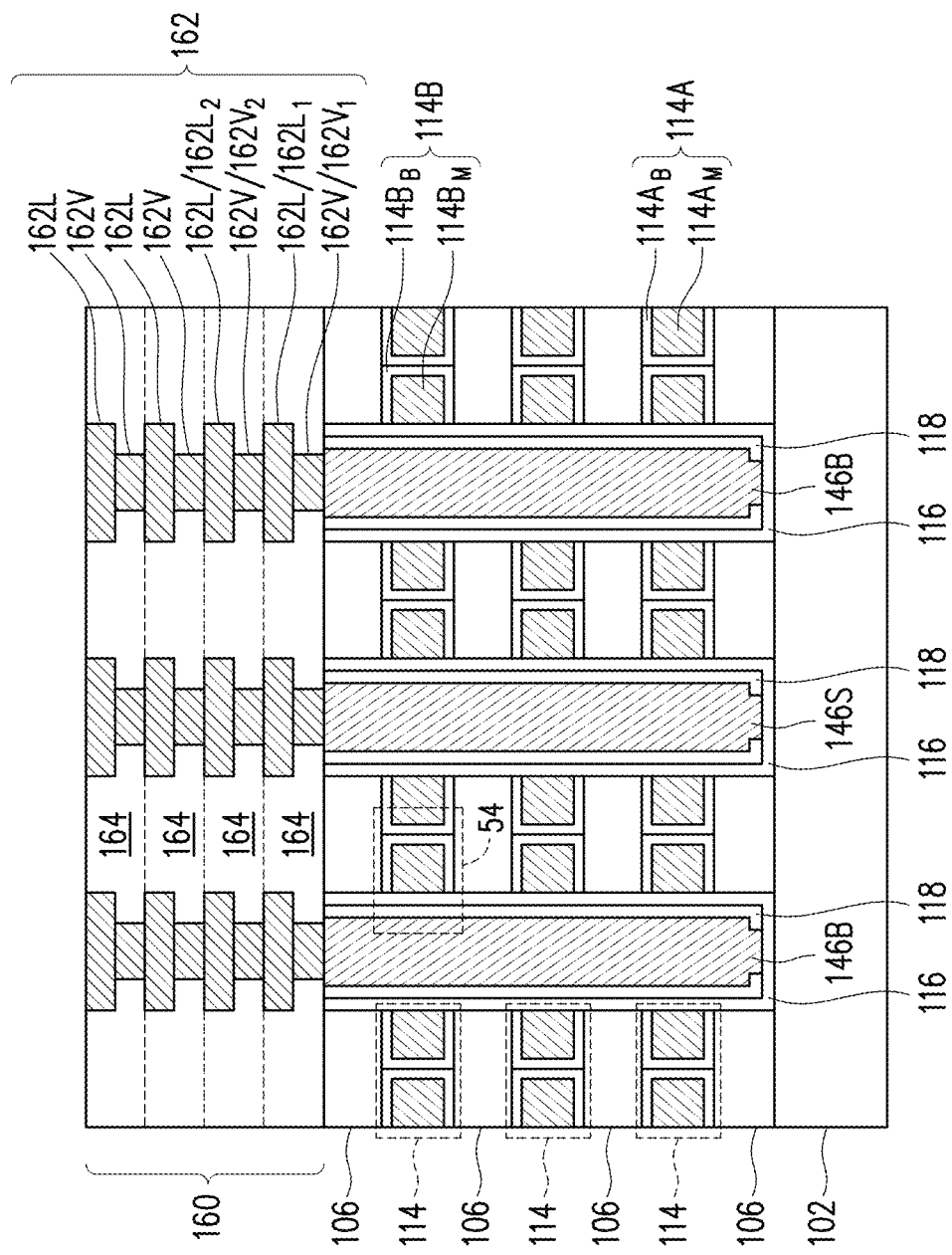
Figure 19C:
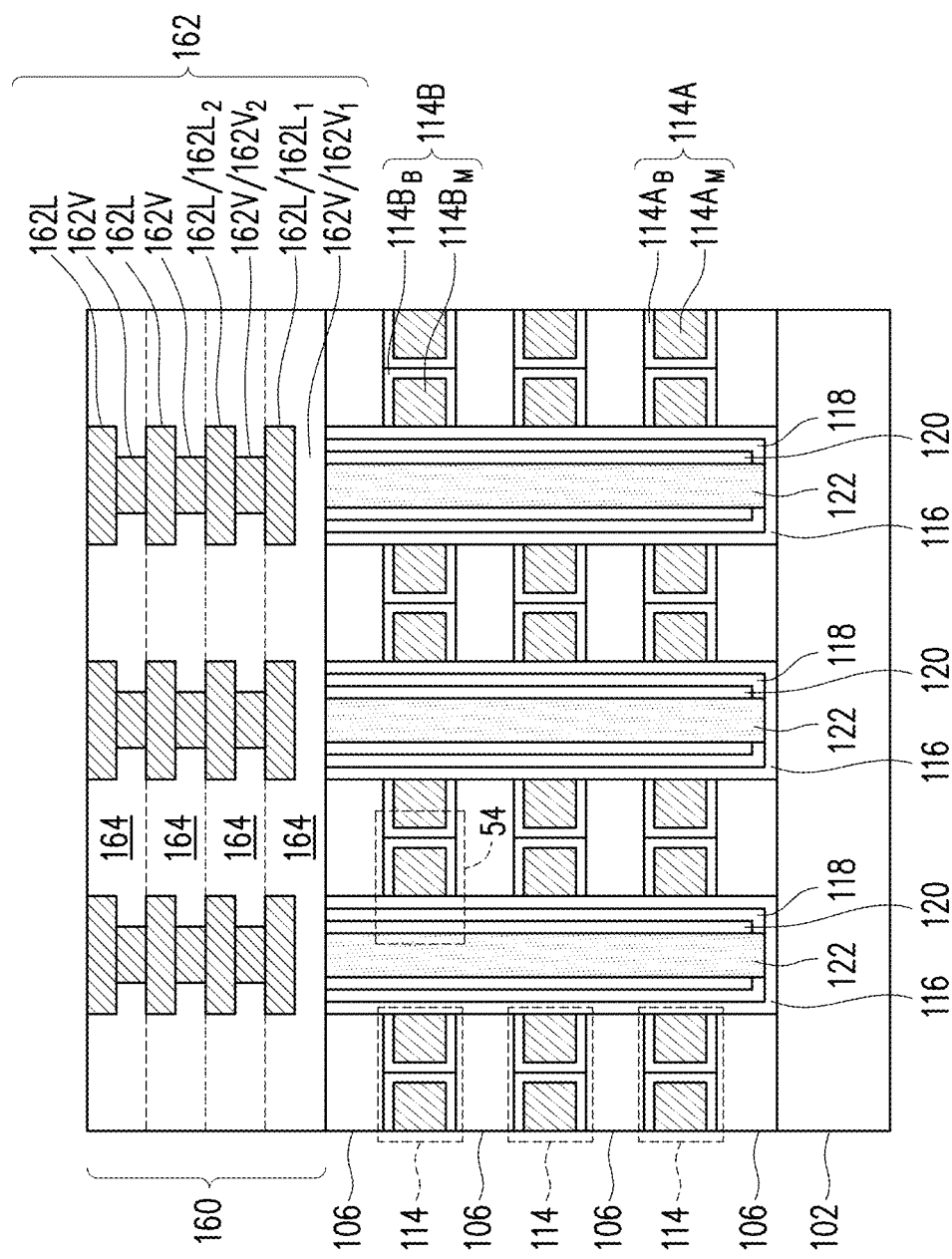

In FIGS. 19A, 19B, and 19C, an interconnect structure 160 is formed over the intermediate structure. The interconnect structure 160 may include, e.g., metallization patterns 162 in a dielectric material 164 (not shown in FIG. 19A, see FIGS. 19B and 19C). The dielectric material 164 may include one or more dielectric layers, such as one or more layers of a low-k (LK) or an extra low-K (ELK) dielectric material. The metallization patterns 162 may be metal interconnects (e.g., conductive lines 162L, conductive vias 162V, etc.) formed in the dielectric material 164. The interconnect structure 160 may be formed by a damascene process, such as a single damascene process, a dual damascene process, or the like. The metallization patterns 162 of the interconnect structure 160 are electrically connected to the bit lines 146B/source lines 146S, and interconnect the transistors 54 to form functional memories.

As noted above, the dielectric layers 106 and the word lines 114 may be formed in a staircase structure. The dielectric layers 106 and the word lines 114 may be patterned to form the staircase structure at any suitable step before the formation of the interconnect structure 160. Forming the interconnect structure 160 includes forming conductive contacts that are connected to the exposed portions of each of the word lines 114.

FIGS. 20A through 20J are views of intermediate stages in the manufacturing of a staircase structure of a memory array 50, in accordance with some embodiments. FIGS. 20A through 20J are cross-sectional views illustrated along reference cross-section B-B' illustrated in FIG. 1A. Some features of the transistors, such as the memory films 116, the semiconductor layers 118, the back gate isolators 120, and the like (see FIGS. 6 through 19C), are not shown for clarity of illustration. In FIGS. 20A through 20J, the multilayer stack 104 is patterned to form a staircase structure after the sacrificial layers 108 are replaced with the word lines 114. It should be appreciated that the process shown may be performed at other suitable steps of processing.

Figure 20A:
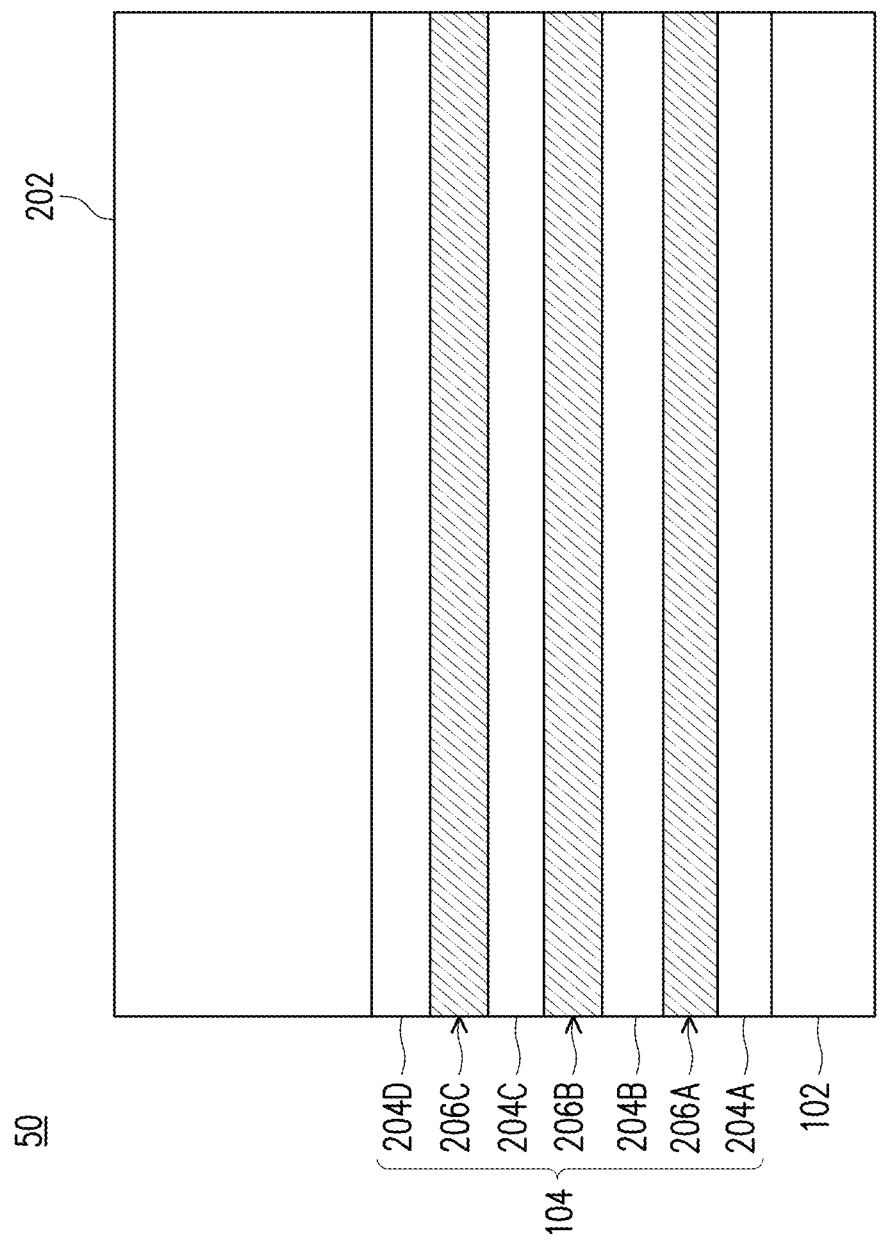

In FIG. 20A a mask 202 is formed over the multilayer stack 104. At this step of processing, the multilayer stack 104 comprises alternating dielectric layers 204 (such as the dielectric layers 106 discussed above, labeled 204A, 204B, 204C, 204D) and conductive layers 206 (such as the word lines 114 discussed above, labeled 206A, 206B, 206C). The mask 202 may be a photoresist or the like, which can be formed by a spin-on technique or the like.

Figure 20B:
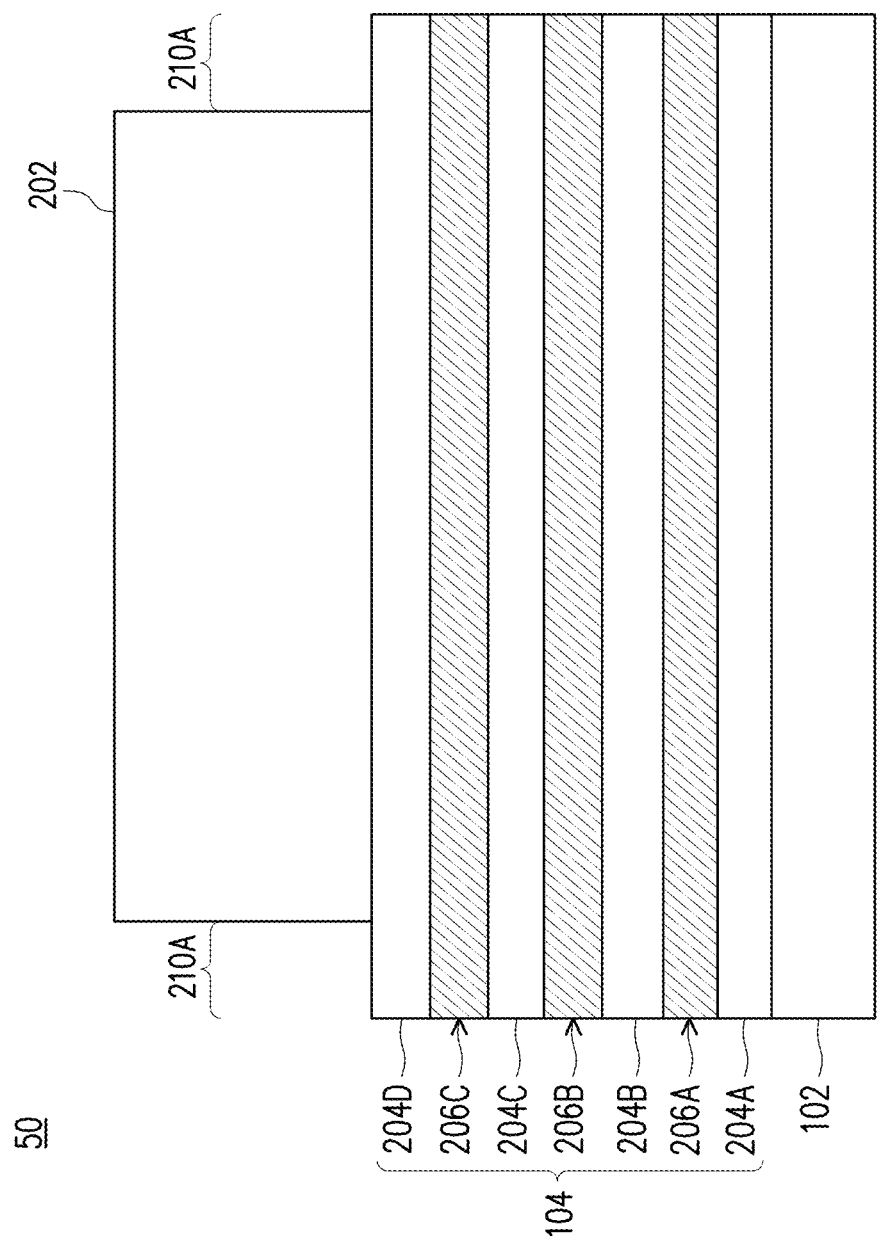
Figure 20C:
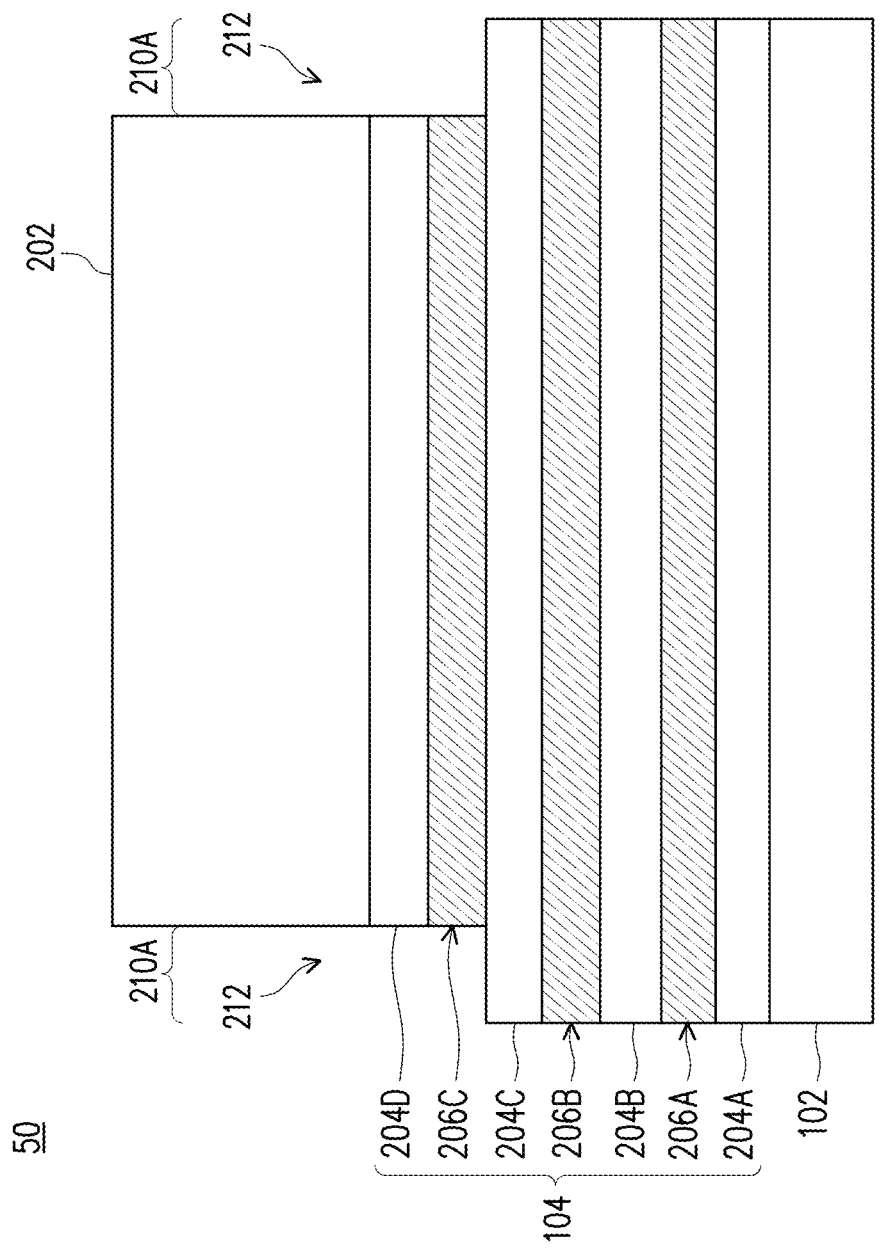

In FIG. 20B, the mask 202 is patterned to expose the multilayer stack 104 in regions 210A while masking remaining portions of the multilayer stack 104. For example, a topmost layer of the multilayer stack 104 (e.g., the dielectric layer 204D) may be exposed in the regions 210A. The mask 202 may be patterned using acceptable photolithography techniques In FIG. 20C, the exposed portions of the multilayer stack 104 in the regions 210A are etched using the mask 202 as an etching mask. The etching may be any acceptable etch process, such as by wet or dry etching, a reactive ion etch (RIE), neutral beam etch (NBE), the like, or a combination thereof. The etching may be anisotropic. The etching may remove portions of the dielectric layer 204D and conductive layer 206C in the regions 210A and define openings 212. Because the dielectric layer 204D and the conductive layer 206C have different material compositions, etchants used to remove exposed portions of these layers may be different. In some embodiments, the conductive layer 206C acts as an etch stop layer while etching the dielectric layer 204D, and the dielectric layer 204C acts as an etch stop layer while etching conductive layer 206C. As a result, the portions of the conductive layer 206C and the dielectric layer 204D may be selectively removed without removing remaining layers of the multilayer stack 104, and the openings 212 may be extended to a desired depth. Alternatively, a timed etch processes may be used to stop the etching of the openings 212 after the openings 212 reach a desired depth. In the resulting structure, the dielectric layer 204C is exposed in the regions 210A.

Figure 20D:
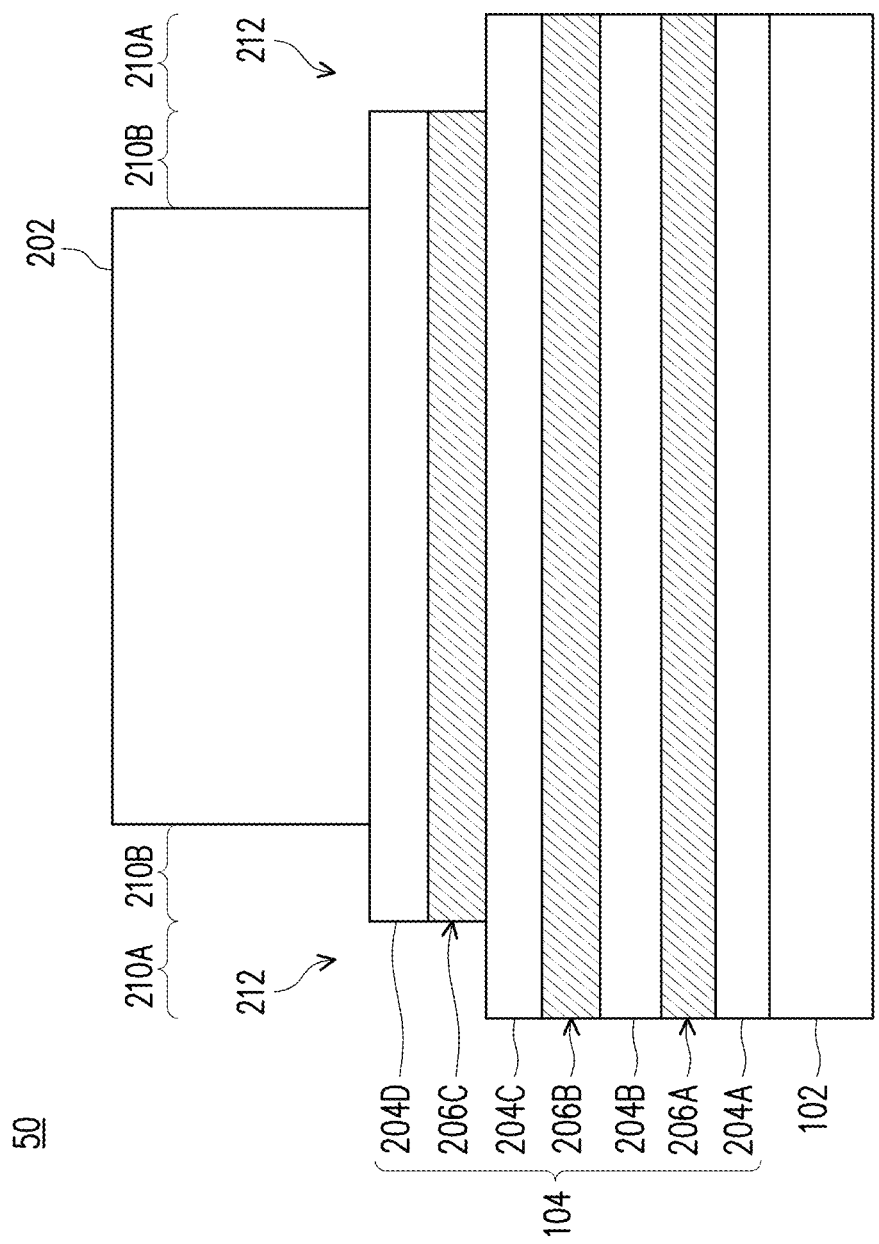

In FIG. 20D, the mask 202 is trimmed to expose additional portions of the multilayer stack 104. The mask 202 can be trimmed using acceptable photolithography and/or etching techniques. As a result of the trimming, a width of the mask 202 is reduced, and portions of the multilayer stack 104 in regions 210B may also be exposed. For example, a top surface of the dielectric layer 204C may be exposed in the regions 210A, and a top surface of the dielectric layer 204D may be exposed in the regions 210B.

In FIG. 20E, portions of the dielectric layer 204D, the conductive layer 206C, the dielectric layer 204C, and the conductive layer 206B in the regions 210A and 210B are removed by acceptable etching processes using the mask 202 as an etching mask. The etching may be any acceptable etch process, such as by wet or dry etching, a reactive ion etch (RIE), neutral beam etch (NBE), the like, or a combination thereof. The etching may be anisotropic. The etching may extend the openings 212 further into the multilayer stack 104. Because the dielectric layers 204D/204C and the conductive layers 206C/206B have different material compositions, etchants used to remove exposed portions of these layers may be different. In some embodiments, the conductive layer 206C acts as an etch stop layer while etching the dielectric layer 204D; the dielectric layer 204C acts as an etch stop layer while etching conductive layer 206C; the conductive layer 206B acts as an etch stop layer while etching the dielectric layer 204C; and the dielectric layer 204B acts as an etch stop layer while etching the conductive layer 206B. As a result, portions of the dielectric layers 204D/204C and the conductive layers 206C/206B may be selectively removed without removing remaining layers of the multilayer stack 104, and the openings 212 may be extended to a desired depth. Further, during the etching processes, unetched portions of the dielectric layers 204 and conductive layers 206 act as an etching mask for underlying layers, and as a result a previous pattern of the dielectric layer 204D and conductive layer 206C (see FIG. 20D) may be transferred to the underlying dielectric layer 204C and conductive layer 206B. In the resulting structure, the dielectric layer 204B is exposed in the regions 210A, and the dielectric layer 204C is exposed in the regions 210B.

Figure 20F:
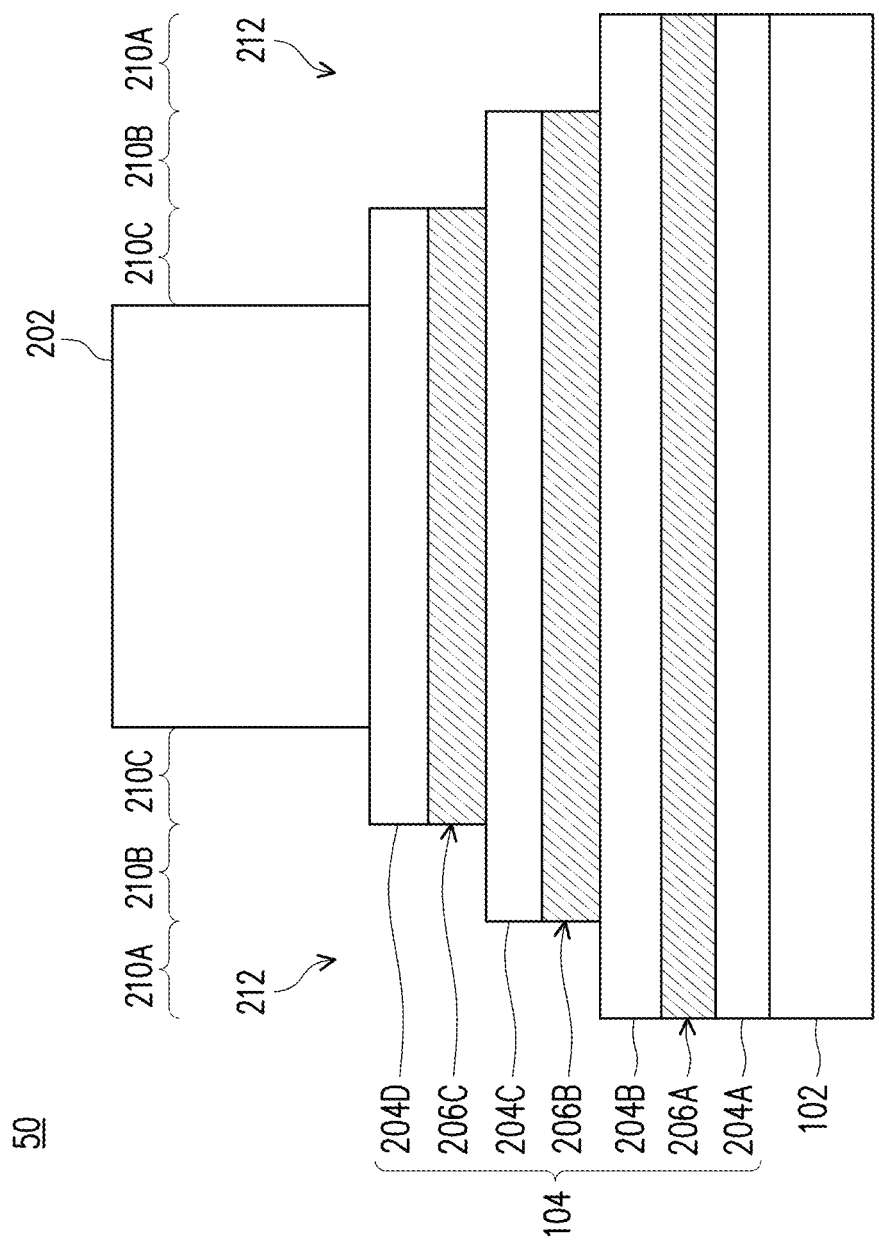

In FIG. 20F, the mask 202 is trimmed to expose additional portions of the multilayer stack 104. The photoresist can be trimmed using acceptable photolithography techniques. As a result of the trimming, a width of the mask 202 is reduced, and portions of the multilayer stack 104 in regions 210C may also be exposed. For example, a top surface of the dielectric layer 204B may be exposed in the regions 210A; a top surface of the dielectric layer 204C may be exposed in the regions 210B; and a top surface of the conductive layer 204D may be exposed in the regions 210C.

Figure 20G:
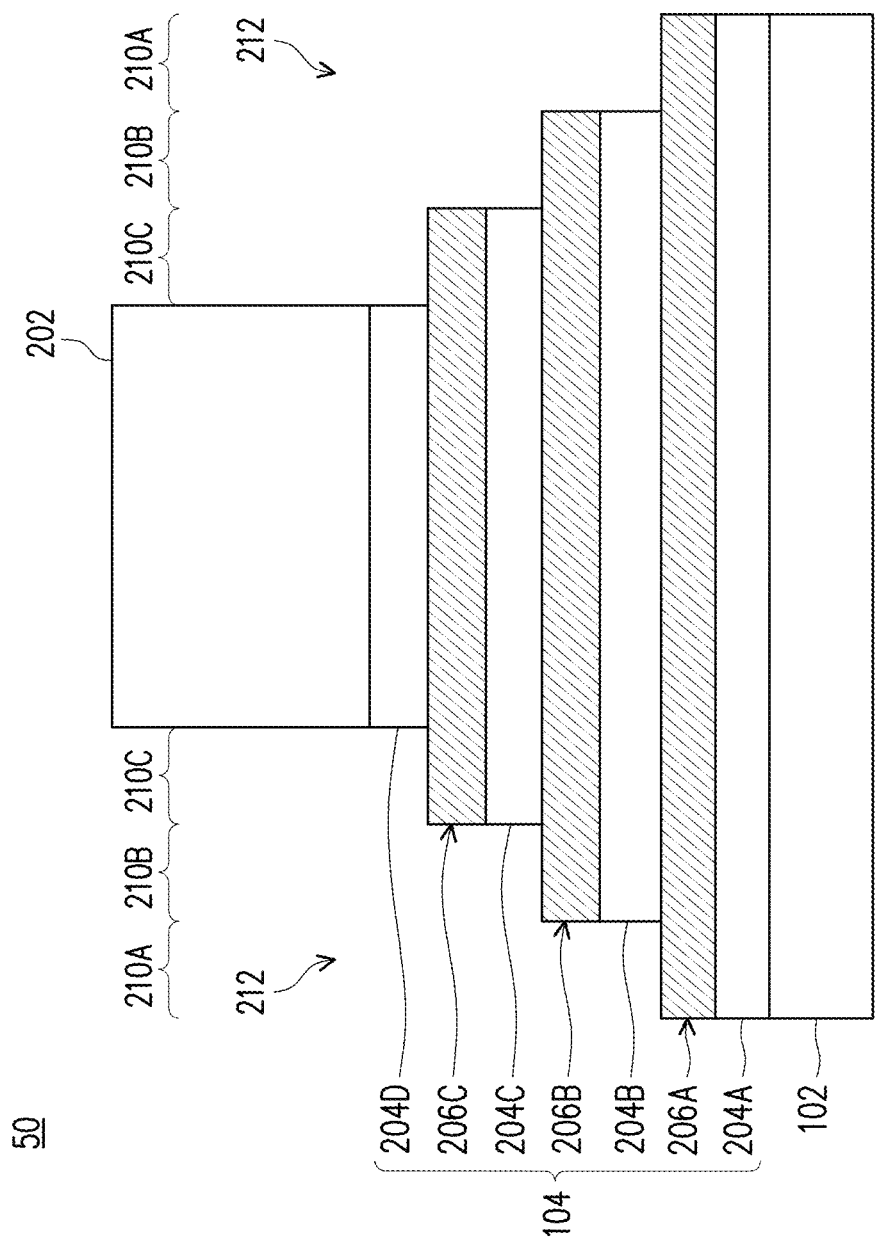

In FIG. 20G, portions of the dielectric layers 204D, 204C, 204B in the regions 210A, 210B, 210C are removed by acceptable etching processes using the mask 202 as an etching mask. The etching may be any acceptable etch process, such as by wet or dry etching, a reactive ion etch (RIE), neutral beam etch (NBE), the like, or a combination thereof. The etching may be anisotropic. The etching may extend the openings 212 further into the multilayer stack 104. In some embodiments, the conductive layer 206C acts as an etch stop layer while etching the dielectric layer 204D; the conductive layer 206B acts as an etch stop layer while etching the dielectric layer 204C; and the conductive layer 206A acts as an etch stop layer while etching the dielectric layer 204B. As a result, portions of the dielectric layers 204D, 204C, 204B may be selectively removed without removing remaining layers of the multilayer stack 104, and the openings 212 may be extended to a desired depth. Further, during the etching processes, each of the conductive layers 206 act as an etching mask for underlying layers, and as a result a previous pattern of the conductive layers 206C/206B (see FIG. 20F) may be transferred to the underlying dielectric layers 204C/204B. In the resulting structure, the conductive layer 206A is exposed in the regions 210A; the conductive layer 206B is exposed in the regions 210B; and the conductive layer 206C is exposed in the regions 210C.

Figure 20H:
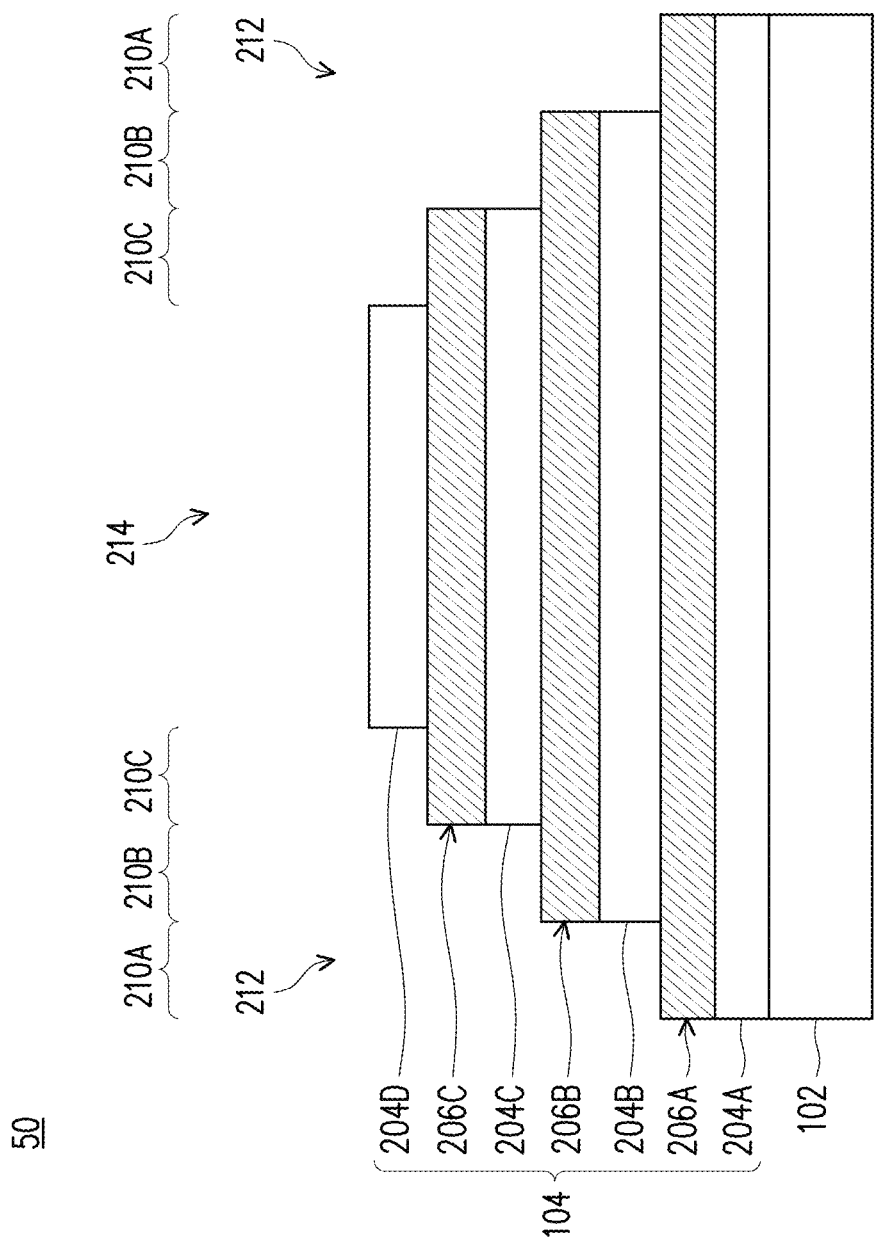

In FIG. 20H, the mask 202 may be removed, such as by an acceptable ashing or wet strip process. Thus, a staircase structure 214 is formed. The staircase structure comprises a stack of alternating ones of the dielectric layers 204 and the conductive layers 206. Lower conductive layers 206 are wider and extend laterally past upper conductive layers 206, and a width of each of the conductive layers 206 increases in a direction towards the substrate 102. For example, the conductive layer 206A may be longer than the conductive layer 206B; and the conductive layer 206B may be longer than the conductive layer 206C. As a result, conductive contacts can be made from above the staircase structure 214 to each of the conductive layers 206 in subsequent processing steps.

Figure 20I:
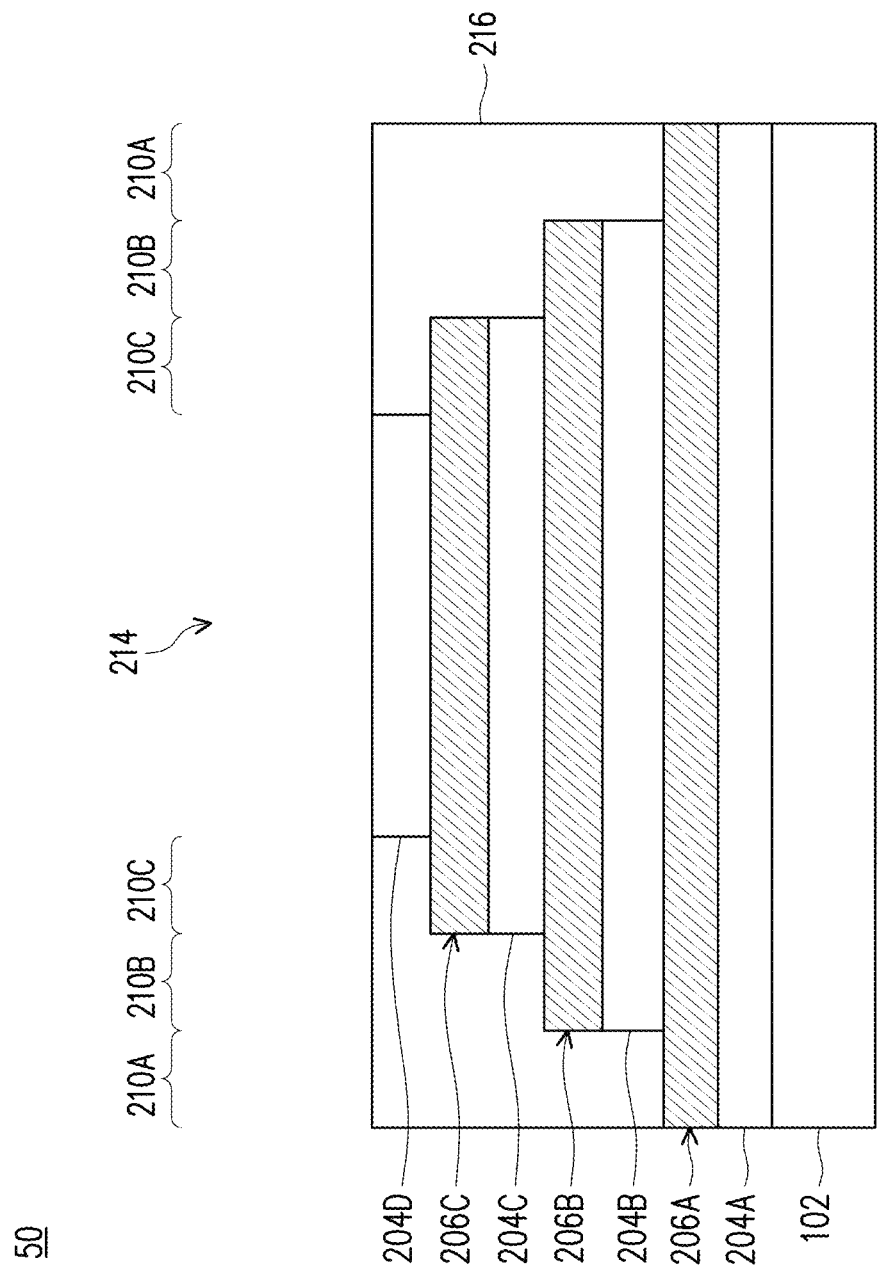

In FIG. 20I, an inter-metal dielectric (IMD) 216 is deposited over the staircase structure 214. The IMD 216 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 216 extends along sidewalls of the dielectric layers 204 as well as sidewalls of the conductive layers 206. Further, the IMD 216 may contact top surfaces of each of the conductive layers 206.

As further illustrated in FIG. 20I, a removal process is then applied to the IMD 216 to remove excess dielectric material over the staircase structure 214. In some embodiments, a planarization process such as a chemical mechanical polish (CMP), an etch-back process, combinations thereof, or the like may be utilized. The planarization process exposes the staircase structure 214 such that top surfaces of the staircase structure 214 and the IMD 216 are coplanar (within process variations) after the planarization process is complete.

Figure 20J:
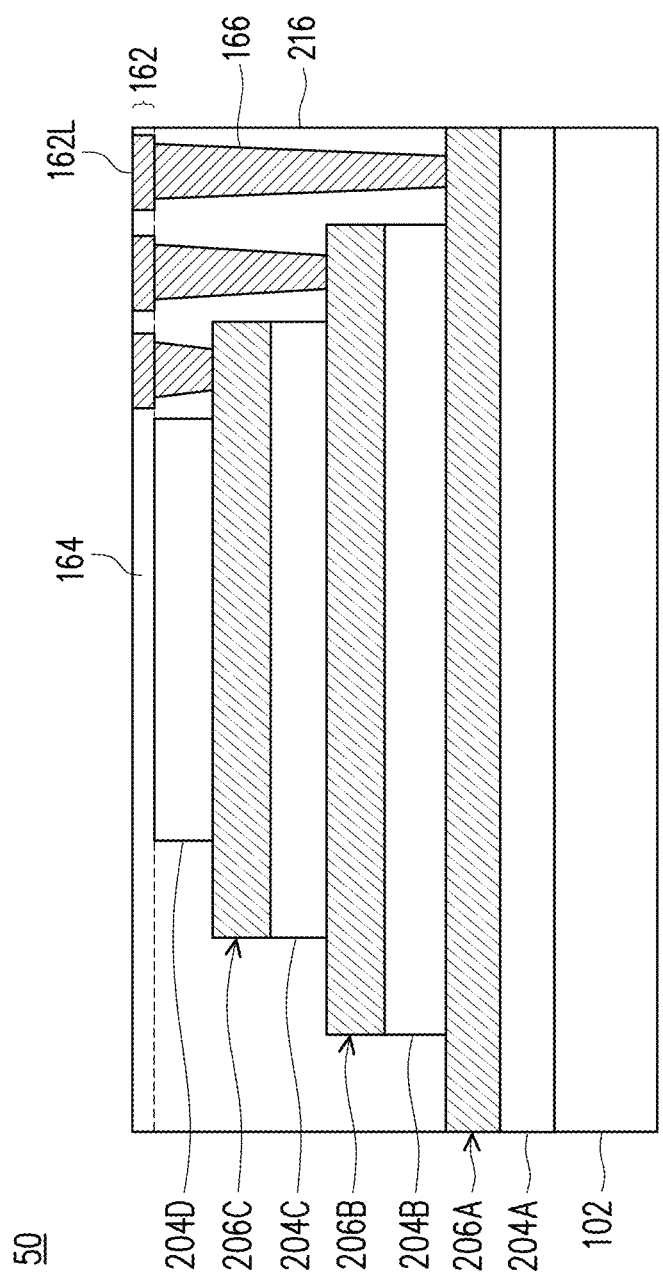

In FIG. 20J, portions of the interconnect structure 160 are formed. Only one layer of the interconnect structure 160 is shown for simplicity of illustration. In this embodiment, forming the interconnect structure 160 includes forming conductive contacts 166 through the IMD 216. The conductive contacts 166 may be formed by a damascene process, such as a single damascene process, a dual damascene process, or the like. The conductive contacts 166 are connected to the exposed portions of each of the conductive layers 206 (e.g., the word lines 114 discussed above).

Figure 21A:
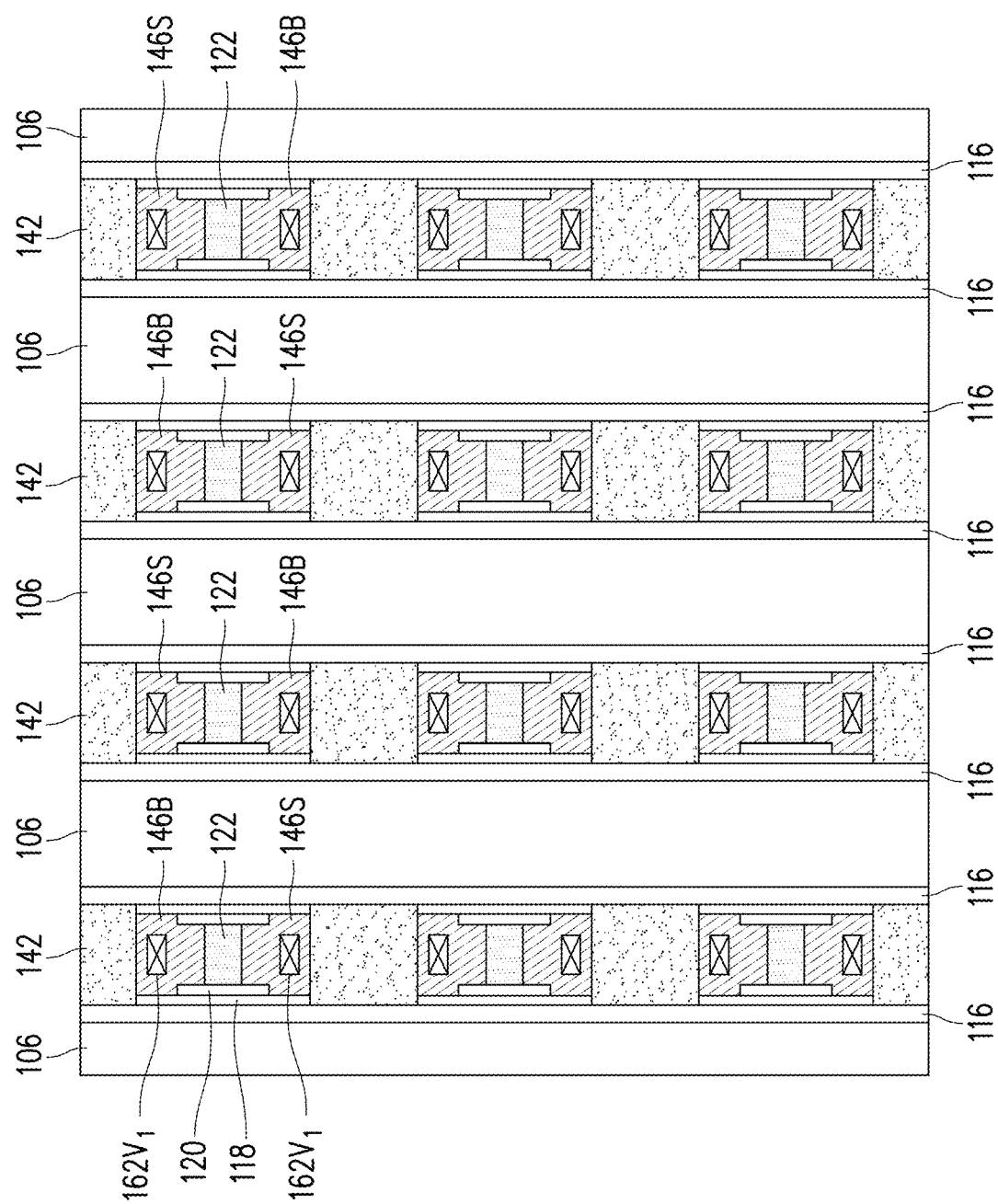
FIGS. 21A through 21D are top-down views of a memory array, in accordance with some embodiments.
Figure 21B:
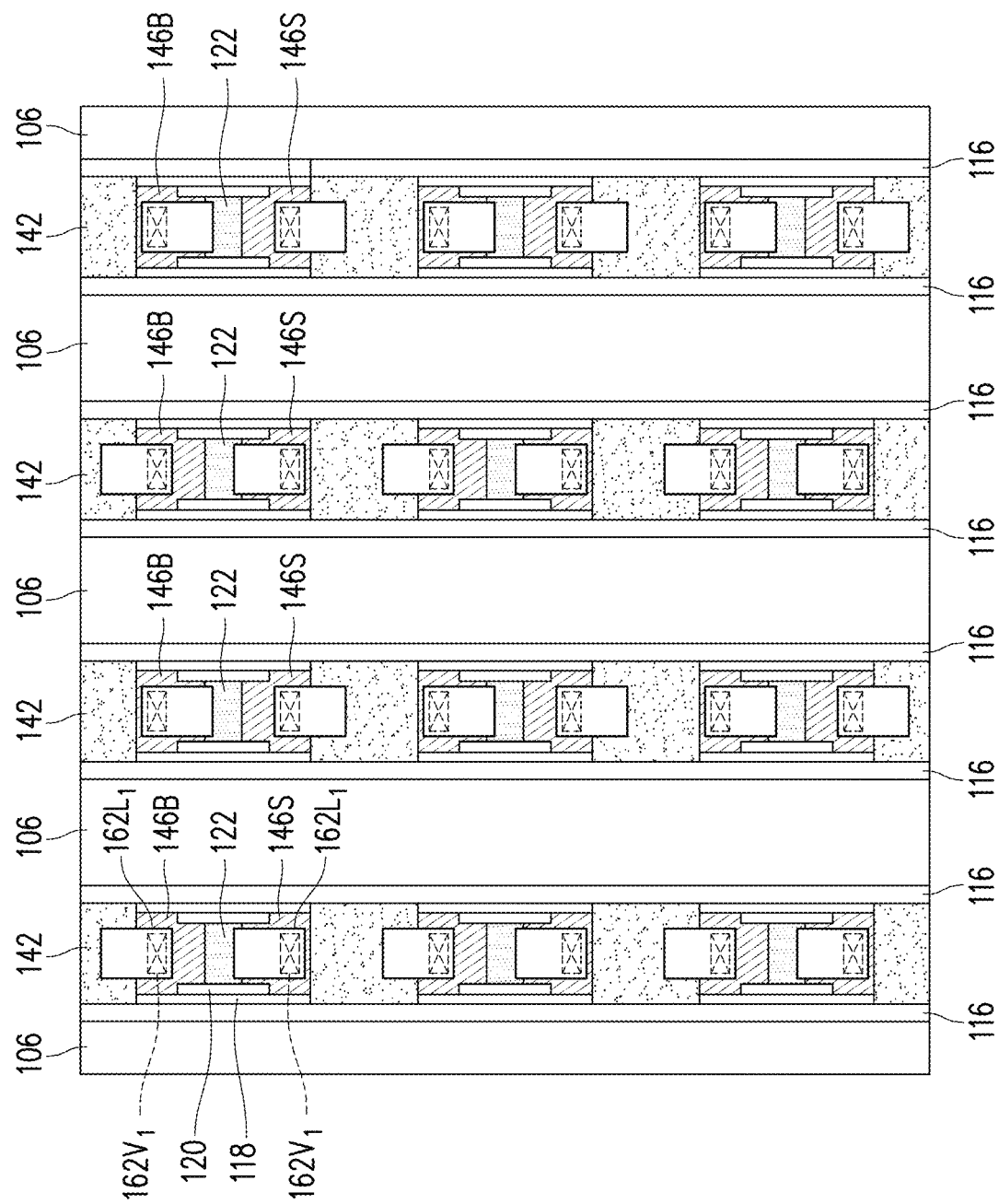
Figure 21C:
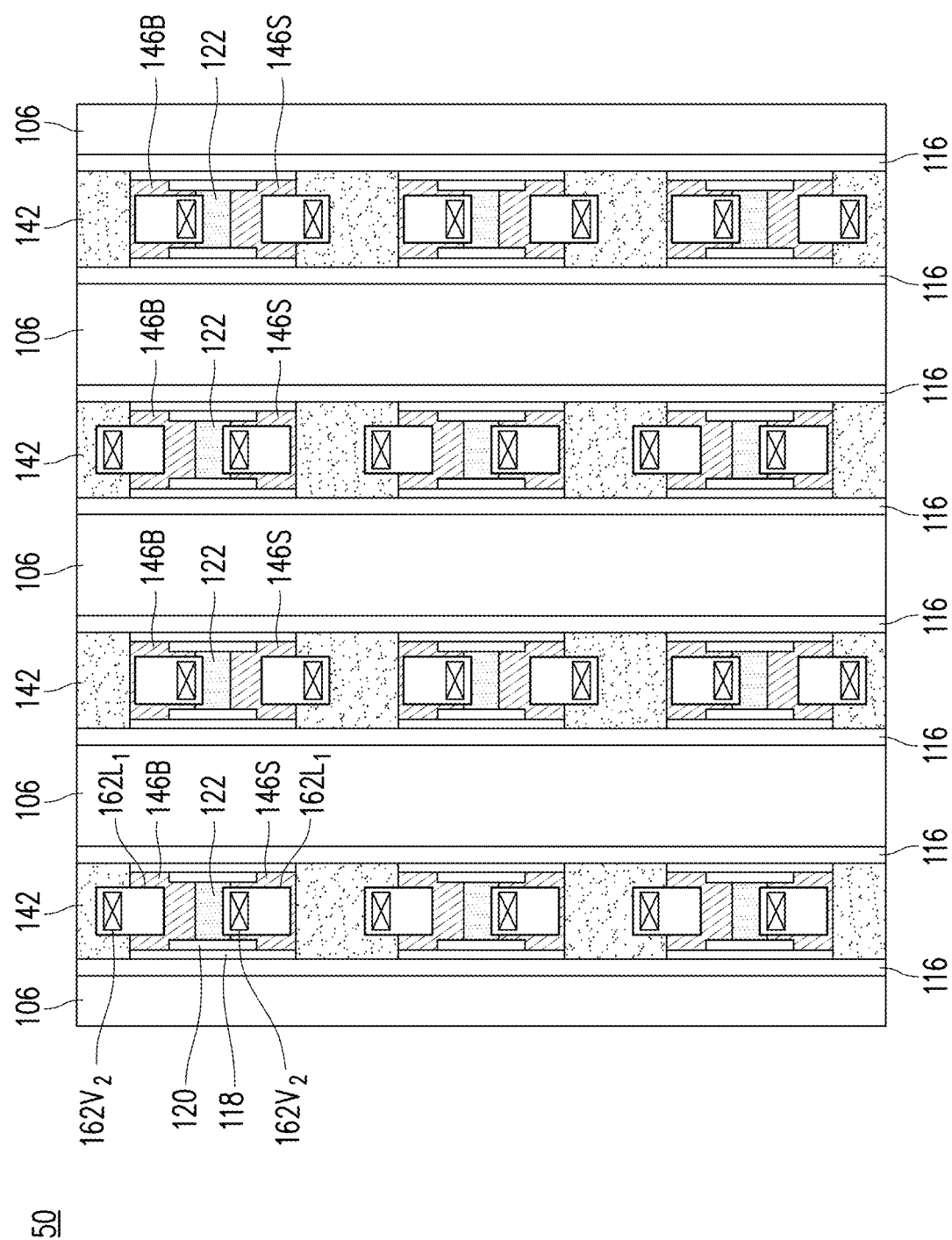
Figure 21D:
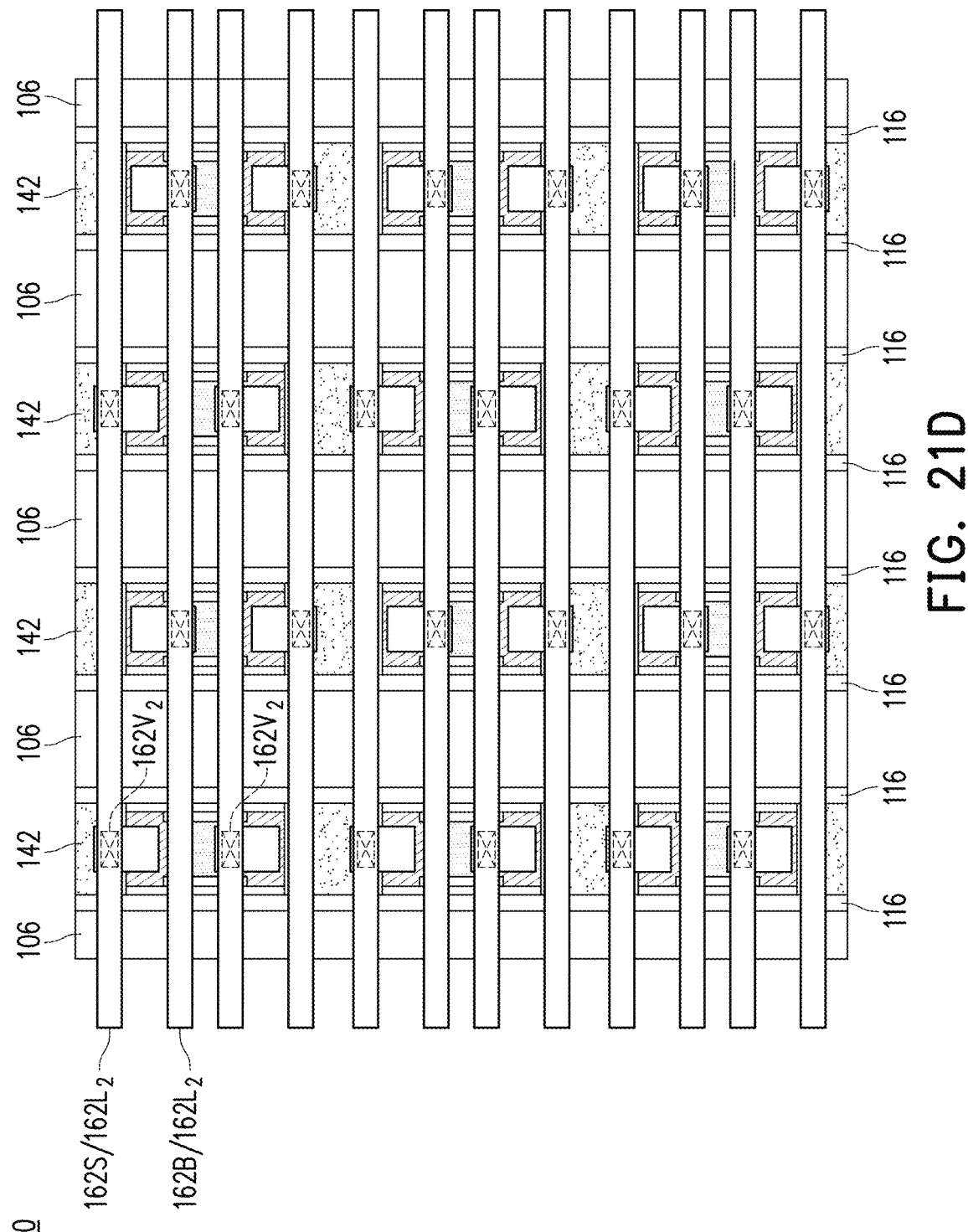

FIGS. 21A through 21D are top-down views of a memory array 50, in accordance with some embodiments. Some features of an interconnect structure are illustrated. FIG. 21A illustrates conductive vias at a first level of an interconnect structure (e.g., first-level conductive vias $162V_1$ in FIGS. 19B and 19C). FIG. 21B illustrates conductive lines at a first level of an interconnect structure (e.g., first-level conductive lines $162L_1$ in FIGS. 19B and 19C). FIG. 21C illustrates conductive vias at a second level of an interconnect structure (e.g., second-level conductive vias $162V_2$ in FIGS. 19B and 19C). FIG. 21D illustrates conductive lines at a second level of an interconnect structure (e.g., second-level conductive lines $162L_2$ in FIGS. 19B and 19C).

Referring to FIG. 21A, the conductive vias $162V_1$ are over and connected to the bit lines 146B/source lines 146S. The bit lines 146B and the source lines 146S are formed in an alternating pattern along rows and columns of the memory array 50, in the top-down view. Forming the bit lines 146B and the source lines 146S in an alternating pattern helps avoid shorting of adjacent bit lines 146B/source lines 146S when a word line 114 (see FIGS. 19B and 19C) is activated. In this embodiment, adjacent bit lines 146B and adjacent source lines 146S are laterally aligned with one another along the first direction $D_1$ (see FIGS. 1A and 1B). In some embodiments, the center of each conductive via $162V_1$ is laterally aligned with the center of the respective underlying bit line 146B/source line 146S.

Referring to FIG. 21B, the conductive lines $162L_1$ are over and connected to the conductive vias $162V_1$. The conductive lines $162L_1$ extend in the first direction $D_1$ (see FIGS. 1A and 1B) and laterally offset the interconnection to the underlying bit lines/source lines. In other words, the conductive lines $162L_1$ connected to the bit lines 146B (see FIG. 21A) are laterally offset from the conductive lines $162L_1$ connected to the source lines 146S (see FIG. 21A) along the second direction $D_2$ (see FIGS. 1A and 1B).

Referring to FIG. 21C, the conductive vias $162V_2$ are over and connected to the conductive lines $162L_1$. Because the conductive lines $162L_1$ laterally offset the interconnection to the underlying bit lines/source lines, the center of each conductive via $162V_2$ is thus laterally offset from the center of the respective underlying bit line/source line and from the center of the respective underlying conductive via $162V_1$. The conductive vias $162V_2$ can be larger than (e.g., have greater widths than) the conductive vias $162V_1$.

Referring to FIG. 21D, the conductive lines $162L_2$ are over and connected to the conductive vias $162V_2$. The conductive lines $162L_2$ include bit line interconnects 162B (which are connected to the bit lines 146B, see FIG. 21A) and source line interconnects 162S (which are connected to the source lines 146S, see FIG. 21A). Because the conductive lines $162L_1$ (see FIG. 21C) laterally offset the interconnection to the underlying bit lines/source lines, the bit line interconnects 162B and the source line interconnects 162S can thus be straight conductive segments that extend in the second direction $D_2$ (see FIGS. 1A and 1B).

Figure 22A:
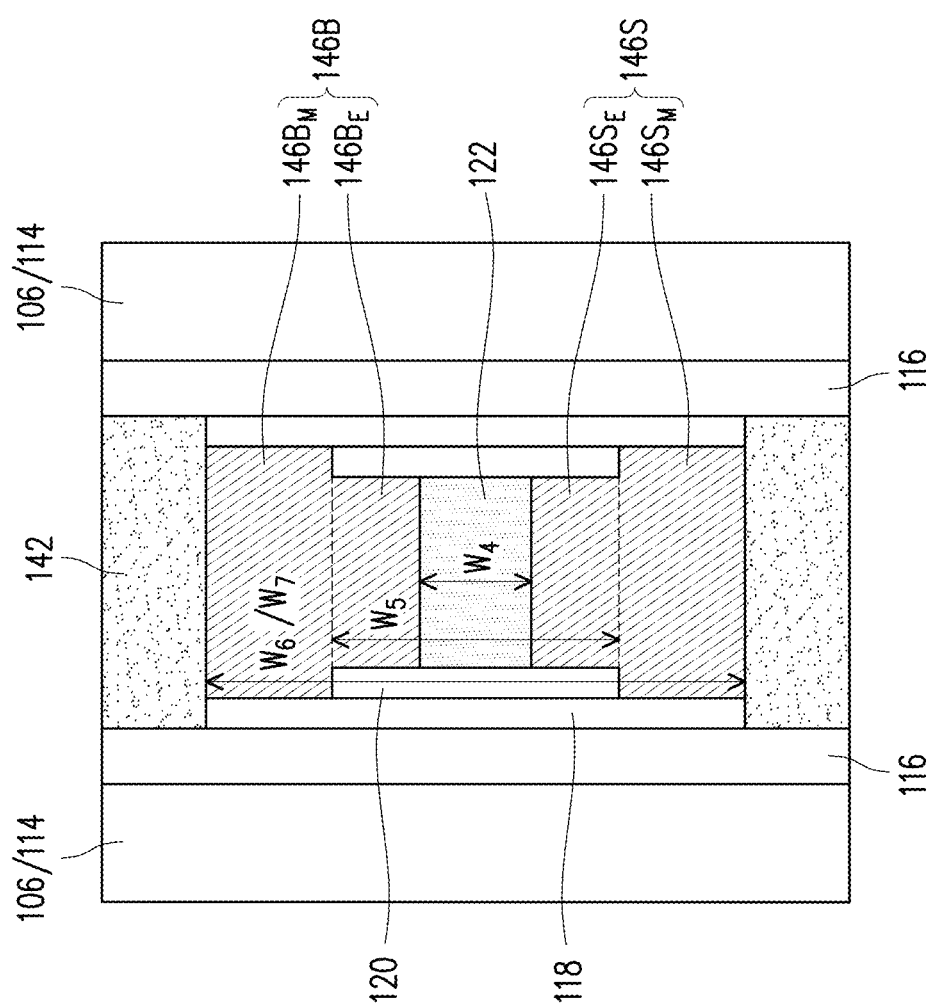
FIGS. 22A through 22C are top-down views of a memory array, in accordance with some embodiments.
Figure 22B:
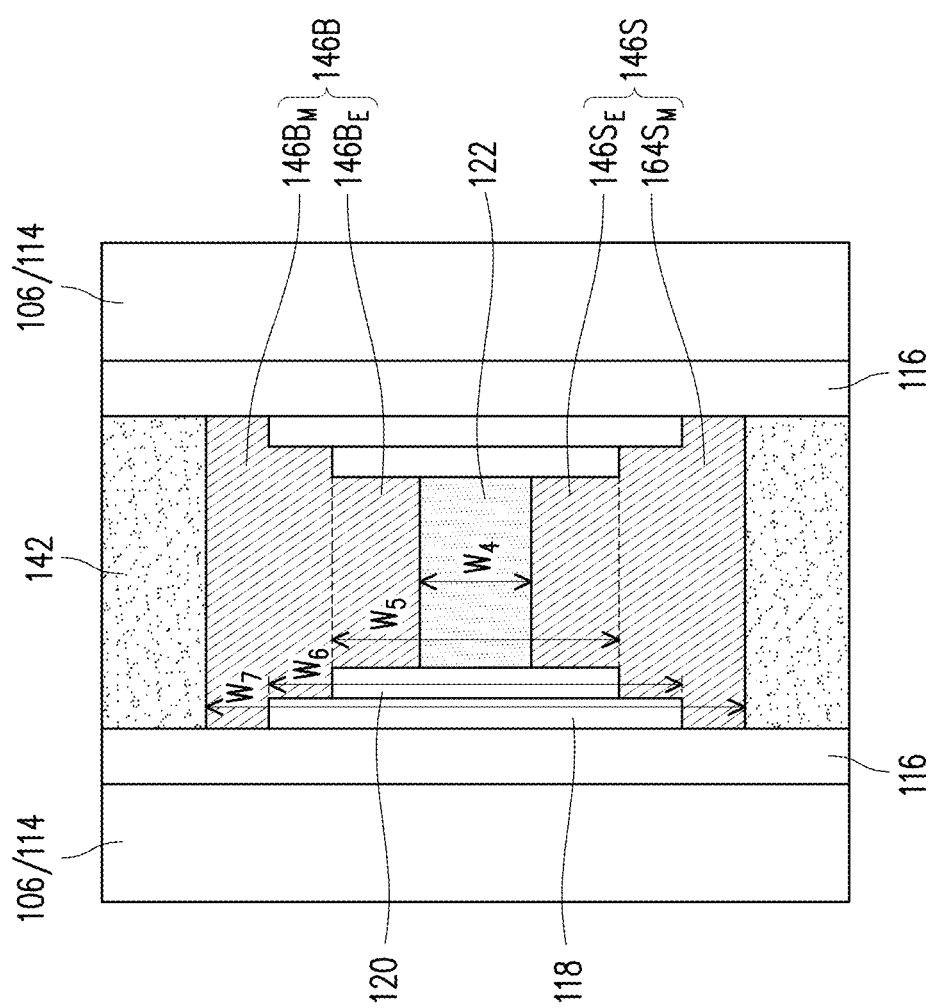
Figure 22C:
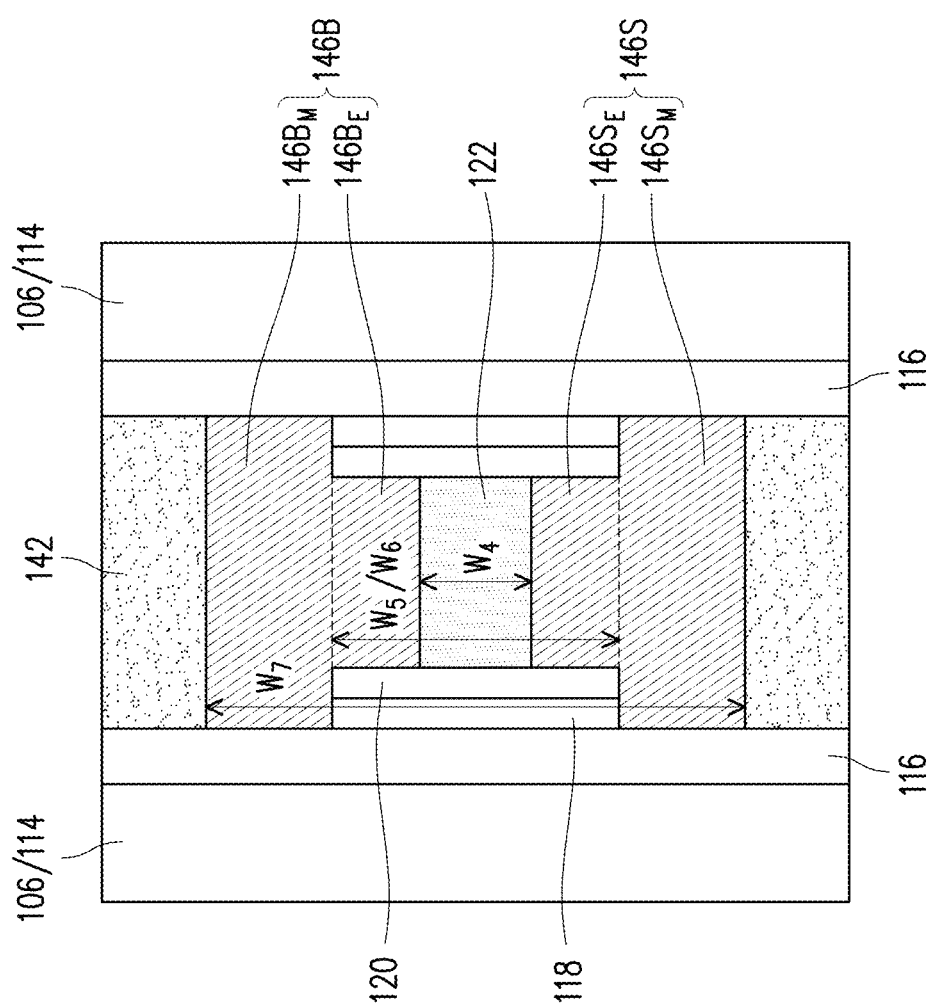

FIGS. 22A through 22C are top-down view of memory cells, in accordance with various embodiments. The isolation regions 122 can have a width $W_4$ in the first direction $D_1$ (see FIGS. 1A and 1B), which can be in the range of about 1 nm to about 100 nm. The back gate isolators 120 can have a width $W_5$ in the first direction $D_1$, which can be in the range of about 1 nm to about 100 nm. The width $W_5$ is greater than the width $W_4$ in each illustrated embodiment. The semiconductor layers 118 can have a width $W_6$ in the first direction $D_1$, which can be in the range of about 1 nm to about 100 nm.

FIG. 22A illustrates an embodiment where the semiconductor layers 118 were concurrently patterned with the patterning of the sacrificial regions 132/openings 140 (see FIG. 15). Thus, the width $W_6$ is greater than the width $W_5$. Further, the width $W_6$ can be equal to the combined width $W_7$ of an isolation region 122, a source line 146S, and a bit line 146B. In this embodiment, the main regions $146B_M$, $146S_M$ of the bit lines 146B/source lines 146S are each separated from sidewalls of the memory films 116.

FIG. 22B illustrates an embodiment where the semiconductor layers 118 were separately patterned after the patterning of the back gate isolators 120/openings 136 (see FIG. 13) but before the redeposition of the material of the sacrificial regions 132 in the openings 136 (see FIG. 14) or the patterning of the sacrificial regions 132/openings 140 (see FIG. 15). Thus, the width $W_6$ is greater than the width $W_5$. Further, the width $W_6$ is less than the combined width $W_7$ of an isolation region 122, a source line 146S, and a bit line 146B. In this embodiment, the main regions $146B_M$, $146S_M$ of the bit lines 146B/source lines 146S each contact a sidewall of a memory film 116 and a plurality of sidewalls of a semiconductor layer 118.

FIG. 22C illustrates an embodiment where the semiconductor layers 118 were concurrently patterned with the patterning of the back gate isolators 120/openings 136 (see FIG. 13). Thus, the width $W_6$ is equal to the width $W_5$. Further, the width $W_6$ is less than the combined width $W_7$ of an isolation region 122, a source line 146S, and a bit line 146B. In this embodiment, the main regions $146B_M$, $146S_M$ of the bit lines 146B/source lines 146S each contact a sidewall of a memory film 116 and a single sidewall of a semiconductor layer 118.

Figure 23:
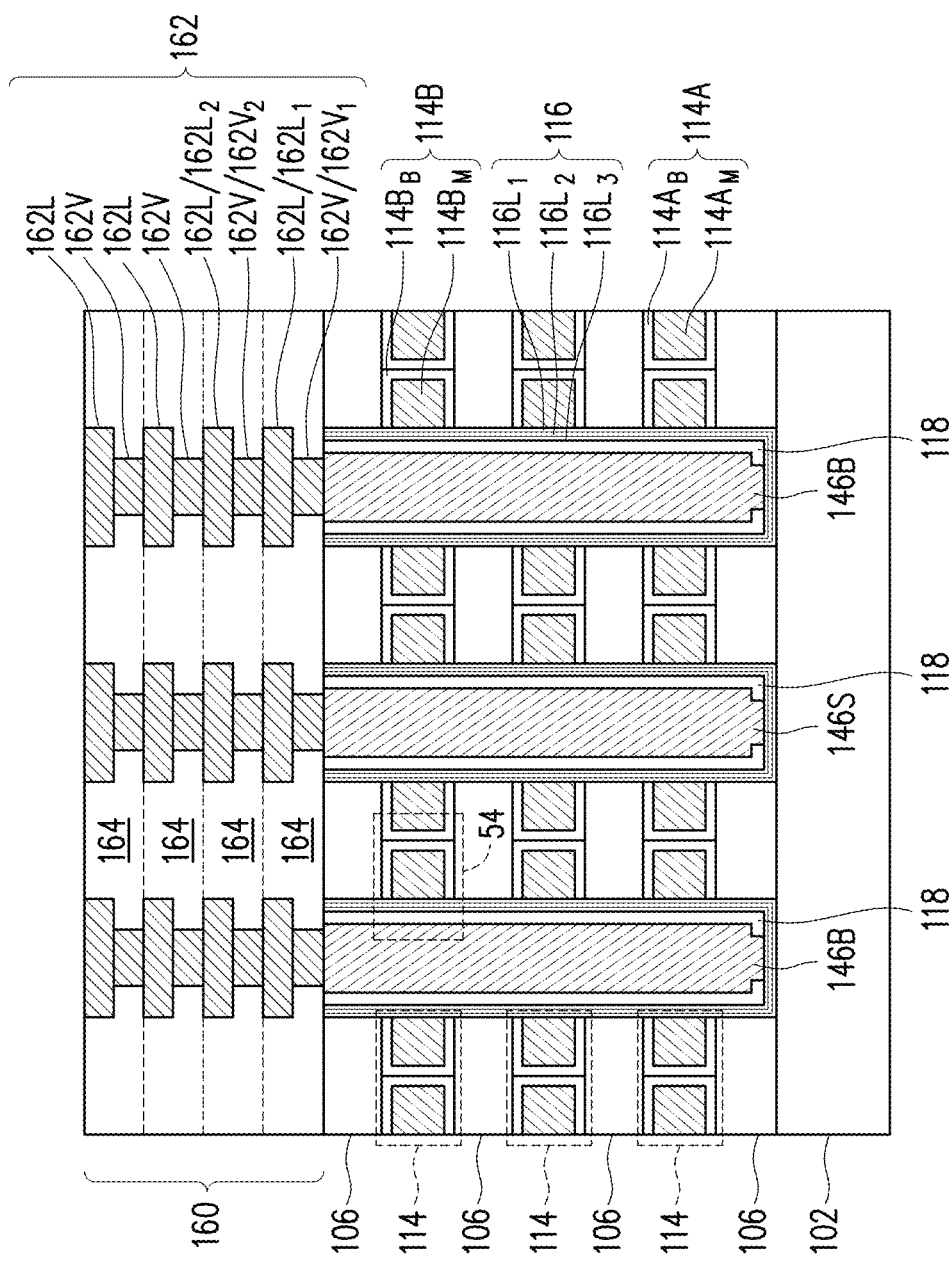
FIG. 23 is a cross-section view of a memory array, in accordance with some other embodiments.

FIG. 23 is a cross-section view of a memory array 50, in accordance with some other embodiments. FIG. 23 is shown along a similar cross-section as FIG. 20B. In this embodiment, the memory films 116 are formed of a plurality of low-k dielectric layers. Specifically, each of the memory films 116 includes a first sub-layer $116L_1$, a second sub-layer $116L_2$ on the first sub-layer $116L_1$, and a third sub-layer $116L_3$ on the second sub-layer $116L_2$. In some embodiments, the first sub-layer $116L_1$ and the third sub-layer $116L_3$ are formed of a first dielectric material (e.g., an oxide such as silicon oxide) and the second sub-layer $116L_2$ is formed of a different second dielectric material (e.g., a nitride such as silicon nitride). The low-k dielectric layers allow the transistors to act as floating gate transistors.

In the embodiments described with respect to FIGS. 2 through 23, the memory array 50 is formed over a substrate 102. In some embodiments, the memory array 50 is formed as part of a standalone device (e.g., a memory die), which is integrated with other devices (e.g., a logic die) through device packaging. In some embodiments, the memory array 50 is embedded in another device, such as a logic die. In such embodiments, the substrate 102 may be omitted, or may be an underlying layer, such as an underlying dielectric layer, an underlying semiconductor substrate, or the like.

Figure 24:
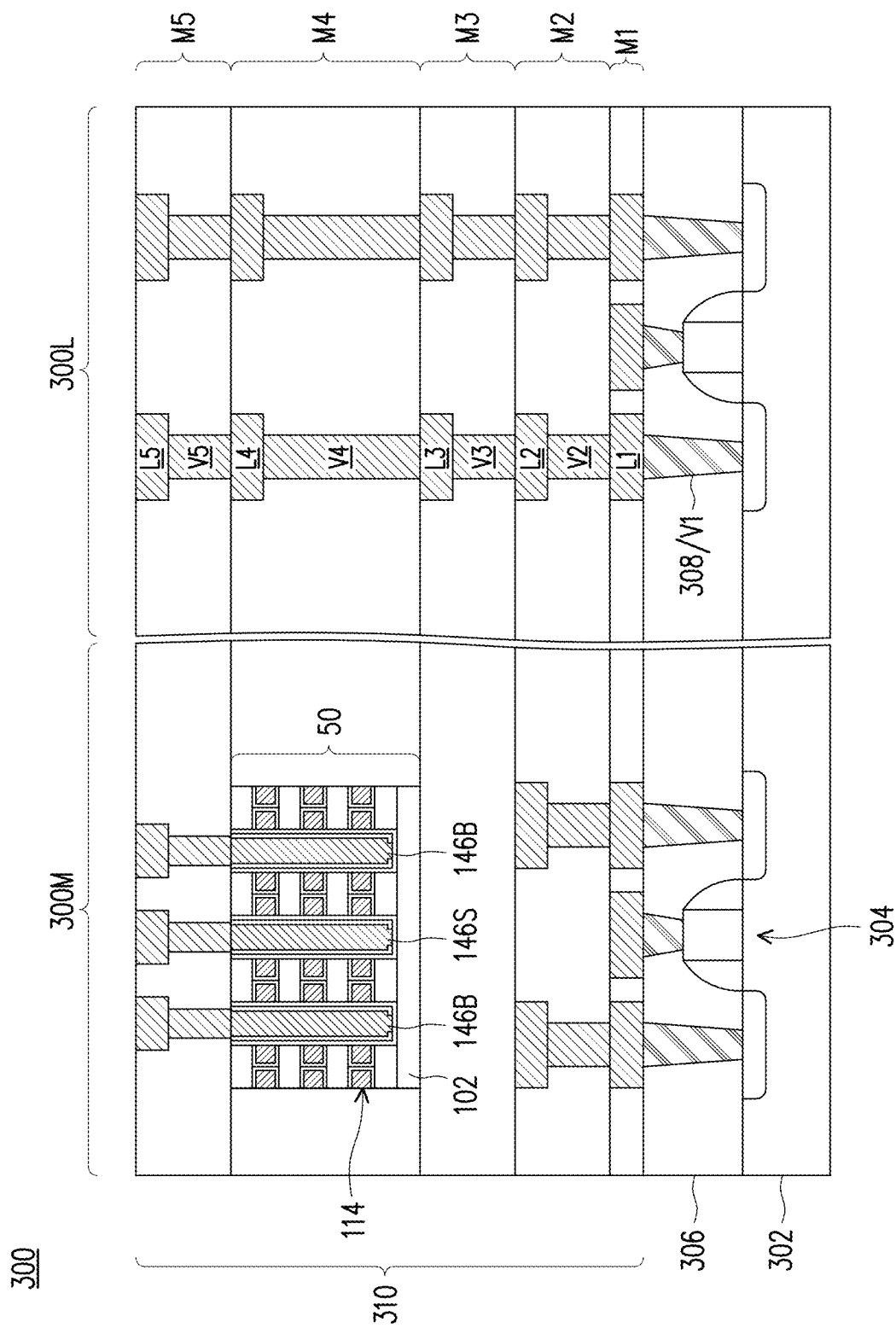
FIG. 24 is a cross-sectional view of a semiconductor device, in accordance with some embodiments.

FIG. 24 is a cross-sectional view of a semiconductor device 300, in accordance with some embodiments. FIG. 24 is a cross-sectional view shown along reference cross-section B-B' in FIG. 1A. FIG. 24 is a simplified view, and some features are omitted for clarity of illustration. The semiconductor device 300 includes a logic region 300L and a memory region 300M. Memory devices (e.g., memories) are formed in the memory region 300M and logic devices (e.g., logic circuits) are formed in the logic region 300L. For example, a memory array 50 (see FIG. 1) can be formed in the memory region 300M, and logic devices can be formed in the logic region 300L. The memory region 300M can be disposed at an edge of the logic region 300L, or the logic region 300L can surround the memory region 300M.

The logic region 300L and the memory region 300M are formed over a same semiconductor substrate 302. The semiconductor substrate 302 may be silicon, doped or undoped, or an active layer of a semiconductor-on-insulator (SOI) substrate. The semiconductor substrate 302 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Devices 304 are formed at the active surface of the semiconductor substrate 302. The devices 304 may be active devices or passive devices. For example, the electrical components may be transistors, diodes, capacitors, resistors, or the like, formed by any suitable formation method. The devices 304 are interconnected to form the memory devices and logic devices of the semiconductor device 300.

One or more inter-layer dielectric (ILD) layer(s) 306 are formed on the semiconductor substrate 302, and electrically conductive features, such as contact plugs 308, are formed electrically connected to the devices 304. The ILD layer(s) 306 may be formed of any suitable dielectric material, for example, a an oxide such as silicon oxide, phosphosilicate glass (PSG), borosilicate glass (BSG), boron-doped phosphosilicate glass (BPSG), or the like; nitride such as silicon nitride; or the like. The ILD layer(s) may be formed by any acceptable deposition process, such as spin coating, physical vapor deposition (PVD), chemical vapor deposition (CVD), the like, or a combination thereof. The electrically conductive features in the ILD layer(s) may be formed through any suitable process, such as deposition, damascene (e.g., single damascene, dual damascene, etc.), the like, or combinations thereof.

An interconnect structure 310 is formed over the semiconductor substrate 302. The interconnect structure 310 interconnects the devices 304 to form integrated circuits in each of the logic region 300L and memory region 300M. The interconnect structure 310 includes multiple metallization layers M1-M5. Although five metallization layers are illustrated, it should be appreciated that more or less metallization layers may be included. Each of the metallization layers M1-M5 includes metallization patterns in dielectric layers. The metallization patterns are connected to the devices 304 of the semiconductor substrate 302, and include, respectively, metal lines L1-L5 and metal vias V1-V5 formed in one or more inter-metal dielectric (IMD) layers. The interconnect structure 310 may formed by a damascene process, such as a single damascene process, a dual damascene process, or the like. In some embodiments, the contact plugs 308 are also part of the metallization patterns, such as part of the lowest layer of metal vias V1.

In this embodiment, the memory array 50 is formed in the interconnect structure 310. The memory array 50 can be formed in any of the metallization layers M1-M5, and is illustrated as being formed in an intermediate metallization layer M4, although it could also be formed in lower metallization layers M1-M3 or an upper metallization layer M5. The memory array 50 is electrically connected to the devices 304. In this embodiment, a metallization layer overlying the memory array 50 (e.g., the metallization layer M5) contains interconnects to the source lines 146S and the bit lines 146B. The metallization layer overlying the memory array 50 (e.g., the metallization layer M5) can also contain interconnects to the word lines 114, such as through the conductive contacts 166 (see FIG. 20J). In another embodiment, a metallization layer underlying the memory array 50 (e.g., the metallization layer M3) contains interconnects to the source lines 146S, the bit lines 146B, and/or the word lines 114.

In some embodiments, the interconnect structure 310 may be formed by first forming the layers underlying the memory array 50, e.g., the metallization layers M1-M3. The memory array 50 can then be formed on the metallization layer M3, with the substrate 102 being an etch stop layer on the IMD of the metallization layer M3. After formation of the memory array 50, the remainder of the metallization layer M4 can be formed, such as by depositing and planarizing the IMD for the metallization layer M4, and then forming metal lines L4 and metal vias V4 (which may include forming the IMD 216 and the conductive contacts 166, see FIG. 20J). The layers (if any) overlying the memory array 50, e.g., the metallization layer M5, can then be formed.

Figure 25:
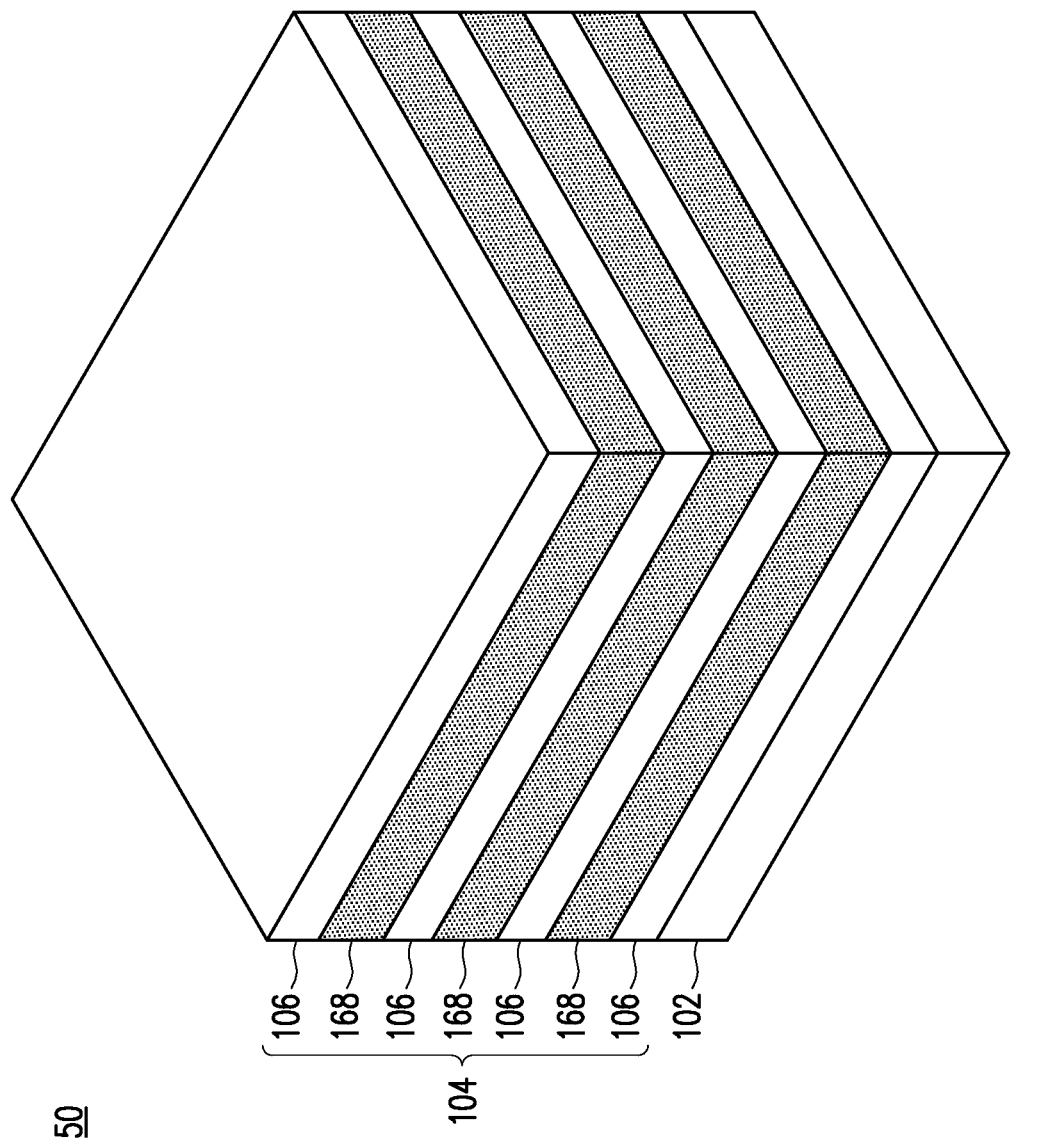
FIGS. 25 through 27 are various views of intermediate stages in the manufacturing of a memory array, in accordance with some other embodiments.
Figure 26:
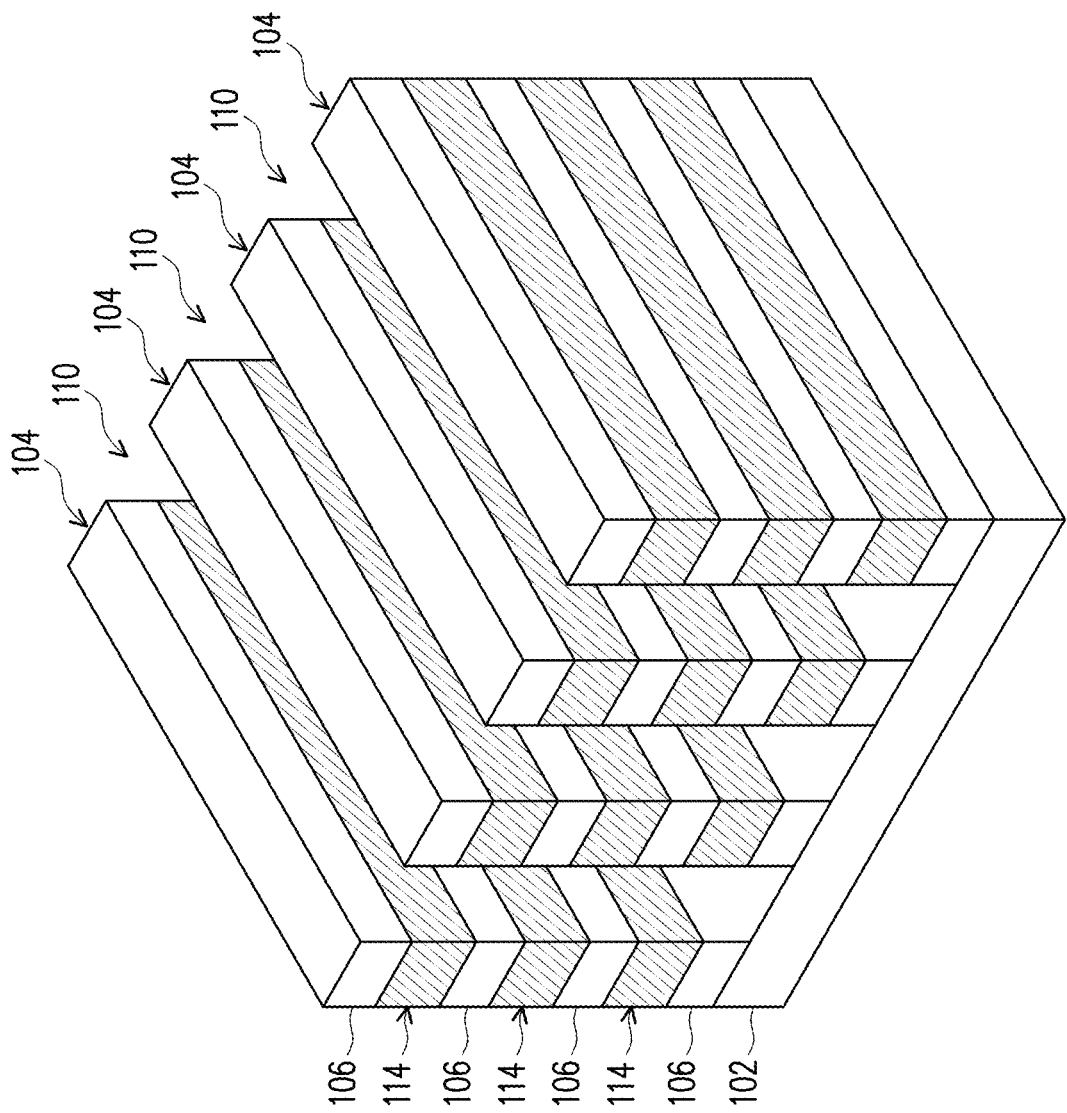
Figure 27:
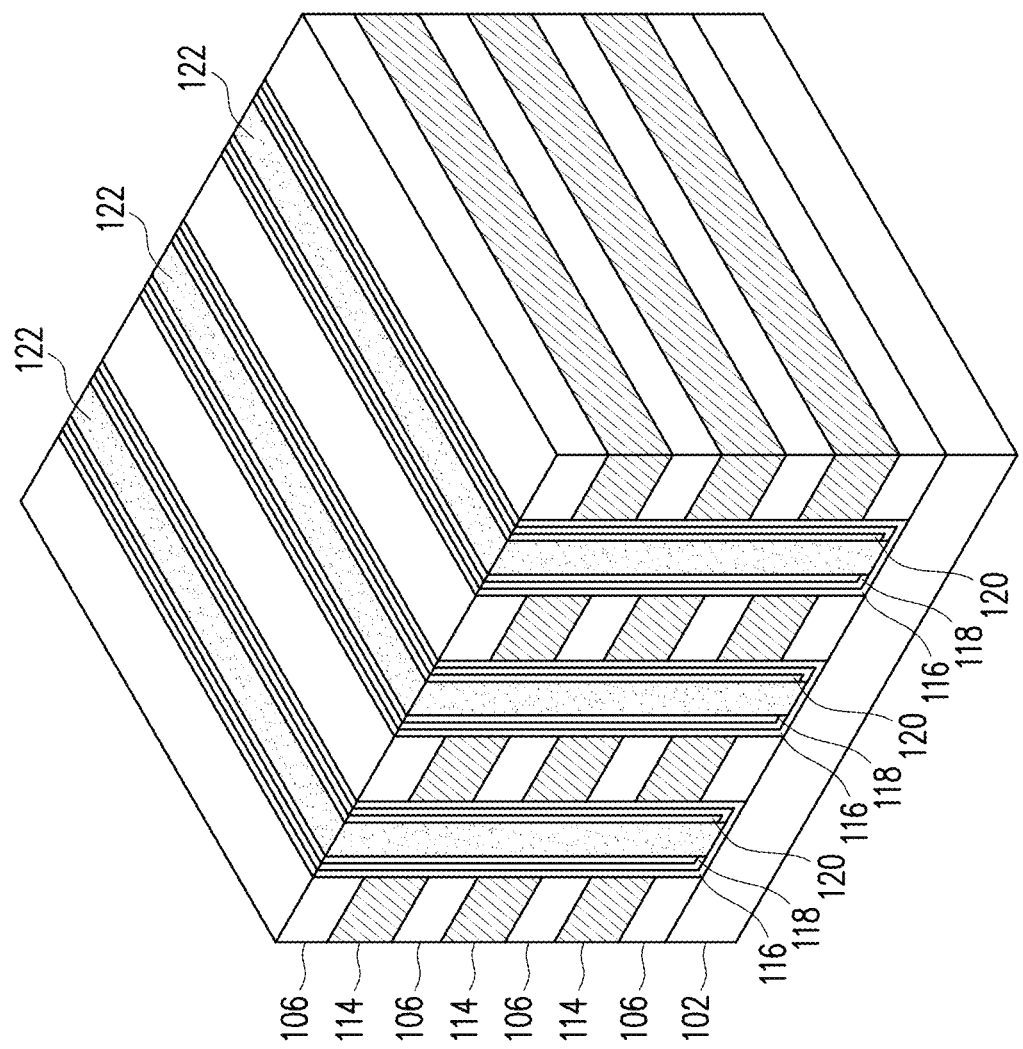

FIGS. 25 through 27 are views of intermediate stages in the manufacturing of a memory array 50, in accordance with some other embodiments. FIGS. 25 through 27 are three-dimensional views. A portion of the memory array 50 is illustrated. Some features, such as the staircase arrangement of the word lines (see FIG. 1A), are not shown in some figures for clarity of illustration.

In FIG. 25, a substrate 102 is provided and a multilayer stack 104 is formed over the substrate 102. The substrate 102 and the multilayer stack 104 may be formed in a similar manner as those discussed above with respect to FIG. 2, except in this embodiment, the multilayer stack 104 includes alternating dielectric layers 106 and conductive layers 168. The conductive layers 168 may be formed of materials that are selected from the same group of candidate materials of the main layers $114A_M$, $114B_M$ of the conductive features 114A, 114B, which may be formed using methods that are selected from the same group of candidate methods for forming the materials of the main layers $114A_M$, $114B_M$ of the conductive features 114A, 114B.

In FIG. 26, trenches 110 are patterned in the multilayer stack 104. The trenches 110 may be formed in a similar manner as those discussed above with respect to FIG. 3. In this embodiment, forming the trenches 110 patterns the conductive layers 168 to form word lines 114. The word lines 114 in this embodiment may not include multiple layers, but instead can each be a continuous layer of a conductive material (e.g., tungsten).

In FIG. 27, the memory films 116, the semiconductor layers 118, the back gate isolators 120, and the isolation regions 122 are formed in the trenches 110. These features may be formed in a similar manner as those discussed above with respect to FIG. 6. The features of the transistors are thus formed by a single patterning process, in which only patterning process is used to form the trenches 110 and the layers of the transistors in the multilayer stack 104. After this step of processing, portions of the isolation regions 122 may be replaced with the remaining features of the transistors, as discussed above with respect to FIGS. 11 through 18. An interconnect structure can then be formed, in a similar manner as that discussed above with respect to FIGS. 19A, 19B, and 19C.

Embodiments may achieve advantages. The patterned back gate isolators 120 allow the extension regions 146B$_E$, 146S$_E$ of the bit lines 146B/source lines 146S to also act as back gates during write operations. The back gates can help control (e.g., reduce) the surface potential of the semiconductor layers 118 (particularly the portions of the semiconductor layers 118 distal the word lines 114) during write operations. The window for write operations may thus be widened. Reducing the surface potential of the semiconductor layers 118 during write operations also helps increase the write voltage that is applied across the memory films 116 during write operations. The performance of the memory array 50 may thus be improved.

In an embodiment, a device includes: a word line extending in a first direction; a data storage layer on a sidewall of the word line; a channel layer on a sidewall of the data storage layer; a back gate isolator on a sidewall of the channel layer; and a bit line having a first main region and a first extension region, the first main region contacting the channel layer, the first extension region separated from the channel layer by the back gate isolator, the bit line extending in a second direction, the second direction perpendicular to the first direction.

In some embodiments of the device, the first main region of the bit line is separated from the sidewall of the data storage layer by the channel layer. In some embodiments of the device, the first main region of the bit line contacts the sidewall of the data storage layer and a single sidewall of the channel layer. In some embodiments of the device, the first main region of the bit line contacts the sidewall of the data storage layer and a plurality of sidewalls of the channel layer. In some embodiments, the device further includes: a source line having a second main region and a second extension region, the second main region contacting the channel layer, the second extension region separated from the channel layer by the back gate isolator, the source line extending in the second direction; and an isolation region between the source line and the bit line. In some embodiments of the device, the isolation region, the first extension region of the bit line, and the second extension region of the source line have a same width in a third direction, the third direction perpendicular to the first direction and the second direction. In some embodiments of the device, the isolation region has a first width in the first direction and the back gate isolator has a second width in the first direction, the second width greater than the first width. In some embodiments of the device, the back gate isolator includes aluminum oxide.

In an embodiment, a device includes: a bit line extending in a first direction, the bit line having a first T-shaped cross-section in a top-down view; a source line extending in the first direction, the source line having a second T-shaped cross-section in the top-down view; an isolation region between the source line and the bit line; a word line extending in a second direction, the second direction perpendicular to the first direction; a back gate isolator between the word line and each of the isolation region, a first portion of the bit line, and a second portion of the source line; a channel layer between the back gate isolator and the word line; and a data storage layer between the channel layer and the word line.

In some embodiments of the device, the isolation region has a first width in the second direction, and the back gate isolator has a second width in the second direction, the second width greater than the first width. In some embodiments of the device, the channel layer has the second width in the second direction. In some embodiments of the device, the channel layer has a third width in the second direction, and a combination of the bit line, the source line, and the isolation region has a fourth width in the second direction, the third width greater than the second width and less than the fourth width. In some embodiments of the device, the channel layer has a third width in the second direction, and a combination of the bit line, the source line, and the isolation region has the third width in the second direction, the third width greater than the second width. In some embodiments, the device further includes: a source line interconnect over and connected to the source line; and a bit line interconnect over and connected to the bit line. In some embodiments of the device, the back gate isolator includes aluminum oxide.

In an embodiment, a method includes: forming a word line between a pair of first dielectric layers; depositing a data storage layer on sidewalls of the first dielectric layers and a sidewall of the word line; depositing a channel layer on a sidewall of the data storage layer; depositing a first dielectric layer on a sidewall of the channel layer; forming a first isolation region on a sidewall of the first dielectric layer; removing a first portion of the first isolation region, a second portion of the first isolation region remaining after the removing; after removing the first portion of the first isolation region, patterning the first dielectric layer to form a back gate isolator; and forming a bit line and a source line at opposing sides of the second portion of the first isolation region, the back gate isolator separating the channel layer from a first portion of the bit line and a second portion of the source line.

In some embodiments, the method further includes: patterning the channel layer while patterning the first dielectric layer. In some embodiments, the method further includes: forming a second isolation region extending through the channel layer; and patterning the channel layer while forming the second isolation region. In some embodiments, the method further includes: forming a second isolation region extending through the channel layer; and patterning the channel layer after patterning the first dielectric layer and before forming the second isolation region. In some embodiments of the method, the first dielectric layer is formed of aluminum oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a word line between a pair of first dielectric layers;
   depositing a data storage layer on sidewalls of the first dielectric layers and a sidewall of the word line;
   depositing a channel layer on a sidewall of the data storage layer;
   depositing a first dielectric layer on a sidewall of the channel layer;
   forming a first isolation region on a sidewall of the first dielectric layer;
   removing a first portion of the first isolation region, a second portion of the first isolation region remaining after the removing;
   after removing the first portion of the first isolation region, patterning the first dielectric layer to form a back gate isolator; and
   forming a bit line and a source line at opposing sides of the second portion of the first isolation region, the back gate isolator separating the channel layer from a first portion of the bit line and a second portion of the source line.

2. The method of claim 1 further comprising:
   patterning the channel layer while patterning the first dielectric layer.

3. The method of claim 1 further comprising:
   forming a second isolation region extending through the channel layer; and
   patterning the channel layer while forming the second isolation region.

4. The method of claim 1 further comprising:
   forming a second isolation region extending through the channel layer; and
   patterning the channel layer after patterning the first dielectric layer and before forming the second isolation region.

5. The method of claim 1, wherein the first dielectric layer is formed of aluminum oxide.

6. A method comprising:
   forming a memory film on a sidewall of a word line;
   forming a channel layer on a sidewall of the memory film;
   forming a back gate layer on a sidewall of the channel layer;
   forming an isolation region on a sidewall of the back gate layer;
   after forming the isolation region, patterning the back gate layer to form a back gate isolator between the isolation region and the channel layer in a top-down view; and
   forming a bit line and a source line at opposing sides of the isolation region in the top-down view, the back gate isolator disposed between the channel layer and a first extension portion of the bit line, the back gate isolator disposed between the channel layer and a second extension portion of the source line.

7. The method of claim 6, wherein a first main portion of the bit line contacts the sidewall of the channel layer but not the sidewall of the memory film, and a second main portion of the source line contacts the sidewall of the channel layer but not the sidewall of the memory film.

8. The method of claim 6, wherein a first main portion of the bit line contacts the sidewall of the channel layer and the sidewall of the memory film, and a second main portion of the source line contacts the sidewall of the channel layer and the sidewall of the memory film.

9. The method of claim 6, wherein a first main portion of the bit line contacts the sidewall of the memory film but not the sidewall of the channel layer, and a second main portion of the source line contacts the sidewall of the memory film but not the sidewall of the channel layer.

10. The method of claim 6, wherein the back gate layer is formed of aluminum oxide.

11. The method of claim 6, wherein the isolation region, the first extension portion of the bit line, and the second extension portion of the source line have a same width in the top-down view.

12. The method of claim 6, further comprising:
    connecting a source line interconnect over and connected to the source line; and
    forming a bit line interconnect over and connected to the bit line.

13. The method of claim 6 further comprising:
    forming a staircase structure comprising the word line between a pair of dielectric layers.

14. A method comprising:
    forming a channel layer on a sidewall of a memory film;
    forming a back gate layer on a sidewall of the channel layer;
    patterning the back gate layer to form a first back gate isolator and a second back gate isolator;
    forming a sacrificial region between the first back gate isolator and the second back gate isolator in a top-down view;
    dividing the sacrificial region into a first portion and a second portion by forming an isolation region between the first portion and the second portion of the sacrificial region in the top-down view; and
    replacing the first portion and the second portion of the sacrificial region with, respectively, a bit line and a source line, the first back gate isolator disposed between the channel layer and the bit line, the second back gate isolator disposed between the channel layer and the source line.

15. The method of claim 14, wherein the bit line is T-shaped in the top-down view and the source line is T-shaped in the top-down view.

16. The method of claim 14, wherein the back gate layer is formed of aluminum oxide.

17. The method of claim 14, further comprising:
    forming a source line interconnect over and connected to the source line; and
    forming a bit line interconnect over and connected to the bit line.

18. The method of claim 14 further comprising:
    forming a staircase structure comprising a word line between a pair of dielectric layers; and
    forming the memory film on a sidewall of the word line.

19. The method of claim 14 further comprising:
    forming a second isolation region on a sidewall of the back gate layer; and
    patterning the second isolation region, a first portion and a second portion of the second isolation region remaining after the patterning, the first back gate isolator disposed between the channel layer and the first portion of the second isolation region, the second back gate isolator disposed between the channel layer and the second portion of the second isolation region.

20. The method of claim 19 further comprising:
    forming the sacrificial region between the first portion and the second portion of the second isolation region;

removing a portion of the sacrificial region by patterning the sacrificial region when patterning the back gate layer; and redepositing material of the sacrificial region between the first portion and the second portion of the second isolation region.

\* \* \* \* \*